(12) United States Patent
King

(10) Patent No.: US 12,093,004 B1
(45) Date of Patent: Sep. 17, 2024

(54) IN-WALL POWER ADAPTER AND METHOD OF IMPLEMENTING AN IN-WALL POWER ADAPTER

(71) Applicant: John Joseph King, Wheaton, IL (US)

(72) Inventor: John Joseph King, Wheaton, IL (US)

(73) Assignee: Smart Power Partners LLC, Wheaton, IL (US)

( * ) Notice: Subject to any disclaimer, the term of this patent is extended or adjusted under 35 U.S.C. 154(b) by 0 days.

(21) Appl. No.: 17/306,475

(22) Filed: May 3, 2021

Related U.S. Application Data

(63) Continuation-in-part of application No. 16/571,152, filed on Sep. 15, 2019, now Pat. No. 10,996,645, which is a continuation of application No. 15/645,745, filed on Jul. 10, 2017, now Pat. No. 10,418,813, application No. 17/306,475 is a continuation of application No. 16/940,066, filed on Jul. 27, 2020, now abandoned, which is a continuation of application No. 15/823,385, filed on Nov. 27, 2017, now Pat. No. 10,727,731, which is a continuation-in-part of application No. 15/645,745, filed on Jul. 10, 2017, now Pat. No. 10,418,813.

(Continued)

(51) Int. Cl.
*G05B 19/042* (2006.01)
*H02J 4/00* (2006.01)
*G01R 31/55* (2020.01)

(52) U.S. Cl.
CPC .............. *G05B 19/042* (2013.01); *H02J 4/00* (2013.01); *G01R 31/55* (2020.01); *G05B 2219/25318* (2013.01)

(58) Field of Classification Search
CPC ......... G05B 19/042; G05B 2219/25318; H02J 4/00; G01R 31/55
See application file for complete search history.

(56) References Cited

U.S. PATENT DOCUMENTS

| | | |
|---|---|---|
| 2,997,691 A | 8/1961 | Stoll |
| 3,588,489 A | 6/1971 | Gaines |

(Continued)

FOREIGN PATENT DOCUMENTS

| | | |
|---|---|---|
| AU | 2019203136 | 5/2019 |
| AU | 2019100956 | 10/2019 |

(Continued)

OTHER PUBLICATIONS

Wikipedia contributors. "Junction box." Wikipedia, The Free Encyclopedia. Wikipedia, The Free Encyclopedia, Apr. 17, 2024. Web. Apr. 26, 2024. (Year: 2024).*

(Continued)

*Primary Examiner* — Daniel Cavallari

(57) ABSTRACT

An in-wall power adapter configured to apply power to a load is described. The in-wall power adapter may comprise a first plurality of contact elements adapted to receive power and apply to power to the load; a recess adapted to receive a control module; a second plurality of contact elements positioned within the recess and adapted to be coupled to corresponding contact elements of a control module; and an input portion adapted to receive an input from a user; wherein the in-wall power adapter is adapted to control an application of the power to the load in response to a control signal.

20 Claims, 23 Drawing Sheets

Related U.S. Application Data

(60) Provisional application No. 62/480,389, filed on Apr. 1, 2017.

(56) References Cited

U.S. PATENT DOCUMENTS

| | | |
|---|---|---|
| 3,609,647 A | 9/1971 | Castellano |
| 3,663,865 A | 5/1972 | Stanback |
| 3,879,101 A | 4/1975 | McKissic |
| 3,895,225 A | 7/1975 | Prior |
| 4,117,258 A | 9/1978 | Shanker |
| 4,165,443 A | 8/1979 | Figart et al. |
| 4,166,934 A | 9/1979 | Marrero |
| 4,485,282 A | 11/1984 | Lee |
| 4,522,455 A | 6/1985 | Johnson |
| 4,546,418 A | 10/1985 | Baggio et al. |
| 4,546,419 A | 10/1985 | Johnson |
| 4,636,914 A | 1/1987 | Belli |
| 4,780,088 A | 10/1988 | Means |
| 4,839,477 A | 6/1989 | Orosz et al. |
| 4,893,062 A | 1/1990 | D'Aleo et al. |
| 5,064,386 A | 11/1991 | Dale et al. |
| 5,164,609 A | 11/1992 | Poppe et al. |
| 5,207,317 A | 5/1993 | Bryde et al. |
| 5,229,925 A | 7/1993 | Spencer et al. |
| 5,264,761 A | 11/1993 | Johnson |
| 5,357,170 A | 10/1994 | Luchaco et al. |
| 5,397,929 A | 3/1995 | Hogarth et al. |
| 5,399,806 A | 3/1995 | Olson |
| 5,471,012 A | 11/1995 | Opel |
| 5,473,517 A | 12/1995 | Blackman |
| 5,486,725 A | 1/1996 | Keizer et al. |
| 5,550,342 A | 8/1996 | Danek et al. |
| 5,574,256 A | 11/1996 | Cottone |
| 5,637,930 A | 6/1997 | Rowen et al. |
| 5,675,194 A | 10/1997 | Domigan |
| 5,735,710 A | 4/1998 | Blaauboer et al. |
| 5,735,714 A | 4/1998 | Orlando et al. |
| 5,813,873 A | 9/1998 | McBain et al. |
| 5,844,763 A | 12/1998 | Grace et al. |
| 5,915,984 A | 6/1999 | Rupert et al. |
| 5,957,564 A | 9/1999 | Bruce et al. |
| 5,990,635 A | 11/1999 | Ference et al. |
| 6,000,807 A | 12/1999 | Moreland |
| 6,005,308 A | 12/1999 | Bryde et al. |
| 6,010,228 A | 1/2000 | Blackman et al. |
| 6,011,755 A | 1/2000 | Mulhall et al. |
| 6,045,232 A | 4/2000 | Buckmaster |
| 6,064,448 A | 5/2000 | Feng |
| 6,082,894 A | 7/2000 | Batko et al. |
| 6,087,588 A | 7/2000 | Soules |
| 6,154,774 A | 11/2000 | Furlong et al. |
| 6,169,377 B1 | 1/2001 | Bryde et al. |
| 6,211,581 B1 | 4/2001 | Farrant |
| 6,218,787 B1 | 4/2001 | Murcko et al. |
| 6,309,248 B1 | 10/2001 | King |
| 6,349,981 B1 | 2/2002 | King |
| 6,376,770 B1 | 4/2002 | Hyde |
| 6,423,900 B1 | 7/2002 | Soules |
| 6,424,096 B1 | 7/2002 | Lowe et al. |
| 6,530,806 B2 | 3/2003 | Nelson |
| 6,540,536 B1 | 4/2003 | Young |
| 6,540,554 B2 | 4/2003 | McCarthy |
| 6,545,587 B1 | 4/2003 | hatakeyama et al. |
| 6,547,588 B1 | 4/2003 | Hsu et al. |
| 6,553,433 B1 | 4/2003 | Chang |
| 6,616,005 B1 | 9/2003 | Pereira et al. |
| 6,617,511 B2 | 9/2003 | Schultz et al. |
| 6,630,800 B2 | 10/2003 | Weng |
| 6,660,948 B2 | 12/2003 | Clegg et al. |
| 6,664,468 B2 | 12/2003 | Jarasse et al. |
| 6,666,712 B1 | 12/2003 | Kramer |
| 6,755,676 B2 | 6/2004 | Milan |
| 6,767,245 B2 | 7/2004 | King |
| 6,794,575 B1 | 9/2004 | McBain et al. |
| 6,797,900 B2 | 9/2004 | Hoffman |
| 6,798,341 B1 | 9/2004 | Eckel et al. |
| 6,805,469 B1 | 10/2004 | Barton |
| 6,843,680 B2 | 1/2005 | Gorman |
| 6,870,099 B1 | 3/2005 | Schultz et al. |
| 6,884,111 B2 | 4/2005 | Gorman |
| 6,894,221 B2 | 5/2005 | Gorman |
| 6,909,921 B1 | 6/2005 | Bilger |
| 6,940,016 B1 | 9/2005 | Cornett et al. |
| 6,945,815 B1 | 9/2005 | Mullally |
| 6,962,505 B1 | 11/2005 | Savicki, Jr. et al. |
| 6,965,801 B2 | 11/2005 | Hall |
| 6,989,489 B1 | 1/2006 | Savicki, Jr. |
| 7,045,975 B2 | 5/2006 | Evans |
| 7,081,009 B2 | 7/2006 | Gorman |
| 7,139,716 B1 | 11/2006 | Gaziz |
| 7,160,147 B1 | 1/2007 | Stephan |
| 7,161,313 B2 | 1/2007 | Piepgras et al. |
| 7,192,289 B2 | 3/2007 | Kowalski |
| 7,202,613 B2 | 4/2007 | Morgan et al. |
| 7,202,789 B1 | 4/2007 | Stilp |
| 7,223,122 B2 | 5/2007 | Mori |
| 7,232,336 B1 | 6/2007 | Evans |
| 7,257,465 B2 | 8/2007 | Perez et al. |
| 7,273,392 B2 | 9/2007 | Fields |
| 7,285,721 B2 | 10/2007 | Savicki, Jr. |
| 7,360,912 B1 | 4/2008 | Savicki, Jr. |
| 7,365,964 B2 | 4/2008 | Donahue |
| 7,367,121 B1 | 5/2008 | Gorman |
| 7,391,297 B2 | 6/2008 | Cash et al. |
| 7,400,239 B2 | 7/2008 | Kiko et al. |
| 7,480,534 B2 | 1/2009 | Bray et al. |
| 7,549,893 B1 | 6/2009 | Walker et al. |
| 7,576,285 B1 | 8/2009 | Savicki, Jr. |
| 7,614,893 B2 | 11/2009 | Khodorkovsky et al. |
| 7,641,491 B2 | 1/2010 | Altonen et al. |
| 7,649,472 B1 | 1/2010 | Paterno |
| 7,687,940 B2 | 3/2010 | Mosebrook et al. |
| 7,734,038 B2 | 6/2010 | Martich et al. |
| 7,767,905 B2 | 8/2010 | Meyer |
| 7,772,717 B2 | 8/2010 | Kitamura et al. |
| 7,791,282 B2 | 9/2010 | Yu et al. |
| 7,815,332 B1 | 10/2010 | Smith |
| 7,818,906 B2 | 10/2010 | Hansen et al. |
| 7,851,704 B2 | 12/2010 | Fitch et al. |
| 7,862,350 B2 | 1/2011 | Richter et al. |
| 7,873,062 B2 | 1/2011 | Binder |
| 7,906,873 B1 | 3/2011 | Roosli et al. |
| 7,964,989 B1 | 6/2011 | Puschnigg et al. |
| 7,976,338 B1 | 7/2011 | Webster et al. |
| 7,994,654 B2 | 8/2011 | Lee et al. |
| 7,998,312 B2 | 8/2011 | Nishida et al. |
| 8,011,937 B2 | 9/2011 | Oddsen et al. |
| 8,052,485 B2 | 11/2011 | Lee et al. |
| 8,058,552 B2 | 11/2011 | Kruse et al. |
| 8,067,906 B2 | 11/2011 | Null |
| 8,160,838 B2 | 4/2012 | Ramin et al. |
| 8,221,158 B2 | 7/2012 | Liao |
| 8,232,745 B2 | 7/2012 | Chemel et al. |
| 8,238,755 B2 | 8/2012 | Yamamoto et al. |
| 8,243,918 B2 | 8/2012 | Hazani et al. |
| 8,267,719 B1 | 9/2012 | Benoit et al. |
| 8,339,054 B2 | 12/2012 | Yu et al. |
| 8,344,667 B1 | 1/2013 | King |
| 8,360,810 B2 | 1/2013 | Binder |
| 8,384,241 B2 | 2/2013 | Chen et al. |
| 8,445,826 B2 | 5/2013 | Verfuerth |
| 8,471,480 B2 | 6/2013 | Kinderman et al. |
| 8,496,342 B2 | 7/2013 | Misener |
| 8,558,129 B2 | 10/2013 | Elliott et al. |
| 8,602,799 B2 | 12/2013 | Ganta et al. |
| 8,629,617 B2 | 1/2014 | Richards et al. |
| 8,658,893 B1 | 2/2014 | Shotey et al. |
| 8,668,347 B2 | 3/2014 | Ebeling |
| 8,710,770 B2 | 4/2014 | Woytowitz |
| 8,758,031 B2 | 6/2014 | Cheng et al. |
| 8,872,438 B2 | 10/2014 | Zhou et al. |
| 8,886,785 B2 | 11/2014 | Apte et al. |
| 8,963,437 B2 | 2/2015 | Wu |
| 8,965,411 B1 | 2/2015 | Busch_Sorensen et al. |

(56) References Cited

U.S. PATENT DOCUMENTS

| | | |
|---|---|---|
| 9,007,186 B1 | 4/2015 | Krummey et al. |
| 9,024,800 B2 | 5/2015 | Altonen et al. |
| 9,030,789 B2 | 5/2015 | Benoit et al. |
| 9,035,572 B1 | 5/2015 | Dolan |
| 9,095,053 B2 | 7/2015 | Trolese et al. |
| 9,112,319 B2 | 8/2015 | Liao et al. |
| 9,167,660 B2 | 10/2015 | Birch et al. |
| 9,184,590 B2 | 11/2015 | Testani |
| 9,214,773 B2 | 12/2015 | Misener |
| 9,293,376 B2 | 3/2016 | Su et al. |
| 9,312,673 B2 | 4/2016 | Byrne et al. |
| 9,320,162 B2 | 4/2016 | Kawamura et al. |
| 9,325,132 B2 | 4/2016 | Hsu |
| 9,351,353 B2 | 5/2016 | Recker et al. |
| 9,368,025 B2 | 6/2016 | Carmen |
| 9,368,982 B2 | 6/2016 | Jansen et al. |
| 9,380,685 B2 | 6/2016 | Shet et al. |
| 9,386,668 B2 | 7/2016 | Knapp et al. |
| 9,389,769 B1 | 7/2016 | O'Keeffe |
| 9,419,435 B2 | 8/2016 | Testani |
| 9,437,978 B2 | 9/2016 | Green |
| 9,451,745 B1 | 9/2016 | O'Shaughnessy et al. |
| 9,490,086 B2 | 11/2016 | Lagree et al. |
| 9,520,671 B2 | 12/2016 | Misener |
| 9,537,266 B1 | 1/2017 | Leach |
| 9,544,975 B2 | 1/2017 | Giltaca et al. |
| 9,581,342 B2 | 2/2017 | Daniels et al. |
| 9,589,461 B1 | 3/2017 | Byrne et al. |
| 9,603,223 B2 | 3/2017 | Patel et al. |
| 9,607,786 B2 | 3/2017 | Haines et al. |
| 9,608,418 B1 | 3/2017 | Elberbaum |
| 9,620,945 B2 | 4/2017 | Rohmer et al. |
| 9,633,584 B2 | 4/2017 | Underwood |
| 9,635,773 B1 | 4/2017 | Marshall |
| 9,640,962 B2 | 5/2017 | Hernandez Ramirez et al. |
| 9,680,656 B2 | 6/2017 | Rivera |
| 9,681,513 B2 | 6/2017 | Dadashnialehi et al. |
| 9,692,236 B2 | 6/2017 | Wootton et al. |
| 9,693,428 B2 | 6/2017 | Wagner et al. |
| 9,699,863 B2 | 7/2017 | Weightman et al. |
| 9,769,420 B1 | 9/2017 | Moses |
| 9,781,245 B2 | 10/2017 | Miller |
| 9,782,509 B2 | 10/2017 | Murahari et al. |
| 9,793,697 B1 | 10/2017 | Colao et al. |
| 9,799,469 B2 | 10/2017 | Bailey et al. |
| 9,826,604 B2 | 11/2017 | Karc et al. |
| 9,762,056 B1 | 12/2017 | Miller et al. |
| 9,837,753 B1 | 12/2017 | Chen |
| 9,837,813 B2 | 12/2017 | Newell et al. |
| 9,842,584 B1 | 12/2017 | Hart et al. |
| 9,866,990 B2 | 1/2018 | Cairns et al. |
| 9,964,447 B2 | 5/2018 | Fadell et al. |
| 10,048,653 B2 | 8/2018 | Ostrovsky et al. |
| 10,050,393 B1 | 8/2018 | Calabrese |
| 10,062,533 B2 | 8/2018 | Qureshi et al. |
| 10,063,002 B2 | 8/2018 | Richardson et al. |
| 10,069,235 B2 | 9/2018 | Blase et al. |
| 10,070,539 B2 | 9/2018 | Gates et al. |
| 10,078,786 B2 | 9/2018 | Richardson et al. |
| 10,084,272 B1 | 9/2018 | Hayes et al. |
| 10,096,951 B1 | 10/2018 | Hodge |
| 10,136,292 B2 | 11/2018 | Bosua et al. |
| 10,153,113 B2 | 12/2018 | Richardson et al. |
| 10,161,806 B2 | 12/2018 | Lermann |
| 10,175,996 B2 | 1/2019 | Byrne et al. |
| 10,188,300 B2 | 1/2019 | Tanaka |
| 10,193,285 B1 | 1/2019 | Satyanarayanan et al. |
| 10,225,005 B1 | 3/2019 | Elberbaum |
| 10,249,998 B2 | 4/2019 | Irons et al. |
| 10,381,792 B2 | 4/2019 | Hsu et al. |
| 10,349,536 B2 | 7/2019 | Li |
| 10,359,298 B2 | 7/2019 | Quady et al. |
| 10,375,803 B2 | 8/2019 | Dimberg et al. |
| 10,412,206 B1 | 9/2019 | Liang et al. |
| 10,418,813 B1 | 9/2019 | King |
| 10,425,236 B2 | 9/2019 | Bryne et al. |
| 10,431,940 B1 | 10/2019 | Walma, Jr. |
| 10,530,597 B1 | 1/2020 | King |
| 10,554,059 B1 | 2/2020 | Hemingway et al. |
| 10,587,147 B2 | 3/2020 | Carmen, Jr. |
| 10,621,113 B2 | 4/2020 | Bryne et al. |
| 10,667,347 B2 | 5/2020 | Fadell et al. |
| 10,699,131 B2 | 6/2020 | Richardson et al. |
| 10,700,477 B1 | 6/2020 | Richardson et al. |
| 10,716,194 B2 | 7/2020 | Chema et al. |
| 10,720,764 B2 | 7/2020 | Misener |
| 10,726,835 B2 | 7/2020 | Chua et al. |
| 10,727,731 B1 | 7/2020 | King |
| 10,741,984 B2 | 8/2020 | Chin |
| 10,917,956 B1 | 2/2021 | King et al. |
| 10,938,168 B2 | 3/2021 | King et al. |
| 10,944,220 B1 | 3/2021 | Richardson et al. |
| 10,958,020 B1 | 3/2021 | King et al. |
| 10,958,026 B1 | 3/2021 | King et al. |
| 10,965,068 B1 | 3/2021 | King et al. |
| 10,996,645 B1 | 5/2021 | King |
| 11,005,247 B1 | 5/2021 | Booyse et al. |
| 11,043,768 B1 | 6/2021 | King |
| 11,050,254 B2 | 6/2021 | King |
| 11,050,340 B2 | 6/2021 | King |
| 11,121,513 B2 | 9/2021 | Chien |
| 11,189,948 B1 | 11/2021 | King |
| 11,189,975 B1 | 11/2021 | Baldwin |
| 11,190,918 B1 | 11/2021 | Lingle et al. |
| 11,201,444 B1 | 12/2021 | King |
| 11,219,108 B1 | 1/2022 | King |
| 11,264,769 B1 | 3/2022 | King et al. |
| 11,456,584 B1 | 9/2022 | Taylor et al. |
| 11,460,874 B1 | 10/2022 | King et al. |
| 11,502,461 B1 | 11/2022 | King et al. |
| 11,521,472 B1 | 12/2022 | Rintz et al. |
| 11,564,320 B1 | 1/2023 | Zaharchuk et al. |
| 11,715,917 B1 | 8/2023 | Baldwin et al. |
| 2002/0052138 A1 | 5/2002 | Janik |
| 2002/0086567 A1 | 7/2002 | Cash |
| 2003/0021104 A1 | 1/2003 | Tsao |
| 2004/0009700 A1 | 1/2004 | Patel |
| 2004/0051485 A1 | 3/2004 | Chansky et al. |
| 2004/0075401 A1 | 4/2004 | Segan et al. |
| 2004/0077212 A1 | 4/2004 | Pulizzi |
| 2004/0177986 A1 | 9/2004 | Gorman |
| 2004/0218379 A1 | 11/2004 | Barton |
| 2004/0218411 A1 | 11/2004 | Luu et al. |
| 2005/0040772 A1 | 2/2005 | Guzman et al. |
| 2005/0055106 A1 | 3/2005 | Beutler et al. |
| 2005/0075741 A1 | 4/2005 | Altmann et al. |
| 2005/0104533 A1 | 5/2005 | Barthelmess |
| 2005/0122718 A1 | 6/2005 | Kazar et al. |
| 2005/0125083 A1 | 6/2005 | Kiko |
| 2005/0136972 A1 | 6/2005 | Smith et al. |
| 2005/0194243 A1 | 9/2005 | Prineppi |
| 2005/0252753 A1 | 11/2005 | Leo |
| 2005/0275981 A1 | 12/2005 | Power et al. |
| 2006/0025012 A1 | 2/2006 | Fields |
| 2006/0065510 A1 | 3/2006 | Kiko et al. |
| 2006/0066151 A1 | 3/2006 | Hatemata |
| 2006/0066510 A1 | 3/2006 | Takahashi |
| 2006/0262462 A1 | 11/2006 | Barton |
| 2007/0072476 A1 | 3/2007 | Milan |
| 2007/0099491 A1 | 5/2007 | Pyrros |
| 2007/0197262 A1 | 8/2007 | Smith et al. |
| 2007/0216318 A1 | 9/2007 | Altonen et al. |
| 2007/0217404 A1 | 9/2007 | Kawamata |
| 2007/0247366 A1 | 10/2007 | Smith et al. |
| 2008/0012423 A1 | 1/2008 | Mimran |
| 2008/0020632 A1 | 1/2008 | Gorman |
| 2008/0079568 A1 | 4/2008 | Primous et al. |
| 2008/0093100 A1 | 4/2008 | Bhakta |
| 2008/0104533 A1 | 5/2008 | List |
| 2008/0111501 A1 | 5/2008 | Dobbins et al. |
| 2008/0156510 A1 | 7/2008 | Yan |
| 2009/0039706 A1 | 2/2009 | Kotlyar et al. |
| 2009/0045817 A1* | 2/2009 | Savicki, Jr. .......... H01R 25/003 324/508 |

(56) References Cited

U.S. PATENT DOCUMENTS

| | | |
|---|---|---|
| 2009/0058707 A1 | 3/2009 | Craze et al. |
| 2009/0103228 A1 | 4/2009 | Elderbaum |
| 2009/0107693 A1 | 4/2009 | Meyer |
| 2009/0194311 A1 | 4/2009 | Merrill |
| 2009/0137163 A1 | 5/2009 | Schoettle |
| 2009/0180261 A1 | 7/2009 | Angelides et al. |
| 2009/0189542 A1 | 7/2009 | Wu et al. |
| 2009/0247006 A1 | 10/2009 | Thompson |
| 2009/0251127 A1 | 10/2009 | Kim |
| 2009/0261661 A1 | 10/2009 | Finneran |
| 2009/0278479 A1 | 11/2009 | Platner et al. |
| 2010/0006648 A1 | 1/2010 | Grant et al. |
| 2010/0026194 A1 | 2/2010 | Paton |
| 2010/0066484 A1 | 3/2010 | Hanwright et al. |
| 2010/0070100 A1 | 3/2010 | Finlinson et al. |
| 2010/0084996 A1 | 4/2010 | Van De Sluis et al. |
| 2010/0130053 A1 | 5/2010 | Ziobro |
| 2010/0201267 A1 | 8/2010 | Bourquin et al. |
| 2010/0308735 A1 | 12/2010 | Liu et al. |
| 2011/0021040 A1 | 1/2011 | Garb et al. |
| 2011/0031819 A1 | 2/2011 | Gunwall |
| 2011/0035029 A1 | 2/2011 | Yianni et al. |
| 2011/0043034 A1 | 2/2011 | Pien |
| 2011/0124350 A1 | 5/2011 | Sukovic |
| 2011/0140548 A1 | 6/2011 | Hakkarainen et al. |
| 2011/0148309 A1 | 6/2011 | Reid et al. |
| 2011/0178650 A1 | 7/2011 | Picco |
| 2011/0211425 A1 | 9/2011 | Liu |
| 2011/0287665 A1 | 11/2011 | Chien |
| 2012/0021623 A1 | 1/2012 | Gorman |
| 2012/0025717 A1 | 2/2012 | Klusmann et al. |
| 2012/0049639 A1 | 3/2012 | Besore et al. |
| 2012/0060044 A1 | 3/2012 | Jonsson |
| 2012/0063486 A1 | 3/2012 | Yamawaku et al. |
| 2012/0066168 A1 | 3/2012 | Fadell et al. |
| 2012/0088399 A1 | 4/2012 | Perritt |
| 2012/0088493 A1 | 4/2012 | Chen et al. |
| 2012/0094511 A1 | 4/2012 | Sil |
| 2012/0112666 A1 | 5/2012 | Bennette |
| 2012/0139348 A1 | 6/2012 | DuBose |
| 2012/0161973 A1 | 6/2012 | Hsu |
| 2012/0195045 A1 | 8/2012 | King |
| 2012/0239773 A1 | 9/2012 | Blustein et al. |
| 2012/0274219 A1 | 11/2012 | Woytowitz et al. |
| 2012/0286940 A1 | 11/2012 | Carmen et al. |
| 2012/0292174 A1 | 11/2012 | Mah et al. |
| 2012/0302219 A1 | 11/2012 | Vang |
| 2012/0318657 A1 | 12/2012 | Hoffknecht et al. |
| 2013/0010018 A1 | 1/2013 | Economy |
| 2013/0026947 A1 | 1/2013 | Economy et al. |
| 2013/0026953 A1 | 1/2013 | Woytowitz |
| 2013/0040471 A1 | 2/2013 | Gervais |
| 2013/0040489 A1 | 2/2013 | Fang |
| 2013/0045624 A1 | 2/2013 | Snyder |
| 2013/0063042 A1 | 3/2013 | Bora et al. |
| 2013/0147367 A1 | 3/2013 | Cowburn |
| 2013/0155723 A1 | 6/2013 | Coleman |
| 2013/0196535 A1 | 8/2013 | Utz |
| 2013/0226354 A9 | 8/2013 | Ruff et al. |
| 2013/0234534 A1 | 9/2013 | Lin |
| 2013/0240235 A1 | 9/2013 | Higashihama et al. |
| 2013/0257315 A1 | 10/2013 | Restrepo et al. |
| 2013/0260613 A1 | 10/2013 | Misener |
| 2013/0264997 A1 | 10/2013 | Lee et al. |
| 2013/0267116 A1 | 10/2013 | Tin |
| 2013/0270097 A1 | 10/2013 | Cheng |
| 2014/0006660 A1 | 1/2014 | Frei et al. |
| 2014/0028287 A1 | 1/2014 | Brookes |
| 2014/0070959 A1 | 3/2014 | Bhargava et al. |
| 2014/0090865 A1 | 4/2014 | Potucek et al. |
| 2014/0126118 A1 | 5/2014 | Ewing et al. |
| 2014/0166447 A1 | 6/2014 | Thea et al. |
| 2014/0180487 A1 | 6/2014 | Bull |
| 2014/0239843 A1 | 8/2014 | Hoang |
| 2014/0244040 A1 | 8/2014 | Alberth, Jr. et al. |
| 2014/0265883 A1 | 9/2014 | Mortun |
| 2014/0266287 A1 | 9/2014 | Reeder, III |
| 2014/0273618 A1 | 9/2014 | King |
| 2014/0285095 A1 | 9/2014 | Chemel et al. |
| 2014/0308853 A1 | 10/2014 | Colahan et al. |
| 2014/0320312 A1 | 10/2014 | Sager et al. |
| 2014/0334648 A1 | 11/2014 | Wang |
| 2014/0368977 A1 | 12/2014 | Lenny |
| 2015/0035476 A1 | 2/2015 | Frid et al. |
| 2015/0115728 A1 | 4/2015 | Yamamoto et al. |
| 2015/0115801 A1 | 4/2015 | King |
| 2015/0136437 A1 | 5/2015 | Hitchman |
| 2015/0163867 A1 | 6/2015 | Recker et al. |
| 2015/0168931 A1 | 6/2015 | Jin |
| 2015/0189726 A1 | 7/2015 | Spira |
| 2015/0214708 A1 | 7/2015 | Segnit |
| 2015/0228426 A1 | 8/2015 | Romano et al. |
| 2015/0229026 A1 | 8/2015 | Lindmark |
| 2015/0249337 A1 | 9/2015 | Raneri et al. |
| 2015/0253364 A1 | 9/2015 | Hieda et al. |
| 2015/0255932 A1 | 9/2015 | Dicks et al. |
| 2015/0256355 A1 | 9/2015 | Pera et al. |
| 2015/0256665 A1 | 9/2015 | Pera et al. |
| 2015/0295438 A1 | 10/2015 | Herr et al. |
| 2015/0303724 A1 | 10/2015 | Lin et al. |
| 2015/0334676 A1 | 11/2015 | Hart et al. |
| 2015/0351187 A1 | 12/2015 | McBryde et al. |
| 2015/0357133 A1 | 12/2015 | Keirstead et al. |
| 2015/0366039 A1 | 12/2015 | Noori et al. |
| 2015/0373796 A1 | 12/2015 | Bahrehmand |
| 2015/0382436 A1 | 12/2015 | Kelly et al. |
| 2016/0006202 A1 | 1/2016 | Dupuis et al. |
| 2016/0007288 A1 | 1/2016 | Samardzija et al. |
| 2016/0036819 A1 | 2/2016 | Zehavi et al. |
| 2016/0041573 A1 | 2/2016 | Chen et al. |
| 2016/0044447 A1 | 2/2016 | Tetreault et al. |
| 2016/0050695 A1 | 2/2016 | Bichot et al. |
| 2016/0066130 A1 | 3/2016 | Bosua et al. |
| 2016/0125733 A1 | 5/2016 | Sallas et al. |
| 2016/0126031 A1 | 5/2016 | Wootton et al. |
| 2016/0126950 A1 | 5/2016 | Lucantonio |
| 2016/0172808 A1 | 6/2016 | Lauby et al. |
| 2016/0209899 A1 | 7/2016 | Brantner et al. |
| 2016/0212832 A1 | 7/2016 | King |
| 2016/0219728 A1 | 7/2016 | Balyan |
| 2016/0233707 A1 | 8/2016 | Kidakarn |
| 2016/0233605 A1 | 9/2016 | Hernandez Ramirez et al. |
| 2016/0255697 A1 | 9/2016 | Bhide |
| 2016/0255702 A1 | 9/2016 | Thompson |
| 2016/0276946 A1 | 9/2016 | Fuchs et al. |
| 2016/0322754 A1 | 11/2016 | Green |
| 2016/0323972 A1 | 11/2016 | Bora et al. |
| 2016/0337801 A1 | 11/2016 | Houri |
| 2017/0023963 A1 | 1/2017 | Davis et al. |
| 2017/0025845 A1 | 1/2017 | Platise |
| 2017/0025854 A1 | 1/2017 | Willis et al. |
| 2017/0033566 A1 | 2/2017 | Jursch |
| 2017/0033942 A1 | 2/2017 | Koeninger |
| 2017/0054315 A1 | 2/2017 | Chien |
| 2017/0063008 A1 | 3/2017 | Goyal et al. |
| 2017/0070090 A1 | 3/2017 | Miller |
| 2017/0093105 A1 | 3/2017 | Belinksky et al. |
| 2017/0105176 A1 | 4/2017 | Finnegan et al. |
| 2017/0108236 A1 | 4/2017 | Guan et al. |
| 2017/0148443 A1 | 5/2017 | Hadier et al. |
| 2017/0149180 A1 | 5/2017 | Siegler |
| 2017/0162985 A1 | 6/2017 | Randall et al. |
| 2017/0188442 A1 | 6/2017 | King |
| 2017/0221654 A1 | 8/2017 | Danowski et al. |
| 2017/0223807 A1 | 8/2017 | Recker et al. |
| 2017/0229937 A1 | 8/2017 | Pedersen |
| 2017/0236766 A1 | 8/2017 | Read et al. |
| 2017/0237198 A1 | 8/2017 | Sathyanarayana et al. |
| 2017/0238401 A1 | 8/2017 | Sadwick et al. |
| 2017/0250550 A1 | 8/2017 | Miftakhov et al. |
| 2017/0257096 A1 | 9/2017 | Lark et al. |
| 2017/0257930 A1 | 9/2017 | Lark et al. |
| 2017/0271921 A1 | 9/2017 | Lombardi et al. |
| 2017/0273203 A1 | 9/2017 | Iaconis |

(56) References Cited

U.S. PATENT DOCUMENTS

| | | |
|---|---|---|
| 2017/0295623 A1 | 10/2017 | Pennycooke |
| 2017/0295624 A1 | 10/2017 | Lark et al. |
| 2017/0295625 A1 | 10/2017 | Lark et al. |
| 2017/0295630 A1 | 10/2017 | Lark, Jr. et al. |
| 2017/0295631 A1 | 10/2017 | Lark et al. |
| 2017/0310049 A1 | 10/2017 | Derousse |
| 2017/0328777 A1 | 11/2017 | Zeckendorf et al. |
| 2018/0012710 A1 | 1/2018 | Lark et al. |
| 2018/0013428 A1 | 1/2018 | Lark |
| 2018/0014381 A1 | 1/2018 | Lark |
| 2018/0014384 A1 | 1/2018 | Charlton |
| 2018/0014388 A1 | 1/2018 | Pennycooke et al. |
| 2018/0014390 A1 | 1/2018 | Aylward et al. |
| 2018/0014391 A1 | 1/2018 | Lark et al. |
| 2018/0014392 A1 | 1/2018 | Charlton et al. |
| 2018/0014393 A1 | 1/2018 | Cheung et al. |
| 2018/0048710 A1 | 2/2018 | Altin |
| 2018/0070424 A1 | 3/2018 | Lark et al. |
| 2018/0070429 A1 | 3/2018 | Lark |
| 2018/0070430 A1 | 3/2018 | Edwards et al. |
| 2018/0070431 A1 | 3/2018 | Charlton et al. |
| 2018/0107187 A1 | 4/2018 | Singh |
| 2018/0109999 A1 | 4/2018 | Finnegan |
| 2018/0168900 A1 | 6/2018 | McNeely et al. |
| 2018/0175600 A1 | 6/2018 | Holloway |
| 2018/0210538 A1 | 7/2018 | Aimone |
| 2018/0233006 A1 | 8/2018 | Koniarek et al. |
| 2018/0302235 A1 | 10/2018 | Cregg et al. |
| 2018/0316189 A1 | 11/2018 | Mozayeny |
| 2018/0337495 A1 | 11/2018 | Martinez |
| 2018/0356964 A1 | 12/2018 | Morris |
| 2018/0359873 A1 | 12/2018 | Shemirani |
| 2018/0375313 A1 | 12/2018 | Misener et al. |
| 2018/0375342 A1 | 12/2018 | Sultenfuss et al. |
| 2019/0027876 A1 | 1/2019 | Murahari et al. |
| 2019/0069419 A1 | 2/2019 | Li |
| 2019/0081445 A1 | 3/2019 | Kuhn et al. |
| 2019/0171413 A1 | 6/2019 | Beatty et al. |
| 2019/0199545 A1 | 6/2019 | Ard et al. |
| 2019/0229478 A1 | 7/2019 | Iaconis et al. |
| 2019/0252814 A1 | 8/2019 | Richardson et al. |
| 2019/0282016 A1 | 9/2019 | Long et al. |
| 2019/0386468 A1 | 12/2019 | Ewing et al. |
| 2020/0006023 A1 | 1/2020 | Qureshi et al. |
| 2020/0006886 A1 | 1/2020 | Chen |
| 2020/0006948 A1 | 1/2020 | Wootton et al. |
| 2020/0036141 A1 | 1/2020 | Smith et al. |
| 2020/0044381 A1 | 2/2020 | Stremlau et al. |
| 2020/0143667 A1 | 5/2020 | Zimmer |
| 2020/0144007 A1 | 5/2020 | Shivell |
| 2020/0194980 A1 | 6/2020 | Roosli et al. |
| 2020/0195015 A1 | 6/2020 | Chien |
| 2020/0203905 A1 | 6/2020 | Parks |
| 2020/0220292 A1 | 7/2020 | Audy |
| 2020/0227998 A1 | 7/2020 | King |
| 2020/0228954 A1 | 7/2020 | Bosua et al. |
| 2020/0249785 A1 | 8/2020 | Anadasu et al. |
| 2020/0328586 A1 | 10/2020 | Ericksen et al. |
| 2021/0048910 A1 | 2/2021 | Anadasu et al. |
| 2021/0104855 A1 | 4/2021 | Bayard et al. |
| 2021/0164227 A1 | 6/2021 | Zhou et al. |
| 2021/0173364 A1 | 6/2021 | Telefus et al. |
| 2021/0184443 A1 | 6/2021 | Rohmer |
| 2021/0212185 A1 | 7/2021 | Diesel et al. |
| 2021/0263111 A1 | 8/2021 | Magno |
| 2021/0285258 A1 | 9/2021 | Leigh |
| 2021/0288434 A1 | 9/2021 | Ramsey et al. |
| 2021/0305759 A1 | 9/2021 | Bhakta et al. |
| 2021/0313733 A1 | 10/2021 | Martin et al. |
| 2021/0344182 A1 | 11/2021 | Fernandez |
| 2021/0211121 A1 | 12/2021 | Petry |
| 2021/0391803 A1 | 12/2021 | Martinez et al. |
| 2021/0399574 A1 | 12/2021 | Wiggins et al. |
| 2022/0037861 A1 | 2/2022 | McKimmey |
| 2022/0045464 A1 | 2/2022 | Leahy |
| 2022/0149571 A1 | 5/2022 | Codreanu et al. |
| 2022/0171355 A1 | 6/2022 | Jahan et al. |
| 2022/0201825 A1 | 6/2022 | Cohen et al. |
| 2022/0209821 A1 | 6/2022 | Eriksen et al. |
| 2022/0232689 A1 | 7/2022 | Shurte et al. |
| 2022/0247408 A1 | 8/2022 | Bacchin et al. |
| 2022/0279665 A1 | 9/2022 | McDonald |
| 2022/0297558 A1 | 9/2022 | Daoura et al. |
| 2022/0313370 A1 | 10/2022 | Morgan et al. |
| 2022/0320808 A1 | 10/2022 | Armstrong |
| 2022/0342373 A1 | 10/2022 | Ho et al. |
| 2022/0344883 A1 | 10/2022 | Misener et al. |
| 2022/0385063 A1 | 12/2022 | Protzman et al. |
| 2022/0408169 A1 | 12/2022 | Ebeling et al. |
| 2023/0034501 A1 | 2/2023 | Pinkowski et al. |
| 2023/0070789 A1 | 3/2023 | Kearney et al. |
| 2023/0075542 A1 | 3/2023 | Padro et al. |
| 2023/0209756 A1 | 6/2023 | Brower et al. |
| 2023/0231410 A1 | 7/2023 | Nakada et al. |
| 2023/0236554 A1 | 7/2023 | Godfrey et al. |
| 2023/0297048 A1 | 9/2023 | Larson |

FOREIGN PATENT DOCUMENTS

| | | |
|---|---|---|
| CN | 104934796 | 9/2015 |
| DE | 102011054357 | 4/2013 |
| IN | 1960CHE2012 | 11/2013 |
| IN | 201914042059 | 4/2020 |
| JP | 2014053239 | 3/2014 |
| KR | 100801042 | 11/2006 |
| KR | 101174730 | 8/2012 |
| KR | 10-1790779 | 11/2017 |
| KR | 20170068580 | 11/2017 |
| KR | 101995664 | 2/2019 |
| WO | 09832208 | 7/1998 |
| WO | 2002052703 | 7/2002 |
| WO | 2005078871 | 8/2005 |
| WO | 2013012170 | 1/2013 |
| WO | 2014047634 | 3/2014 |
| WO | 2017178680 | 4/2017 |
| WO | 2018219748 | 6/2018 |
| WO | 2020144669 | 7/2020 |
| WO | 2020146046 | 7/2020 |
| WO | 2021056100 | 4/2021 |
| WO | 2022046860 | 3/2022 |
| WO | 2022266230 | 12/2022 |
| WO | 3033266230 | 12/2022 |

OTHER PUBLICATIONS

Leviton Voice Dimmer with Amazon Alexa Built-in. published Mar. 2020.
Deako Switch Brochure, published 2015.
Amazon Echo Flex Sales Brochure, published 2019.
U.S. Appl. No. 15/645,699 SP201, Jul. 10, 2017.
My Q Chamberlain Smart Light Switch Brochure, published 2017.
Ecobee Switch Brochure, Lighting that's so Smart, It's Brilliant, published 2019.
U.S. Appl. No. 15/645,618 SP101, Jul. 10, 2017.
Lutron Installation Instructions For Receptacles For Dimming Use, published 2007.
Intermatic Ascend Timer Installation and Operation Manual, published 2018.
Philips Hue Wall Switch Module, Personal Wireless Lighting, Mar. 2021.
Anchor by Panasonic, Vision Product Brochure, 2013.
PowerTech Smart Wall CES 2020 Innovation Awards, 2019.
Himel Click Series Catalog, 2016.
Himel Click Series 2 Gang Socket brochure, 2016.
U.S. Appl. No. 16/805,717, entitled " A Power Switch Having a Voice Activated User Interface," filed Feb. 29, 2020 and having a priority date of Nov. 28, 2016.
GE Smart Digital Timer, published Jul. 2010.
GE Digital Time Switch, published Nov. 24, 2009.
SmartLink-INSTEON Smarthome, published Aug. 27, 2008.
Schlage Link RP200 Light Module User Manual, published 03/09.

(56) References Cited

OTHER PUBLICATIONS

Brinks 44-1074 Timer User Manual, published 2010.
Swidget outlet WiFi—USB Charger, published Jul. 2017.
Swidget Switch First Modular Dimmable Wall Switch, published Jul. 2019.
Intermatic SS8 User Manual, published Sep. 13, 2002.
Intermatic EJ500C User Manual, published Aug. 3, 2004.
Lutron Caseta Discover the Power of Smart Lighting, published Nov. 2017.
Sylvania Model SA135, published 2010.
GE SunSmart Digital Timer published 2010.
A System for Smart-Home Control of Appliances Based on Timer and Speech Interaction, Jan. 2006.
GE Touchsmart In-Wall Digital Timer, published 2014.
Noon home Lighting System, published Oct. 2017.
Leviton Split Duplex Receptacle, published 2017.
Leviton Plug-in Outlet with Z-Wave Technology, published 2017.
Heath/Zenith Motion Sensor Light Control, published 2012.
Leviton Load Center Brochure, published 2019.
Sylvania SA 170 User Manual, published Aug. 17, 2005.
GE Wireless Lighting Control 45631 Keypad Controller User Manual, published Apr. 2010.
Decora Preset Slide & Rotary Controls, published 2014.
Brinks Home Office 441074B Timer, published Mar. 2010.
Control4 Squared Wired Configurable Keypad V2, published 2016.
Decora Wired Keypad Data Sheet Control C4-KCB, published 2014.
Legrand AlphaRex 3 The New Generation, published May 2016.
Legrand Pass & Seymour Specification Grade Self-test GFCIs, published Dec. 2015.
Legrand Pass & Seymour Tamper-Resistant Duplex Outlet with Nightlight, published May 2014.
Legrand Time Switches and Modular Control Devices, published May 2016.
Leviton Renu Color Change Instructions, published 2010.
Lutron Energi TriPak, published Nov. 2014.
WiFi Smart Plug, Mini Outlets Smart Socket No. Hub Required Timing Function Control Your Electric Devices from Anywhere, published 2017.
WiFi Smart Power Strip, Conico Smart Surge Protector with 4 USB Ports and 4 Smart AC Plugs, published 2017.
Jasco GE Enbrighten Add-On Switch P/N 46199, date 2019.
Feit Smart Wi-Fi Dimmer P/N DIM/WIFI, date 2022.
Leviton Motion Sensor Remote P/N IPVOR, date 2017.
Jasco GE Enbrighten Zigbee Smart Dimmer P/N 46203, date 2019.
Scene_Controller_Guides_Deako_Support, published 2018.
Leviton Decore Matching Remote P/N Door-DL, date 2019.
Deako_Backplate and Simple Switch Instruction Guide, published 2020.
Backplate_Wiring_Instructions_Deako_Support, published 2018.
Smart_Dimmer_Guides_Deako_Support, published 2018.
Smart_Switch_Guides_Deako_Support, published 2018.
Motion_Sensor_Timer_Guide_Deako_support, published 2018.
Decora Universal Dimmer Frequently Asked Questions, published 2017.
Lutron Maestro CL PRO Dimmer, P/N 0301946 Rev A, 2019.
Leviton Decora 3-Way Dimmer and Universal Matching Remote (DDROOR-DLZ) Installation Instructions, 2019.
Leviton Decora Slide Dimmer, Cat. No. IPL06 Installation Instructions, published 2011.
Leviton Decora Smart Second Generation Dimmer, Cat. No. D26HD Getting Started Guide, published 2021.
Leviton Single Pole, 3-Way Slide Dimmer, Cat. No.6674-P Install Instructions, published 2011.
Leviton Decora Single Pole and 3-Way LED Dimmer Cat. No. DDM06-1L Installation Instructions, 2020.
PCT Communication in Cases for which No Other Form is Applicable, PCT/US2022/048393, Dec. 13, 2023.
Leviton Decora Single Pole and 3 Way Wide View Motion Activated Light Control, Cat. No. IPS15, IPV15 published 2012.
Jasco GE Enbrighten Smart Switch P/N 46201, date 2019.
Meross Smart Wi-Fi Dimmer/3-Way P/N MSS 570MA and 570AD date 2020.
Leviton Deocra SureSlide Control Brochure, published 2022.
Lutron Caseta Wireless Advanced Instruction Guide, Mar. 2020.

* cited by examiner

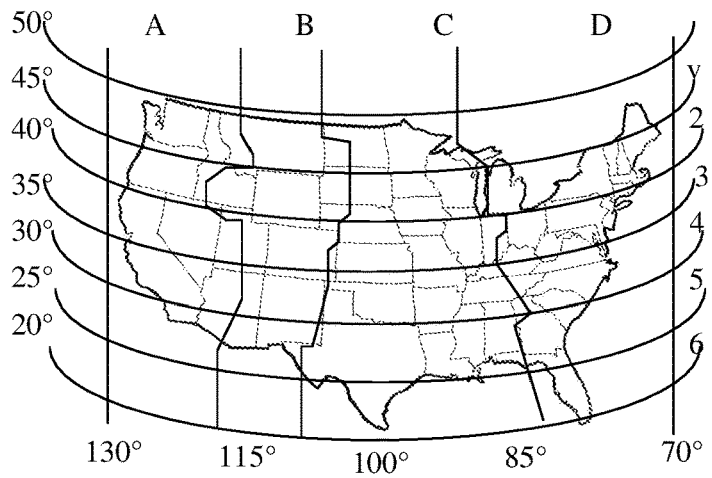

FIG. 24

| Latitude Range | Longitude Range | Region | Dusk/Dawn |
|---|---|---|---|
| 45°-50° | Pacific | A1 | Table A1 |
| 40°-45° | Pacific | A2 | Table A2 |
| ⋮ | ⋮ | ⋮ | ⋮ |
| 25°-30° | Pacific | A5 | Table A5 |
| 20°-25° | Pacific | A6 | Table A6 |
| 45°-50° | Mountain | B1 | Table B1 |
| ⋮ | ⋮ | ⋮ | ⋮ |
| 25°-30° | Mountain | B5 | Table B5 |
| 45°-50° | Central | C1 | Table C1 |
| 40°-45° | Central | C2 | Table C2 |
| ⋮ | ⋮ | ⋮ | ⋮ |
| 45°-50° | Eastern | D1 | Table D1 |
| ⋮ | ⋮ | ⋮ | ⋮ |
| 25°-30° | Eastern | D5 | Table D5 |
| 20°-25° | Eastern | D6 | Table D6 |

FIG. 25

| Date Range | Dawn | Dusk |
|---|---|---|
| DR1 | DAWN1 | DUSK1 |
| DR2 | DAWN2 | DUSK2 |
| ⋮ | ⋮ | ⋮ |
| DR20 | DAWN20 | DUSK20 |
| DR21 | DAWN21 | DUSK21 |
| ⋮ | ⋮ | ⋮ |
| DRN-1 | DAWNN-1 | DUSKN-1 |
| DRN | DAWNN | DUSKN |

FIG. 26

IN-WALL POWER ADAPTER AND METHOD OF IMPLEMENTING AN IN-WALL ADAPTER

RELATED APPLICATIONS

Applicant claims priority to provisional application U.S. Ser. No. 62/480,389, filed on Apr. 1, 2017, to application Ser. No. 15/645,745, filed on Jul. 10, 2017, to application Ser. No. 16/571,152, filed on Sep. 15, 2019 (SP301C2), and application Ser. No. 16/940,066, filed on Jul. 27, 2020, the entire applications of which are incorporated by reference.

FIELD OF THE INVENTION

An embodiment of the present invention relates generally to power adapters, and in particular, to a modular power adapter and a method of implementing a modular power adapter.

BACKGROUND OF THE INVENTION

Power adapters, which control the application of power to a device, are an important part of any residential or commercial building, and can provide beneficial control of a load attached to the power adapter, such as timing control and other features such as dimming. As power adapters continue to advance, additional functionality may be available to a user. However, replacing a power adapter can come with significant expense. In addition to the cost of replacing the power adapter, it may be necessary to pay for the professional installation of the power adapter, such as in the case of an in-wall installed power adapter that is coupled to wires in a wall of a residential or commercial building.

Accordingly, circuits, devices, systems and methods that enable a user to implement different power adapters are beneficial.

SUMMARY

An in-wall power adapter configured to apply power to a load is described. The in-wall power adapter may comprise a first plurality of contact elements adapted to receive power and apply to power to the load; a recess adapted to receive a control module; a second plurality of contact elements positioned within the recess and adapted to be coupled to corresponding contact elements of a control module; and an input portion adapted to receive an input from a user; wherein the in-wall power adapter is adapted to control an application of the power to the load in response to a control signal.

Another in-wall power adapter configured to apply power to a load may comprise a first plurality of contact elements adapted to receive power and apply to power to the load; a recess having a second plurality of contact elements; a control module provided in the recess, wherein the second plurality of contact elements are positioned within the recess and adapted to be coupled to corresponding contact elements of the control module; and an input portion separate from the control module and adapted to receive an input from a user; wherein the in-wall power adapter is adapted to control an application of the power to the load in response to a control signal.

A method of implementing an in-wall power adapter configured to apply power to a load is also described. The method comprises providing a first plurality of contact elements adapted to receive power and apply to power to the load; receiving a control module in a recess of the in-wall power adapter; positioning a second plurality of contact elements within the recess, wherein the second plurality of contact elements are adapted to be coupled to corresponding contact elements of a control module; and providing an input portion separate from the control module and adapted to receive an input from a user; wherein the in-wall power adapter is adapted to control the application of the power to the load in response to a control signal.

BRIEF DESCRIPTION OF THE DRAWINGS

FIG. 24 is a map showing the division of the geographical area of the map into a plurality of regions;

FIG. 25 is a table showing the definition of the plurality of regions and associated tables with the regions;

FIG. 26 is an example of a table that could be implemented as any one of the tables of FIG. 25;

DETAILED DESCRIPTION

Figure 1:
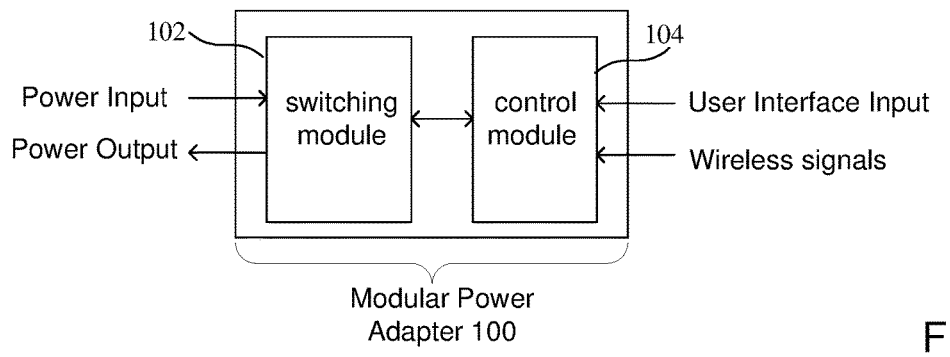
FIG. 1 is a block diagram of a modular power adapter.
Figure 2:
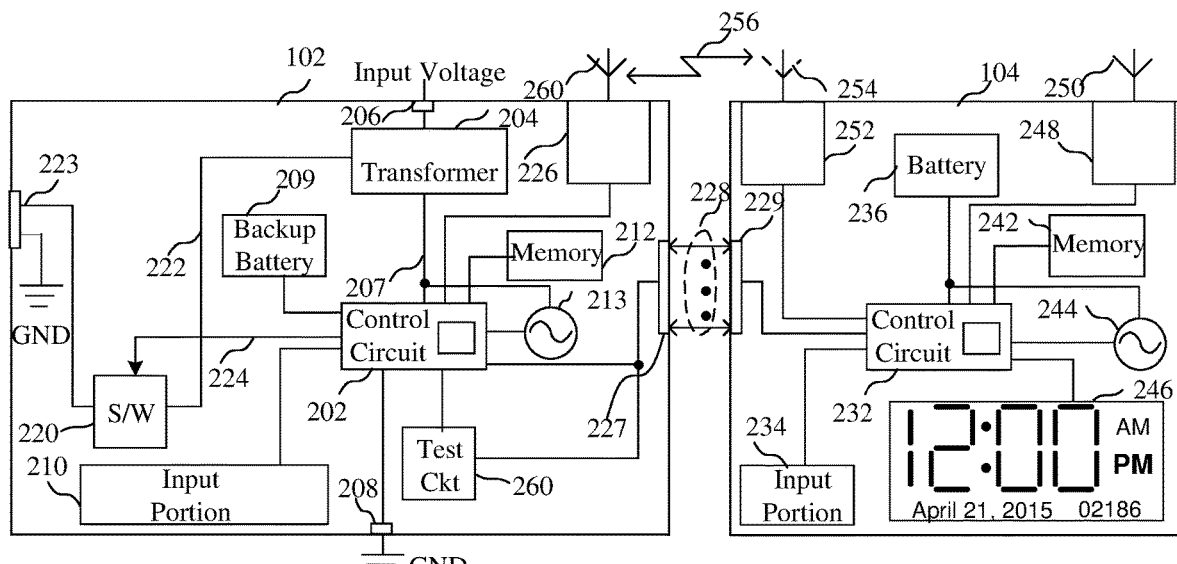
FIG. 2 is another block diagram of a modular power adapter.

The circuits, systems and methods set forth below and shown in the figures relate to power adapters, which may include "in-wall" adapters that are hard wired to electrical wires in a wall (such as to wires in a junction box for example) or plug-in adapters having prongs of a plug that are inserted into an electrical outlet. The circuits and methods provide a modular power adapter (as shown in FIGS. 1 and 2, where elements within or on another side of a device are shown in dashed lines), and split the functionality between a first portion, which could be a switching portion or module for enabling the switching of power to a device controlled by the modular power adapter and may be wired into a junction box, and a second portion, which may be a control portion or module that controls the switching of power received by a switching portion and applied to a device receiving power from the power adapter (such as a porch light controlled by a power adapter hard wired into a junction box or a lamp plugged into a plug-in adapter for example, where the porch light and the lamp are commonly known as a load). The power adapter may be implemented such that the first portion has switching elements that control the application of power to a load while the second portion provides signals to the first portion to control the switching elements. The second portion may be removably coupled to the first portion by way of attachment elements, where the second portion may provide electrical signals to the first portion by way of contact elements of the second portion, such as pogo pins or other flexible contacts or rigid contacts, coupled to corresponding contact elements of the first portion, such as contact pads. Alternatively, the contact elements could be placed on the first portion and the contact pads could be placed on the second element. However, it should be understood that any type of contact arrangement for providing electrical signals from the second portion to the first portion could be implemented. In addition to contact elements, guide or alignment elements could be used on the switching module or the control module to align the modules.

The modular power adapter is implemented to enable any one of a plurality of control modules (shown for example in FIGS. 3-8) to be coupled to the switching module, and control the switching operation of the switching module. By way of example, and without limitation, the control module could be a toggle switch (such as a paddle-type toggle switch as shown in FIG. 4) with a dimming function. The control module could optionally include a wireless module for enabling wireless control by way of any short range wireless connection, such as a circuit for implementing any variation of a Bluetooth protocol or a Near Field Communication (NFC) protocol, or any local wireless network, such as a WiFi network or a wide area network, such as a cellular network. It should be understood that the wireless module could be a removable module coupled to the switching module or the control module, enabling changing a wireless communication protocol used by the modular power adapter. According to another implementation, the control module comprises a motion detector having an on/off button. A further implementation may comprise a simple on/off switch, which may comprise a status LED light to indicate the state of the load that is under control of the switch, such as a porch light that may not be visible, and an optional wireless control circuit and/or an optional display. According to further implementations, any of the control portions may comprise a timer, which may have pre-programmed buttons or programmable buttons. A backup battery to maintain any timing patterns, such as schedules for applying power to a device, may be implemented on one or more of the switching portion or the control portion. The timing patterns include at least one on and off time, and may be associated with a certain day or date or group of days or dates. According to one implementation, a display would be implemented as a part of the switching module, where other interface elements could be a part of a control module or split between the switching module and the control module. According to another implementation, the display could be a part of the control module.

The control module could be attached to the switching module using any suitable attachment elements. For example, the bottom of the control module could include a flange that could be inserted into a flange receiving portion of the switching module in a "ski-boot" fashion, where attachment element on one or more of the top or sides of the control module may be used to secure the control module to the switching module. The attachment element could be any type of latching element or threaded element that could receive a screw to secure the control module to the switching module. The attachment element could also include a flange, snap, strap, magnet, Velcro portion, or any other means for securing the control module to the switching module.

The control module may have a flange extending from the sides around the perimeter or at least a portion of the perimeter to enable a user interface portion, which may include the display and any control actuators or elements, to extend through a recess in a wall plate. For example, many conventional switch devices have a user interface portion of approximately 3.2 centimeters (cm) by 6.6 cm that extends through a recess or opening in the wall plate that is secured to the switch device and covers the junction box. The perimeter of the opening in the wall plate may abut the flange of the control module to help secure the control module to the switching module. That is, the user interface portion of the control module beyond the flange could extend through the opening of the wall plate. Alternatively, the control module could extend into a recess of the switching module, where the perimeter of the opening of the wall plate would align with a flange or outer surface of a recessed portion of the switching module. According to other implementations, the control module could be removed while the wall plate is secured to the switching device. In either case, the modular nature of the modular power adapter may not be evident to a user. For a modular power adapter that is a plug-in device, the control module could (i) function as a cover for the switching module, (ii) could include openings to expose portions of the control module under the cover, or (iii) could be included under a cover generally having no other functionality.

A front surface of the power adapter, such as a surface of the recess of the switching module in an implementation having a recess, would include contact elements that would be coupled to corresponding contacts on the control portion to enable the control of a device using control signals coupled from the control device to the power adapter. While a physical electrical connection is shown by way of example, it should also be understood that communication of control signals or other signals could be achieved by another means, such as a wireless connection established between corresponding wireless communication circuits in the switching portion and the control portion. That is, in addition to any wireless connection between the control module and a wireless communication device, such as a smart phone or tablet computer for example, there may be a wireless connection, such as a Near Field Communication (NFC) connection, between the control module and the switching module. Further, it should be noted that the control module could be configured to provide multi-mode communication with communication devices external to the control module, such as multiple modules including both a WiFi module and a Bluetooth module for example. That is, a user could provide control signals from a communication device such as a smart phone or tablet computer using either a WiFi connection or a Bluetooth connection. The control module and/or the switching module could include a connector for receiving a portable memory device, such as a USB thumb drive, to download data, including timing patterns, operational information (e.g. at least one of time, data or location), firmware updates, or any other data which may enable the operation of the modular power adapter.

According to another implementation, the control module could be incorporated as a part of the wall plate as shown for example in FIGS. 11-14, enabling the implementation of a single switch module, where different control modules can provide different functionality. The single switch module could a simple toggle switch (or a paddle-type switch that fills the approximately 3.2 cm by 6.6 cm opening of the wall plate), where different control modules would interface (directly or wirelessly) with the switch module. For example, contacts on the control module (on the wall plate) could align with contracts on the switch module adjacent to the switch portion. The different control modules could provide different functionality, such as dimmer functionality or timer functionality. Some control modules could provide multiple functionality. The control module could be an integral part (i.e. not removable) of the wall switch plate, where a user would replace an entire wall plate to obtain the functionality of a different control module. Alternatively, the control module could be removably attached to the wall plate, where the user could remove one control module and replace it with another control module. According to another implementation, the wall plate could be configured to receive multiple control modules. For example, a control module could be placed on either side of the opening of the wall plate, where a second set of contact elements would be placed on the opposite side of the switch module of the first set of contact elements.

One benefit of the implementation of wall plates with control portions is that a single type of switch module could be implemented, and would be functional, without a control module. That is, if the basic switch module were implemented, and a conventional wall plate with no control module were used, a user could still use the basic switch module, which may only have on/off functionality. While the contact elements would not be used, a user could later add functionality of the basic switch module by using a wall plate that has a control module. Such an arrangement could also work with an outlet, where timing or dimmer functionality could be provided for one or more of the receptacles of the outlet. Control modules could also be implemented in wall plates having more than one opening, where different control modules can be implemented for switching modules associated with different openings of the wall plate.

In order to prevent any unauthorized use of a power adapter, such as a wireless power adapter, or to prevent the use of unauthorized control modules which may not operate safely with the switching module, one or more security features may be employed that would require that the control module and the switching module be paired. For example, it may be necessary to authenticate the control module by provide a security code from the control module to the switching module to ensure that the control module is authorized to operate with the switching module. For example, the security code could include a unique serial number and may be encrypted. The security code may also include a field that indicates the type of control module and provides information related to the functionality of the control module. A user may also be required to perform a certain operation when replacing the control module, such as implementing a reset procedure using reset buttons on one or both of the control module and the switching module. During a reset procedure, data may be downloaded from the control module to the switching module or vice versa to enable the switching module to function with the control module. The data may be operational data (i.e. data associated with features controlled by the switching module), or security or identification data (i.e. data indicating the identity of the control module or authorizing the use of the control module).

According to another implementation, a single controller can provide multimodal control of different control devices and different sets of control devices, such as the modular power adapters as described above or other timers or lighting control devices. The single controller could be for example a smart phone, a tablet computer or any other computer or device enabling a wireless connection to multiple control modules by way of different wireless protocols. For example, the controller could communicate with a first set of control devices by way of a first wireless connection and a second set of control devices by way of a second set of connections. The controller could communicate with any number of groups of devices on corresponding sets of communication protocols.

By way of example, a first set of devices could communicate with a control device by way of a Bluetooth connection, where the devices could be implemented in a Bluetooth mesh network. The devices of a first set could be implemented in different locations, such as an indoor device, an outdoor device, a device controlling a specific device, such as a water heater or an under-cabinet lighting fixture. A second set of devices could include devices that are controlled by the controller using another local area network, such as a WiFi network. The second set of appliances controlled by the devices could include the types of devices that a user may desire to access from a remote location, such as a curling iron, a coffee machine, a particular lamp or a wireless-controlled door lock. That is, these devices may be devices that a user may wish to check to make sure that they have been turned off, or the types of devices that a user may wish to turn on while they are away. A third set of devices could be other specialty devices such as pool controls or specialty lighting. These devices could be controlled by an appropriate wireless connection. The controller could also control devices by way of a proprietary network, such as connection using a Z-Wave or a ZigBee controller. That is, the system could be integrated with an existing system employed by the user, such as a Z-Wave or ZigBee system for example.

One beneficial aspect of the system is that a single controller can control a plurality of devices using a plurality of different connections implementing different wireless communication protocols. By implementing a variety of different communication protocols, it is possible to implement the different devices with the most suitable communication protocol from a single controller. For example, while a WiFi enables remote access, it may also be more susceptible to hacking or other security issues. However, a Bluetooth connection, because of its short-range nature, may have fewer hacking or security issues, but is generally not remotely accessible.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Turning first to FIG. 1, a block diagram of a modular power adapter is shown. In particular, a modular power adapter 100 comprises a switching module 102 for controlling the application of power to a load (such as a light, appliance, or other device receiving power by way of an outlet, also known as a receptacle, or other contact elements applying power of the switching module) and a control module 104 that is in communication with the switching module. The switching module 102 is coupled to receive a power input signal, which may be power from an outlet to which the modular power adapter is plugged in or power from wiring in a residential or commercial building in which the modular power adapter is implemented for example. The output power is provided to an output such as an outlet into which a plug of an appliance or other device can be plugged or wires that are coupled to a device such as a light fixture for example. A light, appliance or other device receiving output power from the output is commonly called a load. The control module 104 may receive one or more of user interface input signals and wireless signals, as will be described in more detail below. While the modular power adapter 100 is shown as having two modules, it should be understood that the modular power adapter could contain more modules, where one of the switching module and the control module could be divided in sub-modules. For example, the control module could include a control portion and a wireless communication portion. That is, the control portion may include user interface elements, such as buttons or a display, and may be adapted to receive an optional wireless communication module.

Turning now to FIG. 2, another block diagram of a modular power adapter is shown. The block diagram of FIG. 2 shows elements of a modular power adapter, such as the modular power adapter of FIG. 1 for example. As shown in FIG. 2, a control circuit 202 is coupled to various elements of the switching module 102 to enable communication with the control module 104 and control the operation of the switching module. A transformer 204 is coupled to an input port 206 to receive an input voltage that enables providing power to a load by way of an output of the switching module. The input port comprises contact elements that could be for example wires or connector screws that are wired into a junction box or could be prongs of a plug adapted to be inserted into electrical outlet in a wall of a residential or commercial building. The transformer 204 provides power to the control circuit 202 by way of a power line 207. The control circuit also receives a ground potential at a ground terminal 208, which may be another contact element such as a ground wire or ground contact, or a ground prong of a plug of the switching module for example. The control circuit 202 may also receive power by way of a backup battery 209 to retain any information such as operational information or timing patterns. A different source of backup power could be implemented, such as a capacitor for example.

An input portion 210 may be implemented to enable the input of information or the selection of timing patterns (in an implementation having user interface elements on the switching module such as the implementation of FIG. 14 for example), and may include a control button or pairing button for enabling the pairing of the switching module and the control module as will be described in more detail in reference to FIG. 4. A memory 212 is coupled to the control circuit and may store operational information and timing patterns. An oscillator 213 may be coupled to the control circuit to enable the control circuit to maintain a current time. A switch 220 is coupled to receive power from the transformer by way of a power line 222 and provide power to an output 223 (which may be another contact element that is coupled to a load such as by a wire) in response to control signals associated with a timing pattern on a line 224 from the control circuit. The output 223 may be an outlet that receives a plug for the device controlled by the modular power adapter (or wires or screws that can be coupled to wires in the case of an in-wall power adaptor that are coupled to a device (i.e. load) that is powered by the power adapter).

A wireless communication circuit 226 could be used to receive various information, such as operational information, programming data, or firmware updates from the control module 104 or some other source, as will be described in more detail below. It should be noted that the input portion of the modular power adapter may also include the connector for receiving the portable memory device such as a USB thumb drive or an SD memory to download any type of data, such as operational information, programming data, or firmware as will be described in more detail below.

The switching module 102 and the control module 104 may communicate by way of a communication port 227, which may be a connector or a plurality of contact elements, as will be described in more detail in reference to FIG. 4. The communication port 227 enables a communication link 228 with a communication port 229, which may also be a connector or a plurality of contact elements. The communication link may comprise contact elements of the communication ports 227 and 229 to enable the transfer of communication signals between the communication ports. The communication link may also provide power to power elements of the control module. According to some implementations, the communication link 228 may be a wireless communication link, where the communication ports comprise wireless communication circuits.

The control module 104 comprises a control circuit 232, which may be any type of processing circuit for (i) receiving inputs, such as by way of an input portion 234, and (ii) controlling the operation of the control module 104. The input portion could be implemented as shown and described in reference to FIGS. 9-13 for example. A battery 236 or some other source of energy such as a capacitor may be used to power the control module 104 or function as a backup power source if the control module 104 receives power by way of the communication port 229, rather than by way of a power source internal to the control module 104. A wireless communication circuit 248, which may be a wireless receiver or both a wireless transmitter and receiver (i.e. a wireless transceiver), comprises an antenna 250. Data received by the wireless communication circuit 248 may be provided to the control circuit 232, or data generated by the control circuit 232 may be transmitted by the wireless communication circuit 248. Data, such as a timing pattern or operational information entered by the input portion or received by way of the wireless communication circuit 248, may be stored in a memory 242. The wireless communication circuit 248 may be any type of receiver for receiving wireless communication signals, such as GPS receiver, a cellular receiver, a radio frequency (RF) receiver, or any type of receiver adapted to receive operational information, programming data or any other type of information such as software updates. The operational information may be provided to the control circuit to enable the operation of the control circuit and the implementation of the timing patterns on the remote switching device. The wireless communication circuit could be a global positioning system (GPS) receiver, a cellular receiver for a cellular telephone network, or a receiver for some other wireless network. A GPS receiver is commonly available from SiRF Technology, Inc, for example, while a cellular receiver could be implemented in an integrated circuit chip or module, such as a chip or module available from u-blox Holding AG of Thalwil, Switzerland. Therefore, actuators for entering time, date and location information in the various implementations of programming interfaces could be eliminated with the use of a wireless communication circuit 248, which may be a receiver or a transceiver having both a receiver and a transmitter. While the wireless communication circuit 248 for receiving communication signals from a remote network such as a GPS network or a cellular network is shown as a part of the control module 104, the wireless communication circuit 248 could be implemented as a part of the switching module 102. An oscillator 244 or some other device for keeping a time for the device may be coupled to the control circuit, where a current time or other data may be displayed on a display 246. While separate oscillators are shown in the switching module 102 and the control module 104, it should be understood that a single oscillator could be implemented, and an oscillating signal or other signal based upon the oscillating signal could be shared between the switching module 102 and the control module 104.

The control circuit 104 may also comprise a wireless communication circuit 252 having an antenna 254 enabling the communication of signals with a corresponding wireless communication circuit 226 (having an antenna 260) of the switching module by way of a wireless communication link 256. An example of a wireless communication circuit that could be implemented for wireless communication circuits 226 and 252 is shown by way of example in FIG. 3. While both a physical connection for transferring signals and/or power is provided by way of the communication link 228 and a wireless communication link 256 is provided by way of the corresponding wireless communication circuits 226 and 252, it should be understood that one or both of the communication links could be implemented. A test circuit 260 coupled to the communication port 227 and the control circuit 202, as will be described in more detail below in reference to FIGS. 49-53.

Figure 3:
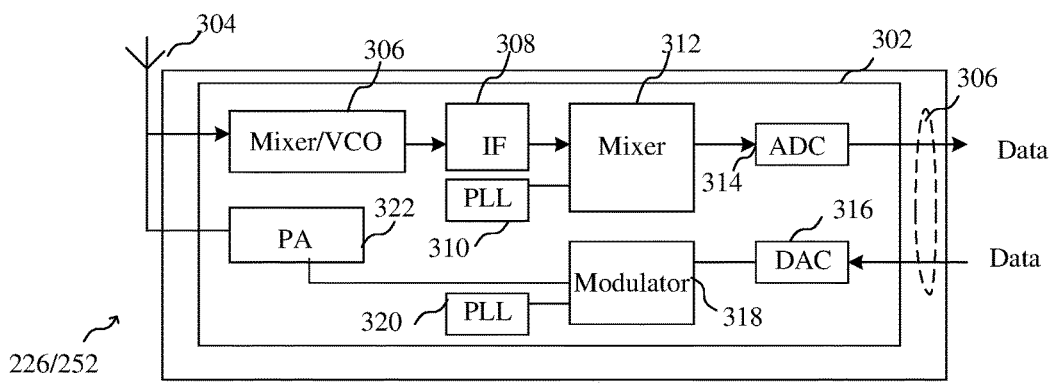
FIG. 3 is a block diagram of a wireless communication module of the modular power adapter of FIG. 2.
Figure 4:
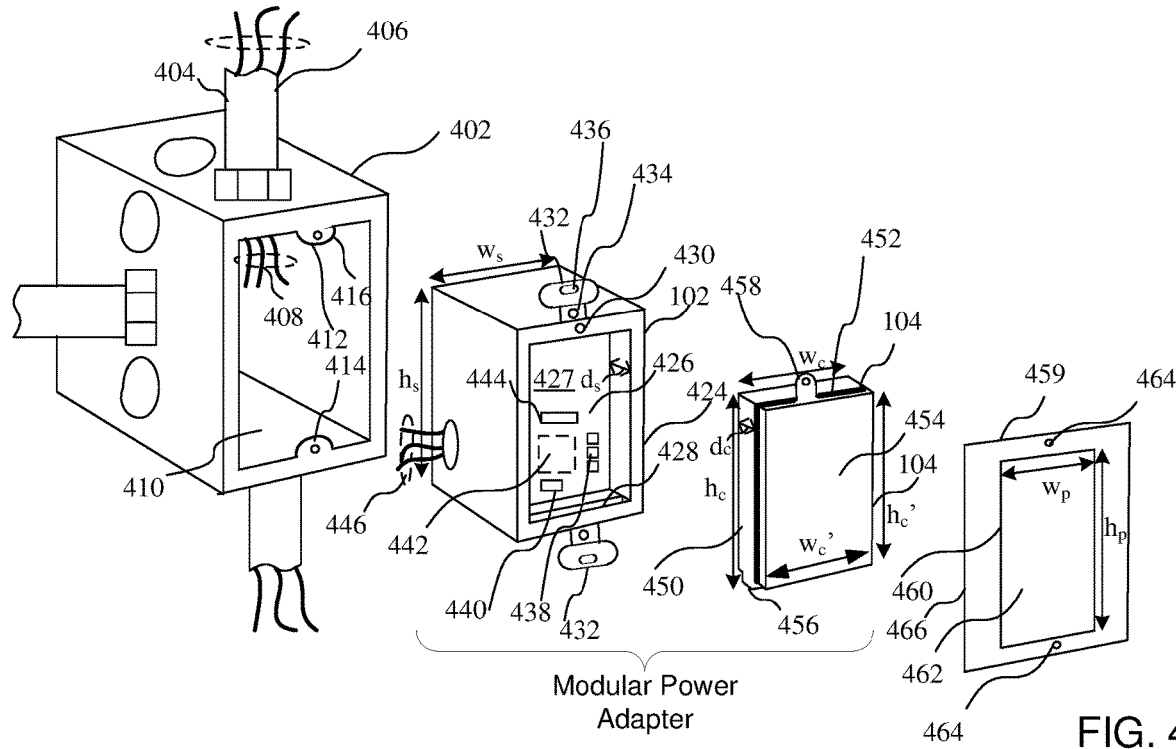
FIG. 4 is a block diagram of an expanded view of elements of an in-wall modular power adapter that is adapted to be installed in a junction box and to receive a wall plate.

Turning now to FIG. 3, a block diagram of a wireless communication module of the modular power adapter of FIG. 2 is shown. In particular, the antenna 304 receives wireless communication signals according to a predetermined wireless communication protocol. The data, which may include programming data and operational information, may be sent from the control module to the switching module. According to other implementations, data may be sent from the switching module to the control module. For example, power usage data associated with a device controlled by the switching module may be transferred to the control module. Other data, such as pairing commands and information, status information, or other information, may be received from a remote server as will be described in more detail in reference to FIG. 21. The received data is coupled to a combined mixer/voltage controlled oscillator 306, the output of which is coupled to an intermediate frequency (IF) circuit 308. Based upon outputs of the IF circuit and a phase locked loop (PLL) 310, a mixer 312 generates the received data. An analog-to-digital converter (ADC) 314 then generates digital data representing the data received by one of the control module or the switching module.

A control circuit of the switching module 102 or the control module 104 may also provide data for transmission to the other of the switching module 102 or control module 104. Data to be transmitted from the wireless communication circuit is coupled to a digital-to-analog converter (DAC) 316, the output of which is coupled to a modulator 318 which is also coupled to a PLL 320. A power amplifier 322 receives the output of the modulator to drive the antenna 304 and transmit the data. According to one embodiment, the data transceiver of FIG. 3 could implement the IEEE Specification 802.11 (WiFi) wireless communication standard, any Bluetooth standard, an infrared protocol, a Near Field Communication (NFC) standard, or any other wireless data protocol. While the circuit of FIG. 3 is provided by way of example, other wireless data transceivers could be employed according to the present invention to implement the desired wireless communication standard.

Turning now to FIG. 4, a block diagram of an expanded view of elements of an in-wall modular power adapter that is adapted to be installed in a junction box and to receive a wall plate is shown. According to the implementation of FIG. 4, a junction box 402 is coupled to conduit 404 having wires 406 that may be used to provide power to the modular power adapter by way of a terminal portion 408 of the wires that extend into a recess 410 adapted to receive the modular power adapter. Flanges 412 and 414 receive a screw or other attachment element by way of a threaded portion 416 to enable attaching corresponding flanges of the modular power adapter to the flanges 412 and 414.

The switching module 102 comprises a front surface 424 that defines a recessed portion 426 extending from the front surface to a back wall 427. The switching module 102 may also comprise a flange recess 428 at the bottom of the recessed portion behind the front surface 424. As will be described in more detail below, the flange recess 428 is adapted to receive a corresponding flange of a control module 104. The switching portion may also comprise an attachment element 430 adapted to be coupled to a corresponding attachment element of the control module. The switching module may also comprise flanges 432 having a threaded portion 434 for receiving a screw to secure a wall plate to the modular power adapter and a hole 436 for receiving a screw that can be inserted into the threaded portion 416 and can be used to secure the switching module 102 to the junction box 402.

User interface elements and other elements enable a user to implement the switching module with a control module within the recess 426, such as a back wall of the recess for example (or on another surface accessible by a user in an implementation not having a recess). For example, a communication port 438, which may comprise a connector or a plurality of contact elements for example, may be implemented. The contact elements may be contact pads adapted to be in electrical contact with contact elements of the control module, where the contact elements may be spring loaded contacts such as pogo-pins, or other flexible or spring loaded contacts that extend from a back surface of the control module and align with and make electrical contact with the contact pads of the switching module. Alternatively, contact pads can be implemented on the control module and the corresponding contacts can be implemented on the back of the recess of the switching module. While the contact elements are indicated as being on the back surface of the switching module and the control module, it should be understood that the contacts can be placed on other surfaces, such as a side of the switching module and a side of the control module.

The switching module may also comprise a control button 440, which may function as a reset button or a pairing button for enabling the pairing of the control module with the switching module. The control button may be used to reset the switching module, enabling the switching module to receive new data associated with a control module, and therefore to enable the switching module and the control module to communicate and control a device receiving power from the switching module. The control button 440 could also enable a pairing function to pair an authorized control module to communicate with the switching module. That is, a pairing function can be implemented, wherein a control button on each of the switching module and the control module can be selected to enable the transfer of information between the control module and the switching module. It may be necessary to charge the control module by coupling the control module to the switching module to enable the control module to perform a reset operation of the control switch and to enable a pairing of the control module with the switching module.

The pairing operation is beneficial to ensure that only an authorized control module is implemented to prevent for example unauthorized control of a control module which may have a wireless control feature. For example, the control of the device receiving power from the switching module may be compromised, and unauthorized use of a device under the control of the switching module may occur. Further, the switching module and the control module may communicate to enable the proper operation of a load controlled by the switching module. For example, a control circuit of the switching module may detect the type of device controlled by the switching module, such as the type of light bulb (e.g. halogen, LED, or CFL), or the number of watts that the bulb or other device draws, and therefore enables the control circuit of the control module to provide different control signals to the switching module to control the amount of power applied to the light bulb (such as a dimmable light bulb). That is, in addition to an implementation where the switching module acts as a passive device, and only receives control signals from a control circuit of the control device, the switching module and the control module could implement a bidirectional communication link according to another implementation to enable the control module to understand information received by the switching module and better control the device controlled by the switching module. Alternatively, the control module can detect the type or qualities of the light bulb by way of the communication ports of the switching module and the control module.

A wireless communication module 442 (shown in dashed to indicate that it may be behind the back wall 427 of the recess) may also be implemented in the switching module. The wireless communication module 442 could be for example the wireless communication module 226 of FIG. 2 for example. A memory port 444, which may be a USB port or a port for receiving another type of memory card, such as an SD card, may be implemented on the switching module, and may receive any type of information, such as operational information, timing patterns for turning the device controlled by the power adaptor on or off, or other data that is beneficial in implementing the operation of the control module. A timing pattern may include for example on and off times for a timing feature of the modular power adapter. While the USB port is shown on the switching module, it should be understood that a USB port could instead be implemented on the control module, or implemented on the control module in addition to a USB port on the switching module. Wires 446 for receiving ground and power signals providing current to a load also extend from the switching module. While wires are shown, contact elements adapted to receive wires in a junction box such as a screw for securing a wire to the switching module, could also be implemented.

The control module 104 may comprise a rear portion 450 that is inserted into the recess 426 and a flange 452 that abuts the front surface 424. A front surface of the flange 452 provides a surface to abut a perimeter edge 460 of an opening 462 of a wall plate 459, enabling a control interface 454, which may be a user interface according to the implementations of FIGS. 9-13, to extend through an opening 462 of the wall plate. The control module 104 also comprises a flange 456 according to the implementation of FIG. 4, enabling the control module to be attached to the switching module using a "ski-boot" arrangement, where the flange is inserted into the corresponding flange recess 428 and an attachment element 458 is attached to the attachment element 430. The communication port of the control module aligns with the communication port of the switching module to enable the communication of at least one of control signals and power between the switching module and the control module. The wall plate 459 can be attached to the switching device using holes 464, where the holes receive screws that can be inserted into threaded portions 434 of the flanges 432.

The dimensions of the various elements of modular power adapter are selected to enable the modular power adapter to be attached to a junction box, such as a conventional residential junction box. Therefore, the width $w_s$ of the switching module may be selected to be less than the width of a conventional residential junction box, and the height $h_s$ may be selected to be less than the height of a conventional residential junction box. A depth $d_s$ of the recess 426 is also selected to ensure that, when the control module is attached to the switching module, the contact elements of the communication ports provide an adequate electrical connection to enable the transfer of data signals and/or power signals. That is, when the flange 452 of the control module abuts the front surface 424 of the switching module, the contact elements of the communication ports ensure that adequate pressure between contacts and contact pads will enable an electrical connection. Also, the dimensions of back portion 450 of the control module has a width $w_c$ and a height $h_c$ that are just slightly less that the width $w_s$ and the height $h_s$ to ensure that the control module fits into and aligns with the switching module. The dimensions of a front portion 454 are also selected to extend through opening 462 in a wall plate, and ensure that the edges of the opening of the wall plate abut the flange 452 of the control module. A flange 456 of the control module is adapted to be inserted into the flange recess 428 of the switching module. The connector element 458 is adapted to be secured to a corresponding connector element 430 of the switching module 102. The edges 460 define opening 462. Because the height $h_p$ and the width $w_p$ of the opening 462 are slightly greater that the height $h_c$, and the width $w_c'$ of the front portion 454, the front portion 454 can extend through the opening 462, where the edges 460 of the recess 462 will abut the flange 452. Outer edges 459 and 460 of the wall plate extend beyond the perimeter of the junction box to cover the junction box.

Figure 5:
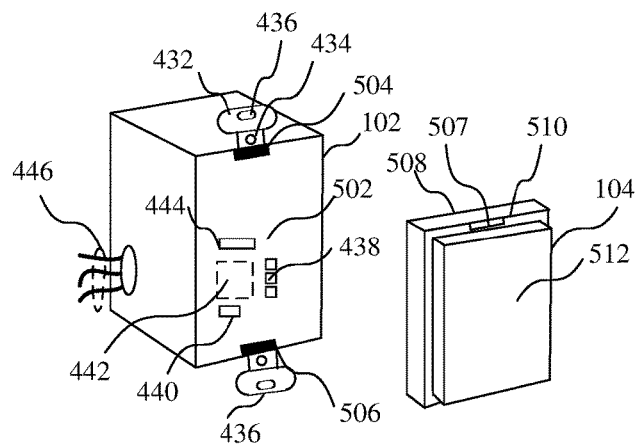
FIG. 5 is a block diagram of another in-wall modular power adapter.

Turning now to FIG. 5, a block diagram of another in-wall modular power adapter is shown. According to the implementation of FIG. 5, the control module is attached to the switching module such that some sides of the two modules may be generally aligned, where a front portion of the control module is adapted to fit through the recess of the wall plate and a back portion of the control module acts as a flange that abuts the edges of the opening of the wall plate. More particularly, the switching module of FIG. 5 generally comprises a planar front surface that abuts a corresponding planar back surface of the control module. Elements may protrude from a planar surface of the switching module or the control module, or may be recessed within a planar surface, such as a connector protruding from or being recessed in a planar surface. By way of example, the connector element 438 or the memory port 444 may protrude from or be recessed in the planar surface 502, while the control button 440 may be flush with the planar surface 502. Attachment elements 504 and 506 may be adapted to couple with corresponding connector elements 507, which may be located at the top and bottom of the control module for example. The sides of a back portion 508 of the control module may align with sides of the switching module, where a surface 510 adjacent to a front portion 512 acts as a flange for the wall plate. According to one implementation, the attachment elements 504 and 506 can be integrated in the planar surface 502 or can be integrated in the flanges 432.

Figure 6:
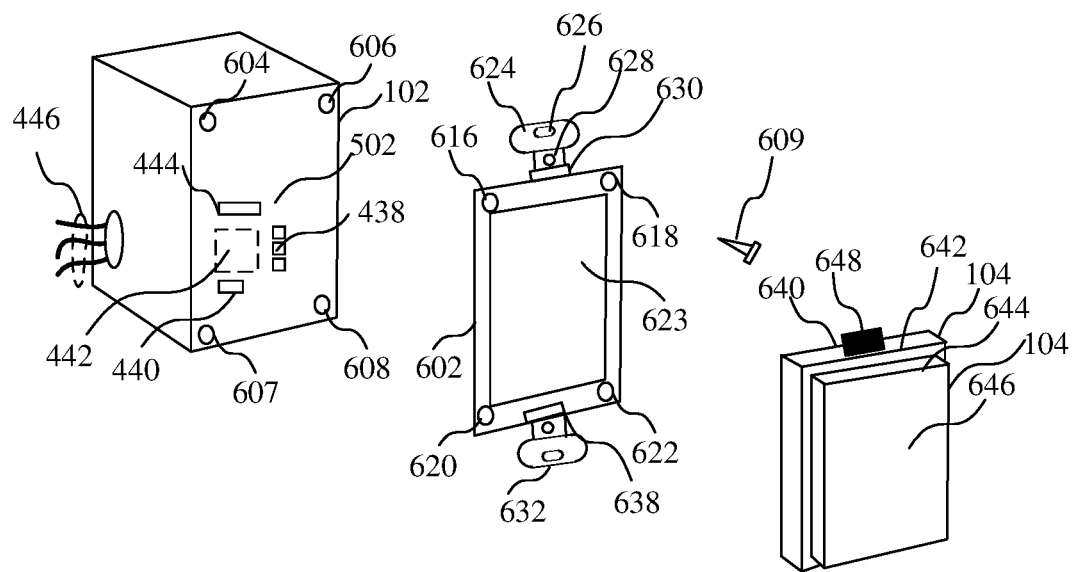
FIG. 6 is a block diagram of another in-wall modular power adapter having a metal plate comprising flanges for attaching the in-wall modular power adapter to a junction box.

Turning now to FIG. 6, a block diagram of another in-wall modular power adapter having a metal plate comprising flanges for attaching the in-wall modular power adapter to a junction box is shown. According to the implementation of FIG. 6, a plate 602, which may be a metal plate for example, can be attached to the switching module 102 and comprises connector elements to allow the control module 104 to be attached to the plate, and therefore interface with the switching module. By way of example, the switching module may comprise threaded portions 604-608 adapted to receive screws that would extend through corresponding holes 616-622 to enable the plate to be attached to the switching module. The plate also comprises an opening 623 enabling back portion of the control module to extend through the opening 623. The plate 602 also comprises flanges extending from the top and bottom to enable attaching the modular power adapter to a junction box. A first flange 624 comprises a hole 626 for receiving a screw to be screwed into a threaded portion of the junction box. The flange also comprises a receptacle 628, such as a threaded portion, for a screw to enable attaching a wall plate to the modular power adapter. The plate may also comprise an attachment element 630 adapted to receive a corresponding attachment element of the control module. A second flange 632 extending from the bottom of the plate comprises an attachment element 638. The control module comprises a back portion 640 extending to a flange 642 that defines a front portion 644. A front surface 646 may comprise a user interface that is accessible to a user. An attachment element 648 that is adapted to couple with attachment element 630 is provided on the control module, such as on the back portion of the control module as shown. An example of an attachment element comprising corresponding attachment elements of the switching module and the control module is shown and described in reference to FIG. 7.

Figure 7:
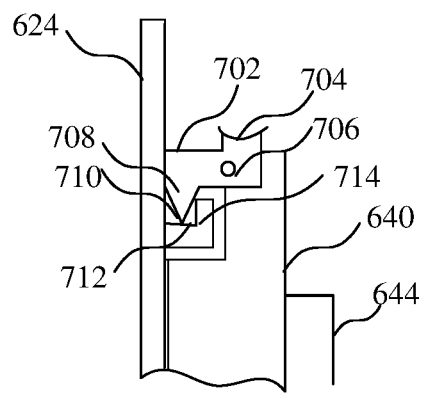
FIG. 7 is a block diagram of an exemplary attachment element enabling the attachment of a control module to a portion of the switching module.

Turning now to FIG. 7, a block diagram of an exemplary attachment element enabling the attachment of a control module to a portion of the switching module is shown. The rear portion 640 comprises a latching element 702 having a lever portion 704 and a pivot element 706 that enables a latching portion 708 having a beveled edge 710 to secure the control module to the flange 624. More particularly, the attachment element 630 of the flange 624 comprises a receiving element 712 and a flange 714 adapted to receive the beveled edge 710. While the attachment elements of the flange and control module of FIG. 7 provide one example of a means for attaching the control module to a portion of the switching module or flange, it should be understood that the control module could be attached to some other portion of the modular power adapter.

Figure 8:
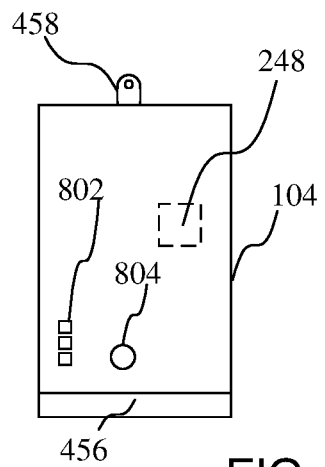
FIG. 8 is a plan view of the rear of a control module.

Turning now to FIG. 8, a plan view of the rear of a control module is shown. More particularly, contact elements 802 that may be coupled to or in electrical contact with the corresponding contact elements 438 of the switching module are shown on a back surface of the control module. A control button 804, which may be a pairing button for example, is also implemented. As described above in reference to FIGS. 4 and 5, the contact elements 802 may be contacts extending from the back surface, or contact pads that may be flush with the back surface or recessed.

Figure 9:
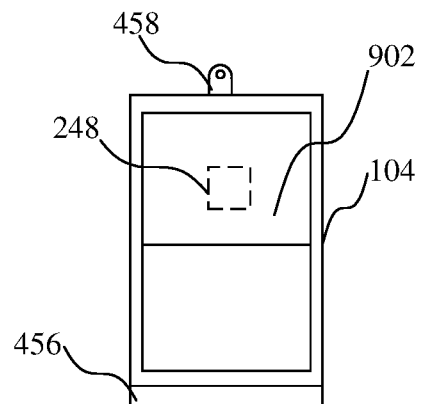
FIG. 9 is a plan view of the front of a control module having a paddle-type toggle switch.

Turning now to FIGS. 9-13, exemplary user interface portions of a control module are shown. While examples of user interfaces are provided, it should be understood that the user interfaces could include any type of user interface element enabling the operation or control of a power adapter, including the application of power to a device controlled by the power adaptor. Turning first to FIG. 9, a plan view of the front of a control module having a paddle-type toggle switch is shown. That is, a movable element 902 enables changing the state of a device controlled by the control module. The movable element 902 may be movable between a first position for an on state and a second position for an off state. That is, when in the on state, the top portion of the movable element may by flush with the wall plate. Similarly, in the off state, the bottom portion of the movable element may be flush with the wall plate. That is, a user could determine the state of the switch based upon a position of the paddle-type toggle switch. Alternatively, after a user selects either the top or the bottom of the paddle-type toggle switch, it would return to a normal resting position which does not indicate a state of the device, but rather where the switch is used for changing the state of the device.

The control module of FIG. 9 communicates a change of state of the switch by way of contact elements 802. For example, by depressing the top or bottom of the moveable element 902, a metal element of the control module may short two of the contracts of contacts elements 802, enabling the switching module to determine that a change of state is desired. Alternatively, depressing the top portion may provide a path to ground for a first contact of the contact elements 802, indicating that a user desires to turn the light on, while depressing the bottom portion may provide a path to ground for a second contact of the contact elements 802, indicating that a user desires to turn the light off. One or more wireless receivers 248 may be included in the switch of FIG. 9 to receive information, including operational information, timing patterns, or any other data that may be useful in implementing the timer. According, the switch of FIG. 9 can be a mechanical switch that enables generating an electrical signal at the contact elements 802, where the electrical signal is decoded by a control circuit of the switching module. That is, according to some embodiments, the control module generates an electrical signal that is detected by the switching module, rather than making a physical connection to engage an actuator of the switching module for example to change a state of the switching module. Alternatively, the control module may include a circuit such as a wireless receiver or other control circuit for providing signals to the switching module.

Figure 10:
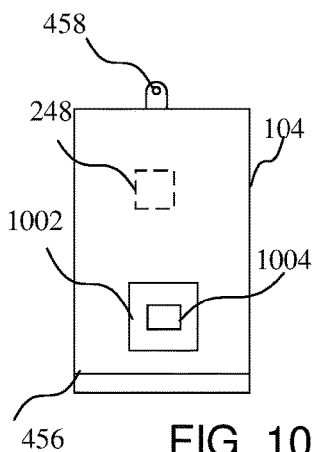
FIG. 10 is a plan view of the front of a control module having a push-button toggle switch.

Turning now to FIG. 10, a plan view of the front of a control module having a push-button toggle switch is shown. As shown in FIG. 10, the state of a device controlled by the switch can be changed by a button 1002, which may include a status indicator 1004, such as an LED for example. Alternatively, the button 1002 may be movable between a depressed state, where the switch will be pressed in when the switch is turned on, and a state where the button is flush with the front of the control module when the switch is turned off. In addition to indicating whether a light for example is on, the status indicator may also indicate whether a bulb is out; such as by flashing. The control module of FIG. 10 may also comprise a wireless receiver 248, as described above in FIG. 9. Further, the button may operate as an mechanical element an electrical signal at the contact elements 802, where the electrical signal is decoded by a control circuit of the switching module as described above in reference to FIG. 9.

Figure 11:
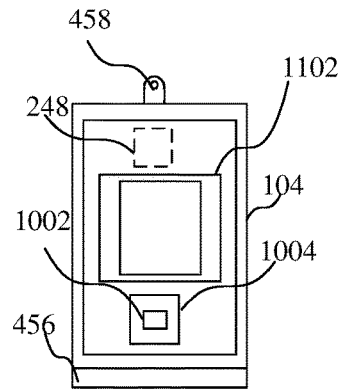
FIG. 11 is a plan view of the front of a control module having a push-button toggle switch and a sensor.

Turning now to FIG. 11, a plan view of the front of a control module having a push-button toggle switch and a sensor is shown. In addition to the switch 1002, a sensor 1102 can be implemented on the front portion of the control element. By way of example, a motion detector or an ambient light detector could be implemented on the front panel to automatically change the state of the switch based upon the detection of motion or the detection of a state of the light at the switch. It should be understood that the switch 1002 and the sensor 1102 could be implemented with timing functions of a programmable timer (i.e. a control circuit implementing a timing pattern for the power adapter).

Figure 12:
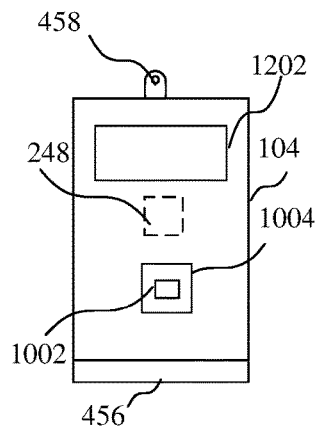
FIG. 12 is a plan view of the front of a control module having a push-button toggle switch and a display.

Turning now to FIG. 12, a plan view of the front of a control module having a push-button toggle switch and a display is shown. As shown in FIG. 12, a display 1202 may be implemented on the front surface of the control module. While a sensor is not shown in the implementation of FIG. 12, it should be understood that a sensor, such as the sensor of FIG. 12, could be implemented with the implementation of FIG. 12.

Figure 13:
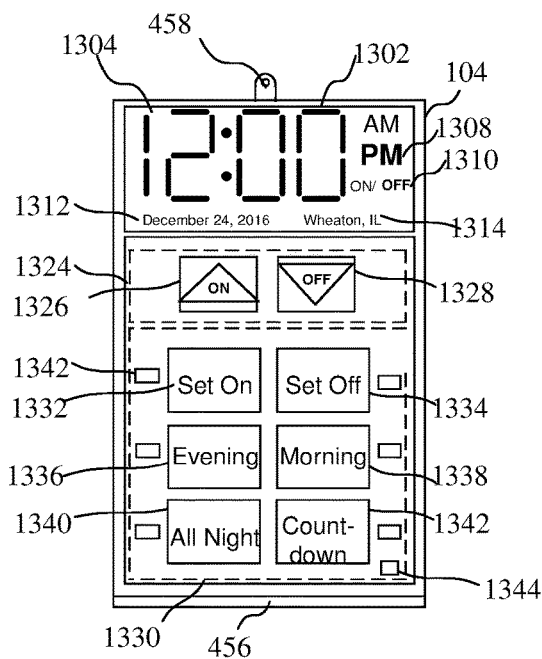
FIG. 13 is a plan view of the front of a control module having a plurality of pre-programmed or programmable buttons.

Turning now to FIG. 13, a plan view of the front of a control module having a plurality of pre-programmed or programmable buttons is shown. As shown in the implementation of FIG. 13, a plurality of buttons could be implemented on the front surface of the control module. The control module 104 may comprise a display 1302 having a time portion 1304, where the time portion of the display may indicate the current time or a time that is being programmed for example. The display may also include an AM/PM indicator 1308, and on/off indicator 1310, a date indicator 1312 and a location indicator 1314.

It should be noted that the control device could be programmed using a user interface, such as the user interface shown in FIG. 13. The user interface of the control device of FIG. 13 includes programmable buttons and pre-programmed buttons. More particularly, a programming portion 1324 of the user interface comprises a first programming button 1326, which could be used for cursoring up while programming or turning on a light or other device controlled by the control module 104 (when not in a programming mode), and a second programming button 1328, which could be used for cursoring down during a programming operation or turning off the light or other device controlled by the control device (when not in a programming mode). While the first programming button 1326 and the second programming button 1328 are shown as multifunction buttons for programming and controlling the device, it should be understood that one or more buttons having on and off functionality could be implemented separate from the first and second programming buttons.

A timer control portion 1330 comprises a first programmable button 1332, which may be programmed with an on time for a timing pattern, and a second programmable button 1334, which may be programmed with an off time for the timing pattern. The on time associated with the first programmable button 1332 may be programmed using the first programming button 1326 and the second programming button 1328 to cursor up and cursor down to reach the correct time that a user desires to turn on a device controlled by the control module 104. Similarly, the off time associated with the second programmable button 1334 may be programmed using the first programming button 1326 and the second programming button 1328 to cursor up and cursor down to reach the correct time that a user desires to turn off a device controlled by the control module 104. While the first programming button 1326 and the second programming button 1328 are shown as having only an on time and an off time respectively, where the buttons may be used together (i.e. when one of the buttons is selected, both will be selected), each of the first programming button 1326 and the second programming button 1328 could be programmable to have both an on time and an off time.

The pre-programmed buttons comprise buttons, that when selected, will implement switching data associated with a pre-programmed switching pattern. By way of example, an "Evening" button 1336 could be selected to turn on the lights between 6:00 PM and 11:00 PM or between dusk and 11:00 PM for example. A "Morning" button 1338 could have pre-programmed on and off times associated with hours that a user may desire to have lights on during the morning, such as between 5:00 AM and 8:00 AM for example. An "All Night" button 1340 could, when selected, turn on the lights at some time during the evening, such as a fixed time of 5:00 PM or a variable time such as dusk, and could turn the lights off at some time in the morning, such as 8:00 AM or a variable time such as dawn. A countdown function could also be implemented, where a device controlled by the timer may be on for predetermined intervals based upon the number of times the countdown button 1342 is selected. An indicator 1342, such as an LED, could be implemented to indicate when a certain pre-programmed button has been selected. The countdown function could also be accomplished using cursor buttons for scrolling up or down to select a countdown time.

A reset button, 1344, which may be a recessed button for example, enables resetting the timer to a default state. It should also be noted that while a pre-programmed button has a particular default setting for on and off times when a user acquires the timer, the pre-programmed buttons may be reprogrammed by a user to have different on and off times. For example, a user may decide that preferred times for an evening setting may be between 5:00 PM and midnight, where the user could reprogram the button to go on at 5:00 PM and off at midnight rather than 11:00 PM. Although different user interface features are shown by way of example, it should be understood that features of different embodiments can be combined to include a variety of different features.

Figure 14:
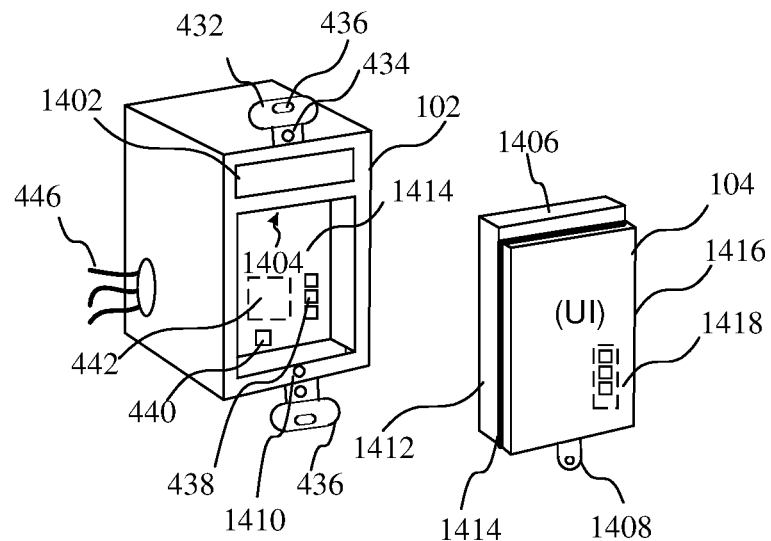
FIG. 14 is an expanded view of a modular power adapter having a display on a switching module.

Turning now to FIG. 14, an expanded view of a modular power adapter having a display on the switching module is shown. According to the implementation of FIG. 14, a display 1402 is provided on the switching module, where the control module comprises control circuits for controlling the operation of the switching module and any user interface elements that may be present on the front of the control module. A recess 1404 may be provided behind the front surface and below the display to receive a flange 1406, where an attachment element 1408 can be coupled to a corresponding attachment element 1410 on the switching module. That is, because of the location of the display, it may be beneficial to attach the control module at the bottom of the switching module. The rear portion 1412 will then be positioned within the recess 1414. The front portion 1416 is configured to extend through an opening in the wall plate. Contact elements 1418 on the back of the rear portion 1412, shown here in a dashed box, are positioned to make contact with corresponding contacts 438.

Figure 15:
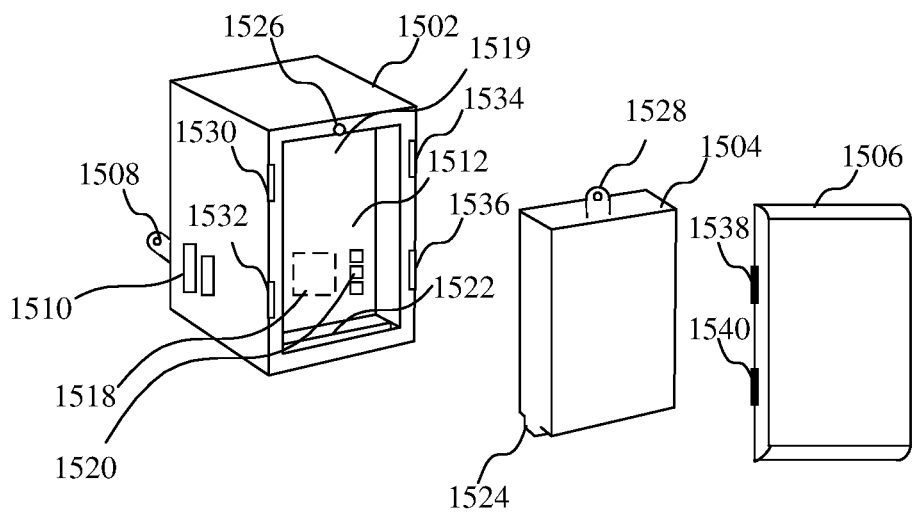
FIG. 15 is an expanded view of a plug-in type modular power adapter having a cover for a control module.

Turning now to FIG. 15, an expanded view of a plug-in type modular power adapter having a cover for a control module is shown. The plug-in type modular power adapter of FIG. 15 comprises a switching portion 1502 that is similar to the switching portion of an in-wall modular power adapter, except that the wires or contact screws that are used to wire the in-wall adapter are replaced with a plug and a receptacle by way of example. The power adapter of FIG. 15 also comprises a control portion 1504 that is adapted to attach to the switching module and a cover 1506 as shown that is adapted to cover the control portion 1504. The switching module comprises prongs 1508 of a plug to be inserted into a wall outlet, and a receptacle 1510 for receiving a plug of a device controlled by the power adapter.

A recessed portion 1512 is adapted to receive the control module 1504. A communication circuit 1518 may be located behind a rear wall 1519 of the recessed portion 1512, which may also comprise contacts 1520 that are adapted to align with corresponding contacts of the control module. A recess 1522 may be adapted to receive a corresponding flange 1524, where an attachment element 1526 is positioned to align with a corresponding attachment element 1528 of the control module. Attachment elements 1530, 1532, 1534, and 1536 are positioned to receive corresponding attachment elements on the cover 1506, where attachment elements 1538 and 1540 of the cover 1506 are adapted to align with and attach to attachment elements 1530 and 1532, respectively. The attachment elements on the cover 1506 may comprise flanges that are inserted into recesses of the attachment element of the switching module, where the sides of the cover can be squeezed toward the center to release the flanges and remove the cover.

Figure 16:
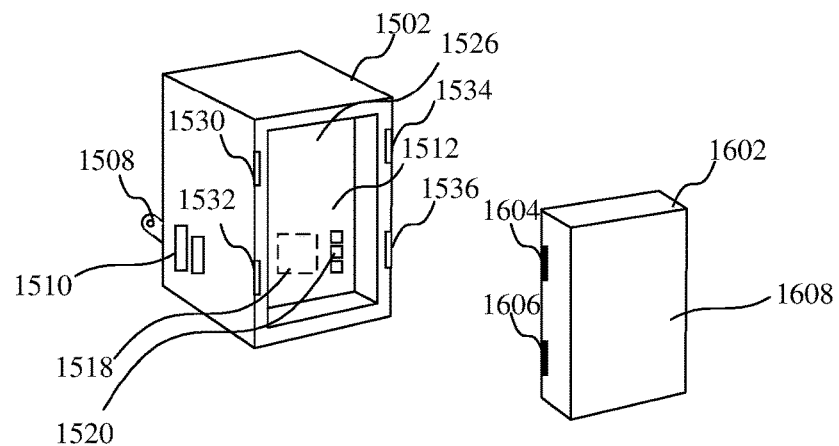
FIG. 16 is an expanded view of a plug-in type modular power adapter having a control module attached to a switching module.

Turning now to FIG. 16, an expanded view of a plug-in type modular power adapter having a control module attached to a switching module is shown. According to the implementation of FIG. 16, the control module 1602 also functions as the cover, where attachment elements 1604 and 1606 are adapted to be received by attachment elements 1530 and 1532. Attachment elements that are similar to attachment elements 1604 and 1606 are provided on the opposite side of the control module 1602 to attach to attachment elements 1534 and 1536. User interface elements may be implemented on the control module 1602, such as on a front surface 1608. The control module and user interface elements could be implemented as described above with respect to the in-wall power adaptor.

Figure 17:
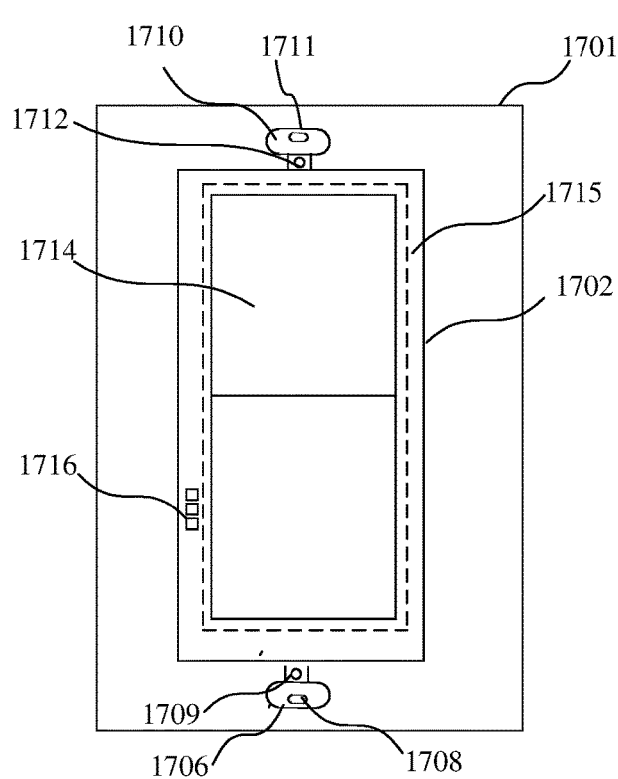
FIG. 17 is a plan view of a junction box having a switching module adapted to interface with a control module of a wall plate.

Turning now to FIGS. 17-20, various implementations of a modular power adapter for in-wall applications includes a wall plate having control circuitry, such as a control module. Turning first to 17, a plan view of a junction box 1701 having a switching module 1702 adapted to interface with a control module of a wall plate is shown. As shown in FIG. 17, a switching module 1702 comprises flanges for attaching the switching module to the junction box, such as a first flange 1706 having a recess 1708 for receiving a screw to attach the switching module to the junction box and a threaded portion 1709 for receiving a screw for attaching a wall plate to the switching module, and a second flange 1710 having a recess 1711 for receiving a screw to attach the switching module to the junction box and a threaded portion 1712 for receiving a screw for attaching a wall plate to the switching module. A switching element 1714, shown here as a paddle-type toggle switch, enables changing the state of the device controlled by the switching module 1702. As will be described in more detail in reference to FIGS. 18-20, an edge of an opening of a wall plate having control circuitry overlaps with a portion of the control module, and may extend up to an overlap region shown by the dashed line 1715. Contact elements 1716, which are shown beyond (i.e. outside of) the dashed line 1716, and therefore would be under the wall plate when the wall plate is attached to the switching module. The contact elements 1716 are positioned to align with corresponding contact elements of a control module of the wall plate, which will be described in reference to FIG. 18.

Figure 18:
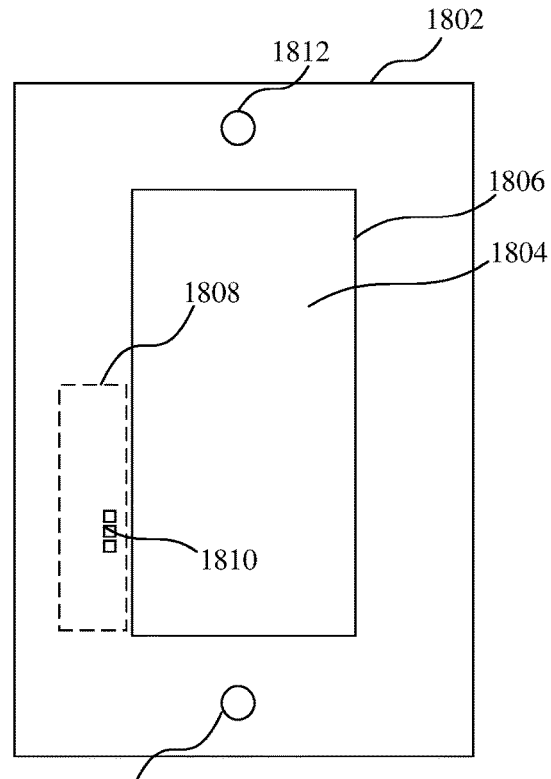
FIG. 18 is a front plan view of a wall plate having a control module.
Figure 19:
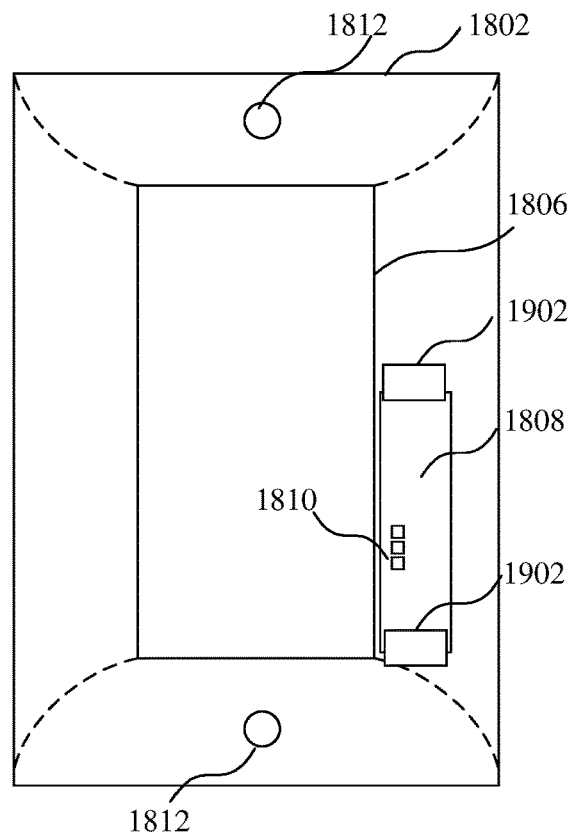
FIG. 19 is a rear plan view of the wall plate of FIG. 18.

Turning now to FIG. 18, a front plan view of a wall plate having a control module is shown. A wall plate 1802 comprises an opening 1804 that enables a switching element 1714 to extend through the wall plate, where an edge 1806 would extend to approximately the dashed line 1715 to cover the edges of the switching module. A control module 1808, shown in dashed lines to indicate that it is on a rear surface of the wall plate, includes contact elements 1810 to align with and electrically couple to corresponding contact elements 1716. Screw holes 1812 enable screws to be used to attach the wall plate to the switching module. As shown in FIG. 19, which provides a rear plan view of the wall plate of FIG. 18, attachment elements 1902 enable the control module 1808 to be removably attached to the wall plate. That is, the attachment elements 1902 would enable the control module 1808 to be switched out with a different control module to provide flexibility in the operation of the switching module. For example, a control module having a different wireless communication protocol could be attached to the wall plate, making it easy to change the functionality of the switching module without having to remove the switching module, which can costly and time consuming in the case of an in-wall power adapter.

Figure 20:
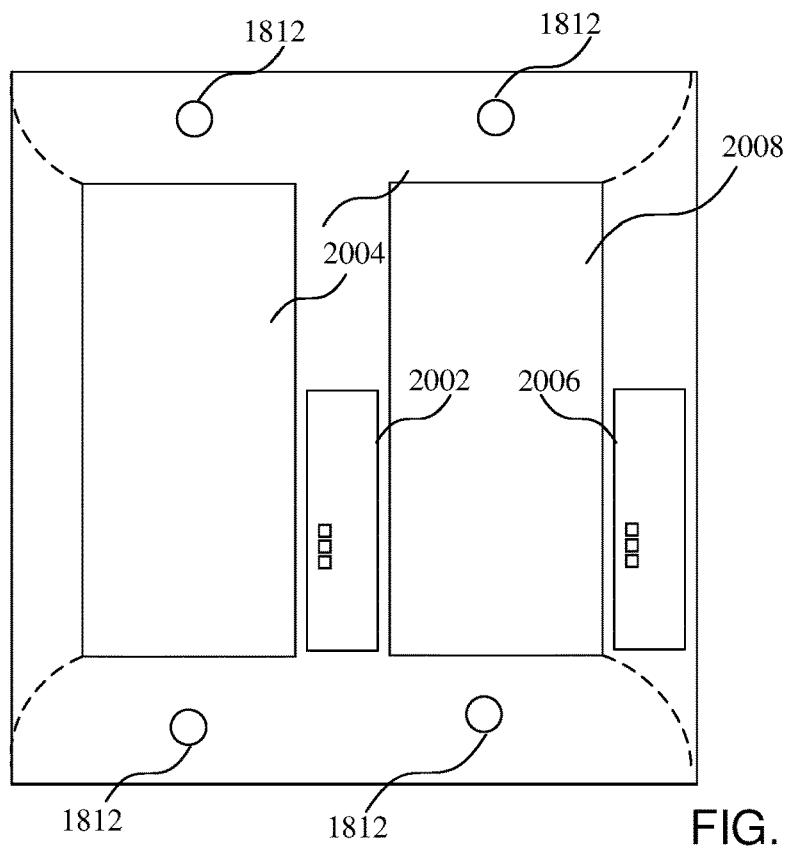
FIG. 20 is a rear plan view of a wall plate having two openings and two control modules.

Turning now to FIG. 20, a rear plan view of a wall plate having two openings and two control modules is shown. According to the implementation of FIG. 20, a first control module 2002 may be associated with a first opening 2004 of the dual-wall plate opening, while a second control module 2006 may be associated with a second opening 2008. While two openings are shown, it should be understood that any number of openings can be implemented.

Figure 21:
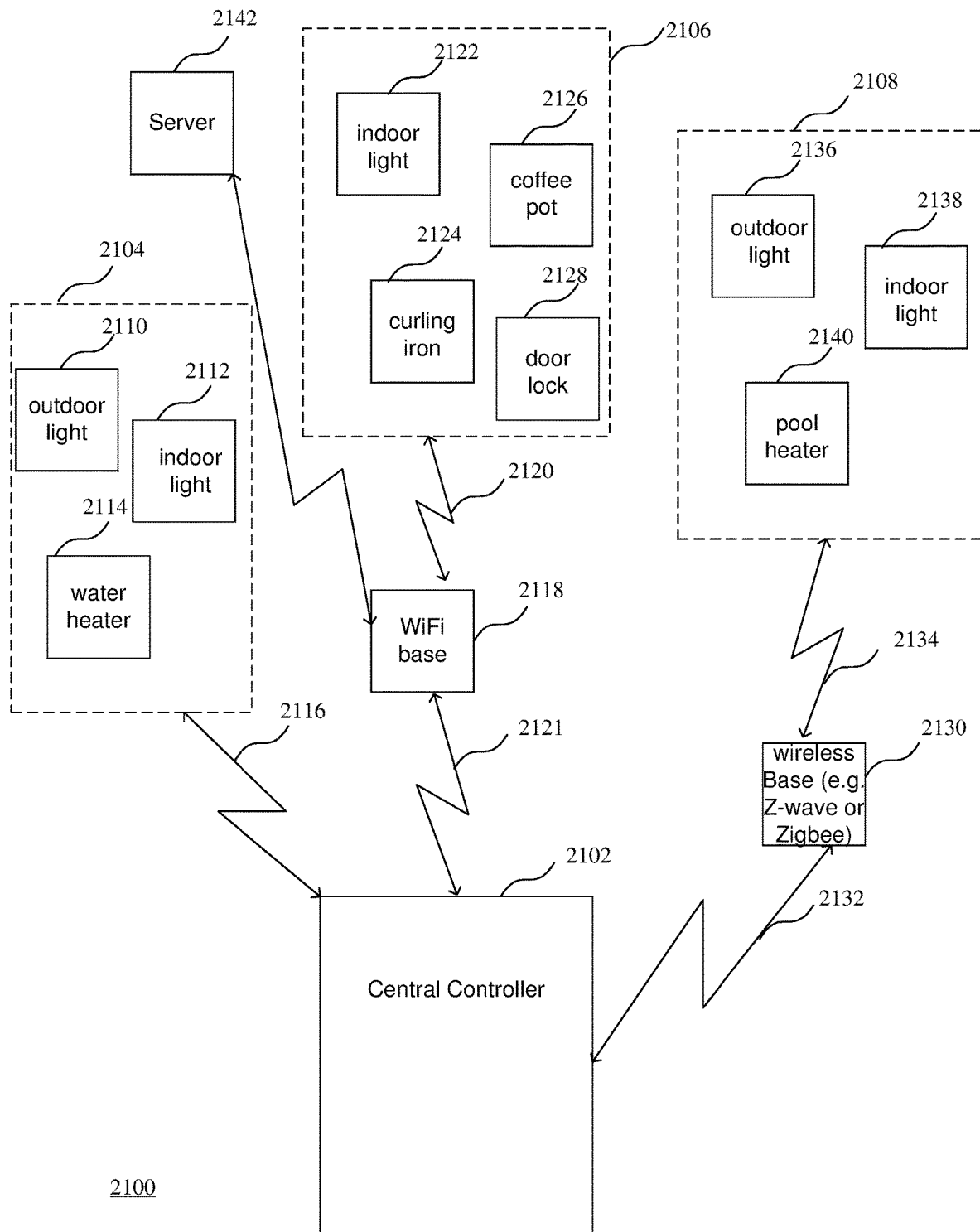
FIG. 21 is a block diagram of a system having a plurality of power adapters implementing different communication protocols.

Turning now to FIG. 21, a block diagram of a system 2100 having a plurality of power adapters implementing different communication protocols is shown. According to the implementation of FIG. 21, a single central controller 2102 can provide multimodal control of different control devices or different sets of control devices, such as the modular power adapters or other timers or lighting control devices. The control devices could be power adapters or other suitable control devices that could be coupled to control a device or integrated in the device to control the device. The single controller 2102 could be for example a smart phone, a tablet computer or any other computer or device enabling a wireless connection to multiple control modules by way of different wireless protocols. For example, the controller 2102 could communicate with a first set 2104 of control devices, a second set 2106 of control devices, and a third set of control devices 2108. The first set of control devices may include an outdoor light 2110, an indoor light 2112, and a water heater 2114 that are controlled by way of a first wireless connection 2116. As shown in FIG. 21, the central controller 2102 is directly in communication with devices of the first set of devices using a short range communication protocol. That is, there is no intervening control element, such as a base station or wireless hub, that receives control signals from the central controller and provides control signals to the control devices. By way of example, a first set of devices could communicate with central controller by way of a Bluetooth connection, where the devices could be implemented in a Bluetooth mesh network, or a near field communication (NFC) link. The short range communication protocol may be accessible at a distance of approximately 100 feet for example. The devices of a first set could be implemented in different locations, and could include for example an indoor device, an outdoor device, a device controlling a specific device, such as a water heater or an under-cabinet lighting fixture. The first set of control devices could be associated devices that a user does not wish to access remotely, or a device about which the user may have security concerns and may not want to have controlled by a lower security protocol, such as a IEEE 802.11 communication protocol, also known as WiFi. The first communication protocol may therefore be a local communication protocol, and more particularly a direct local communication protocol.

The second set 2106 of control devices may be controlled by way of a second connection, which may be for example a network. The second set of devices 2106 could include devices that are controlled by the controller using a local area network, including a base station or wireless hub that communicates with a plurality of devices. By way of example, the local area network (LAN) could be a WiFi network including a WiFi base 2118 enabling communication links 2120 and 2121. The local area network could also be accessible by a wide area network such as a cellular network to enable remote access to devices. The WiFi network could be any network implementing any IEEE 802.11 standard for example. The second set of appliances controlled by the devices could include the types of devices that a user may desire to access from a remote location, such as an indoor light 2122, a curling iron 2124, a coffee machine 2126, a particular lamp, or a wireless-controlled door lock 2128. That is, these devices may be devices that a user may wish to check to make sure that they have been turned off, or the types of devices that a user may wish to turn on while they are away.

The third set of devices 2108 could be controlled by another wireless base 2130 enabling communication links 2132 and 2134 to control other specialty devices such as pool controls or specialty lighting. According to the example of FIG. 21, an outdoor light 2136, and indoor light 2138, and a pool heater 2140 could be controlled by the wireless base 2130. The wireless base 2130 could be a Z-Wave or a ZigBee controller for example. Therefore, a short range communication link or a WiFi connection of system 2100 could be integrated with an existing system employed by the user, such as a Z-Wave or ZigBee system for example.

One beneficial aspect of the system is that a single controller can control a plurality of devices using a plurality of different connections implementing different wireless communication protocols and having different capabilities. The controller can also access a server 2142 by way of one of the elements of the system, such as the WiFi base 2118. The server may receive information from or provide information to the server 2142. For example, the server may receive information from the central controller related to the state or operation of various devices on the system 2100, or may provide information or data enabling the operation of the devices on the system 2100. For example, the information can be related to analysis of the devices implemented on the system, or could be information of interest to a user, such as news or weather, which could be displayed on a device of the system. By implementing a variety of different communication protocols, it is possible to implement the different devices with the most suitable communication protocol from a single controller. For example, while a WiFi enables remote access, it may also be more susceptible to hacking or other security issues. However, a Bluetooth or NFC connection, because of its short-range nature, may have fewer hacking or security issues, but is generally not remotely accessible.

Figure 22:
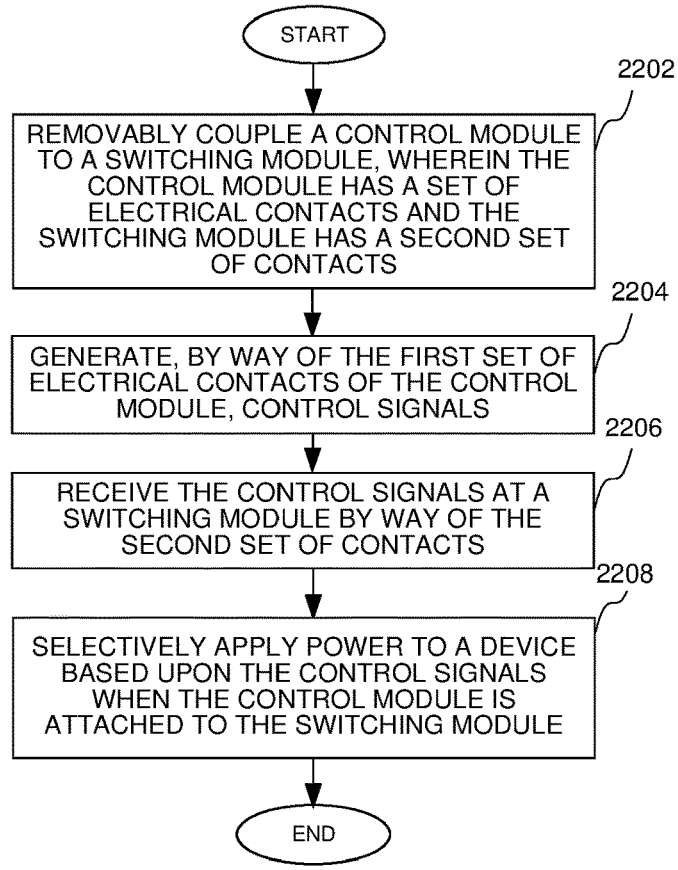
FIG. 22 is a flow chart showing a method of implementing a modular power adapter.

Turning now to FIG. 22, a flow chart shows a method of implementing a modular power adapter. A control module is removably coupled to a switching module at a block 2202, wherein the control module has a set of electrical contacts and the switching module has a corresponding second set of electrical contacts. Control signals are generated by way of the first set of electrical contacts of the control module at a block 2204. The control signals are received at a switching module by way of the second set of electrical contacts at a block 2206. Power is selectively applied to a device based upon the control signals when the control module is attached to the switching module at a block 2208.

The method may further comprise receiving electrical power at a plurality of contact elements, wherein the contact elements may comprise prongs adapted to be inserted into an electrical outlet. The power switch may further comprise a receptacle for receiving a plug of the device controlled by the power switch. The method may further comprise changing the state of the device controlled by the power adapter in response to a switching element for manually controlling the operation of the power switch. The method may also enable a manual programming of the power switch on a user interface, and displaying information on a display of the control module.

Figure 23:
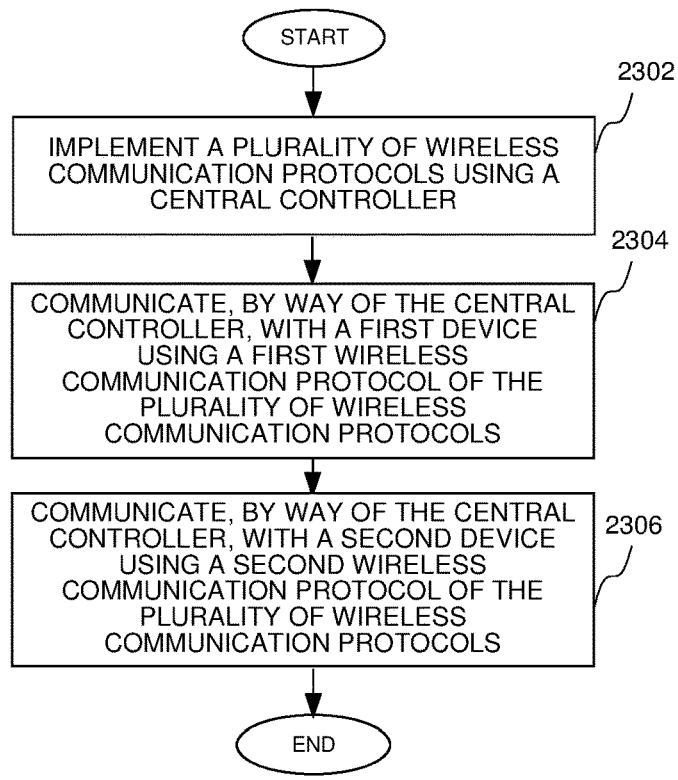
FIG. 23 is a flow chart showing a method of controlling power adapters using a plurality of different communication interfaces.

Turning now to FIG. 23, a flow chart shows a method of controlling power adapters using a plurality of different communication interfaces. A plurality of wireless communication protocols is implemented using a central controller at a block 2302. A first device communicates, by way of the central controller, using a first wireless communication protocol of the plurality of wireless communication protocols at a block 2304. A second device communicates, by way of the central controller, using a second wireless communication protocol of the plurality of wireless communication protocols at a clock 2306.

Turning now to FIGS. 24-26, a map showing latitude and longitude lines which could be used to divide a geographical region, shown here by way of example as the United States. It should be noted that the latitude and longitude lines are shown by way of example, and are not intended to necessarily show accurate latitude and longitude lines. Also, while 24 regions of the lower 48 states of the United States are created by latitude and longitude lines as shown, it should be understood that any number of regions could be created by greater or fewer latitude and longitude lines. The selected longitudinal and latitudinal lines need not be separated by the same number of degrees (e.g. 5 degrees) as shown in FIG. 24, but may be separated by different numbers of degrees. Also, the lines need not be continuous on the same horizontal or vertical. For example, the three vertical lines within the boundary of the lower 48 states could correspond to the time zone lines that create the 4 time zone regions, Pacific, Mountain, Central and Eastern. It should be noted that certain geographical regions within the United States apply different rules related to the changing of times during daylight savings and standard time. As a result, separate tables providing dusk and dawn data may be used for daylight savings time and standard time. It should be noted that the dusk and dawn data could be updated over time to account for changes in daylight savings time rules by reprogramming a control device or a remote switching device. The devices could be reprogrammed by downloading new data by way of a data port, such as a USB port as described above, or via cellular communication to a cellular receiver on the control device or a remote switching device.

As shown in FIG. 25, a table having combinations of latitude and longitude ranges is provided to enable a power switch to access an appropriate table having dusk and dawn times to be applied with implementing a timing pattern as described above. For a power switch having a GPS receiver or some other receiver that is capable of receiving location information, such as latitude and longitude values associated with the location of the power switch, the received latitude or longitude values are used to determine a region in which the power switch is located, and therefore enable selecting a table associated with the region for applying appropriate dusk and dawn times. An example of a table associated with a region will be described in more detail in reference to FIG. 26. While a reference to a table is provided by way of example, it should be understood that a reference to equations or other algorithms for calculating dusk and dawn times could be provided. That is, based upon time and date, a dawn and dusk time could be calculated for a given region.

As shown in FIG. 26, an example of a table having a plurality of date ranges and corresponding dusk and dawn times that would be applied for a timing pattern implemented by a power switch, such as any of the power switches described above, is shown. FIG. 26 shows an example of one table, where a separate table would be implemented for each region and would have dusk (DUSK1-DUSKN) and dawn (DAWN1-DAWNN) times associated with date ranges for that region. The dusk and dawn times could be based upon averages for the region, or could be weighted to be optimized for the most populous area of the region.

According to the example regions of FIG. 24, 24 tables could be stored in a memory of the device and would be available to be accessed by a device, such as a control device or a remote switching device, in any one of the 24 regions, where a power switch in region A2 would access Table A2 to implement dusk and dawn times in a timing pattern. According to the example table of FIG. 26, a plurality of date ranges extending from 1 to N, where N can be any number up to 365. That is, N could be selected to provide a date range for a predetermined number of days. For example, N could be 12, where dusk and dawn times would change 12 times during the year, such as on the first of every month. N could be selected to be 52, where dusk and dawn times would change 52 times a year, such as every Sunday. N could even be selected to be 365, where the dusk and dawn times would change every day. For the N date ranges, the number of dates of each date range need not have the same number of days. For example, there may be some periods of time of the year during which the dusk and dawn times change less rapidly. During those times, the date range could be longer. In contrast, at certain times such as during fall and spring, the dusk and dawn times may change at a greater rate each day or week. During these times, it may be beneficial to have fewer days associated with a date range.

Figure 27:
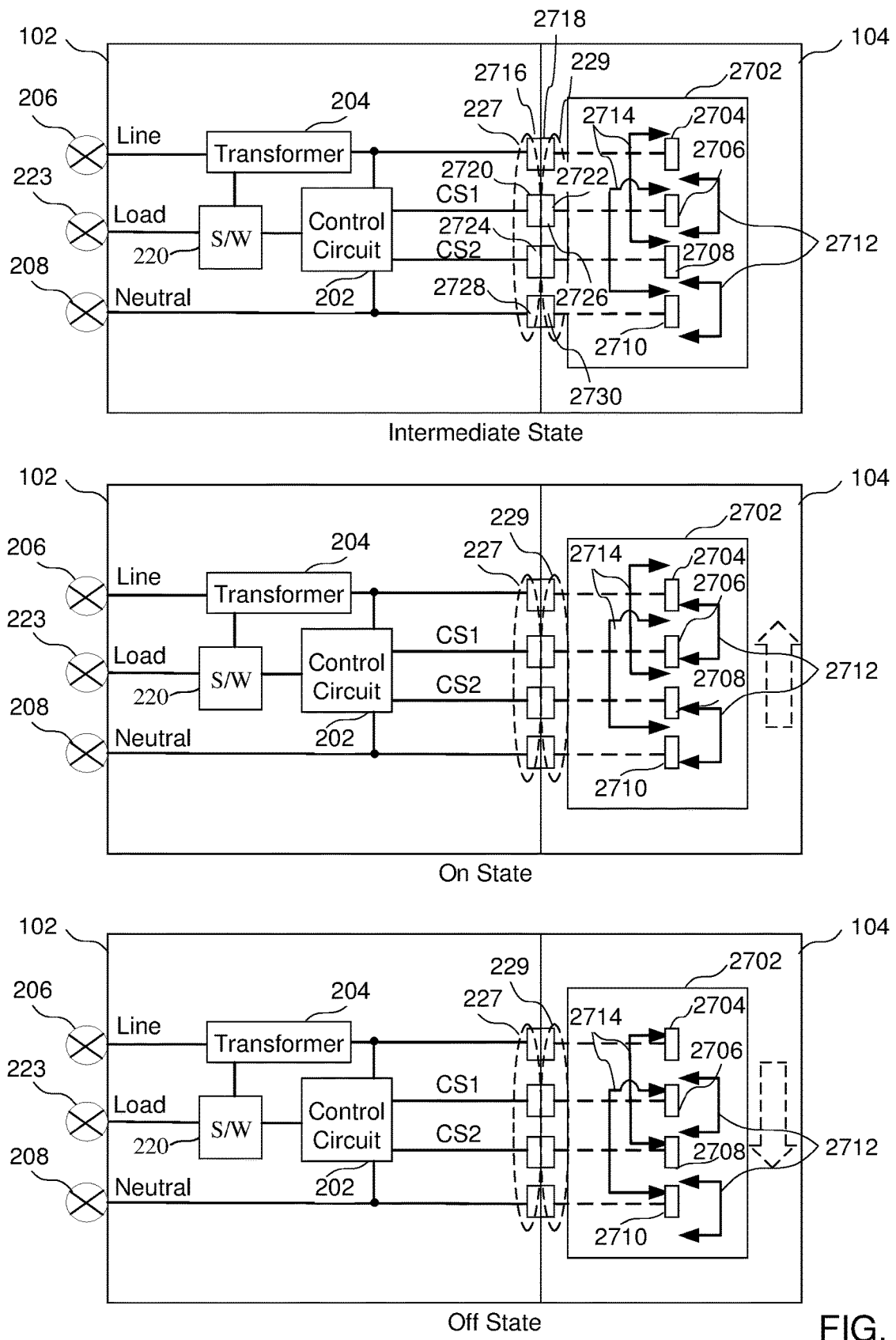
FIG. 27 is a diagram showing a switch of a module that is movable to provide a signal to a switching module to switch states.

Turning now to FIG. 27, a diagram shows a switch of a module that is movable to provide a control signal to a switching module to switch states. According to the exemplary embodiment of FIG. 27, different states of a mechanical switch can be used to generate an electrical signal that is decoded by a switching module, such as by a control circuit of a switching module for example. Therefore, a modular adapter can be provided at a low cost by providing a switching module that is not only adapted to receive a low-cost module (e.g. as a simple mechanical module for providing an electrical signal operating as a control signal to contact elements of the switching module), but that can also be upgraded to receive a module having greater functionality (e.g. wireless control) by simply switching out the modules.

As shown with the power adapter and module at the top of FIG. 27, an intermediate state (i.e. non-connected state) of a switch accessible on a module may exist before the switch is moved to generate a signal that is provided to the switching module. A switch 2702, which may be a toggle switch for example, may provide a predetermined voltage to a contact of the communication port 227, such as by shorting contacts of the communication port 227 for example. That is, the control module 104 comprises a plurality of contact elements 2704, 2706, 2708 and 2710 that are electrically connected to predetermined nodes of the switching module (where dashed lines are used to show that the interconnect elements between the contact elements of the switching module 102 and the control module 104 are behind the switch 2702). Contact elements of the communication port 227 are coupled to contact elements of the communication port 229, where a first contact element 2716 is coupled to a corresponding first contact element 2718, a second contact element 2720 is coupled to a corresponding second contact element 2722, a third contact element 2724 is coupled to a corresponding contact element 2726, and a fourth contact element 2728 is coupled to a corresponding contact element 2730 as shown. The contact elements 2716 and 2728 enable providing power and ground (i.e. neutral) reference voltages to the control module 104, where the power and ground reference voltages can be used to generate control signals for the control circuit 202 to control the switch 220. More particularly, the transformer 204 is coupled to the contact element 223 to receive the line voltage (which may be a high voltage of approximately 120 volts for example), and generates a low voltage (such as 5 volts or less for example) that is provided to the control module 104 to enable the control module 104 to operate. The electrical connection between contacts elements 2728 and 2730 also enable providing a reference voltage to the control module 104. As will be described in more detail below, by providing power and ground to the control module, a mechanical switch or a control module having a control circuit (e.g. including a wireless receiver) can provide control signals to the switching module 102.

The switch 2702 also includes contact elements that are moveable with the switch to couple different contact elements of the communication port 229 together to generate a control signal by pulling a contact element to a certain voltage. In the second configuration of the switch after the switch is moved up as shown by the dashed line arrow, contact element 2712 causes the contact element 2706 to be pulled high (e.g. 5 volts) by electrically connecting contact elements 2704 and 2706 together, and causes the contact element 2708 to be pulled low (approximately 0 volts of the neutral reference voltage) by electrically connecting contact elements 2708 and 2710 together. According a first control signal (CS1) and a second control signal (CS2) having high and low voltages respectively are coupled to the control circuit 202, where the control signals could be interpreted as an on signal to control the switch 220 to apply the line voltage the load (i.e. contact element 206). As shown in the bottom configuration when the switch 2702 Is moved downward to an off position as indicated by the downward dashed arrow, the contact element 2714 causes the contact element 2706 to be pulled low (and therefore generating a low CS1 signal) and causes the contact element 2708 to be pulled high (and therefore generating a high CS2 signal).

While 2 contact elements (i.e. contact element 2706 and contact element 2708) for transmitting 2 control signals (which may enable many different data transmission protocols) are shown, it should be understood that a single control signal contact could be provided, where a control signal on the single contact element could be detected with reference to the neutral voltage, and a high value on the single contact element for control could indicate an on state and a low value would indicate an off state. A data stream having other control signals could also be implemented for other more advanced control modules, such as a control module having a wireless communication circuit. While a simple mechanical switch is shown in FIG. 27, a dimming feature could also be provided, where a dimming controller accessible by a user would adjust the voltage generated as CS1 and/or CS2, and the control circuit 202 would control the switch 220 (which may comprise a variable resistor for example) to regulate a dimming of the load.

Various embodiments related to power adapters having one or more outlets are now described. That is, in contrast to the power adapters that operate as switches for turning a light controlled by the switch on or off, the following power adapters comprises one or more electrical outlets for receiving a plug of a device (such as a lamp) that is inserted into the outlet to provide power to the device. Modules can be implemented to provide additional functionality to a power adapter having an outlet or to operate as a control module to control operation of the device receiving power from the outlet of the power adapter, such as by enabling the turning on or off of the device or controlling the device according to a timing pattern as described above. As will be described in more detail below, power adapters can be implemented to receive a module within the power adapter that provides additional functionality. Unlike conventional power control arrangements that require that a separate device, such as a timer or universal serial bus (USB) adapter, be plugged into an existing outlet, a module can instead be inserted in a recess of the power adapter according to various implementations set forth below for example. In the case of a USB adapter implemented as the module of FIG. 30 for example, the outlet that would otherwise receive a conventional USB adapter remains open, and therefore the power adapter provides two outlets along with the USB connectors of a USB charging module. In the case of a wireless control module, such as a timer, there is no need to have a separate element protruding from the outlet that receives a plug of a device, where the separate element may not be aesthetically pleasing and may interfere with the placement of furniture against a wall. That is, in addition to a plug extending from a wall outlet, the use of a conventional timer may require a separate device that is inserted into the outlet and comprises an outlet for receiving a plug of the device. According to various implementations as set forth below, the power adapter can be adapted to operate as a timer by receiving a timer module in a recess of the power adapter, where the plug of the device can be directly plugged into the outlet. Other functionality can be provided by the module, which may include one or more sensors, such as a sensor for detecting motion, ambient light, temperature, humidity or any other detectable state or condition near the power adapter. While some modules are passive modules (e.g. enabling the coupling of conductors to allow for the charging of device such as a USB connector enabling the charging of portable device), other modules implemented in FIG. 27-52 may be control modules. For example, a module implemented as a control module could control the application of power to a device, such as a device controlled by an in-wall power adapter wired to the device or a device plugged into an outlet of the power adapter that receives power from a wall outlet. By enabling the use of the power adapter to be used without a module (e.g. by allowing the use of a dummy module or cover for a recess as will be described in more detail below), a single type of power adapter having outlets can be installed in an entire building, such as a residence, allowing the owner of the building to easily change the functionality or operation of the power adapter at any time by adding a module.

Further, by implementing both the modular power adapters operating as wall switches described above in FIGS. 1-14 and 17-20 and the modular power adapters having outlets as described in FIGS. 28-52, an owner of a building, such as an owner of a newly constructed residential building, can make decisions regarding the functionality of switches and outlets after construction is complete and the desired functionality or operation for the switches or outlets is more clear. According to some implementation of FIG. 28-52, modular power adapters are configured to receive a module, and have one or more outlets that enable power to be applied to a device plugged into the outlet, using a control module inserted into the power adapter. The benefits of the modular feature for power adapters extend after a selection may be made by a user, and apply to the replacement market for switches and outlets in an existing structure. For example, a homeowner may decide to install wireless modules for modular switches and modular outlets having a certain technology, and may wish to change at a later time to wireless modules having a more current technology.

By implementing modular power adapters (such as having a switch for controlling an outdoor or ceiling light or an in-wall outlet) as described herein, an owner of a building will never be exposed to high voltage electrical power associated with the building, but can change the functionality or operation of a power adapter by simply switching out the module of the power adapter. Such an arrangement will reduce costs to a homeowner by eliminating calls to an electrician to make simple changes in the building such as changing an outlet or switch. As will be described in more detail below, modules can be interchanged to provide different functionality based upon the particular module used at a given time. For example, a power adapter could be initially provided with a low-cost module (e.g. a module that may provide limited functionality, such as allowing for a manual on/off feature that would allow a user to engage an actuator to turn a device controlled by the power adapter on or off), and later replaced with another module that could provide additional functionality, such as remote wireless control by a control device (e.g. a smart phone). Examples of modules having different levels of functionality are described in more detail below. It should be noted that modules, whether for a power adapter that is used as an in-wall switch or a power adapter that is installed as an in-wall outlet, could be different types of modules. For example, a module for an in-wall switch application could be a mechanical type that provides control signals in response to a user interaction with a mechanical switch on a user interface of the module, and electrical type that may have some control operations as shown for example in FIG. 13, or wireless type of module as shown for example in FIG. 12 that may receive control signals from a remote device, such as a smart phone, and provide control signals to the switching module. Similarly, as will be described in more detail below, a module for a power adapter having an outlet as described below may have a non-functional type of module (i.e. a dummy module or cover for a recess), a functional module that provides additional functionality (e.g. a module having USB connectors for USB charging by way of power contacts of the recess for providing a low voltage (e.g. approximately 5 volt) signal), or a control module that controls the operation of an outlet of the power adapter. The control module may provide control by way of direct interaction with a user interface (e.g. FIG. 13) or wireless control (e.g. FIG. 12) as described above.

According to some implementations, a power adapter may be a passive switching device controlled using a wireless control device (e.g. a smart phone or a dedicated controller) by way of a wireless communication connection. The passive switching device does not actively control the application of power to a device, but rather enables the switching of power in response to real-timer control signals from the wireless control device. That is, the passive power adapter may not store any operational data or timing pattern information, but rather would respond to control signals from the wireless control device to apply control signals to a device under control of the power adapter. Alternatively, a power adapter may be an active power adapter controlled using a wireless control device (e.g. a smart phone or a dedicated controller) by way of a wireless communication connection. The active power adapter may receive a timing pattern having a plurality of switching events. Rather than separately receive a control signal from the wireless control device in real time to enable a switching event, the active power adapter will enable the switching event at the appropriate time based upon operational information stored and maintained (e.g. time and date) in the active power adapter to implement the timing pattern. By way of example, the control device may provide both operational information and a timing pattern having a first switching event of turning a light on at 9:00 PM and a second switching event of turning the light off at 6:00 AM every day. After receiving the operational information and the timing pattern, active power adapter can operate independently of the control device to control power to a device such as a light according to the first switching event for example.

Figure 28:
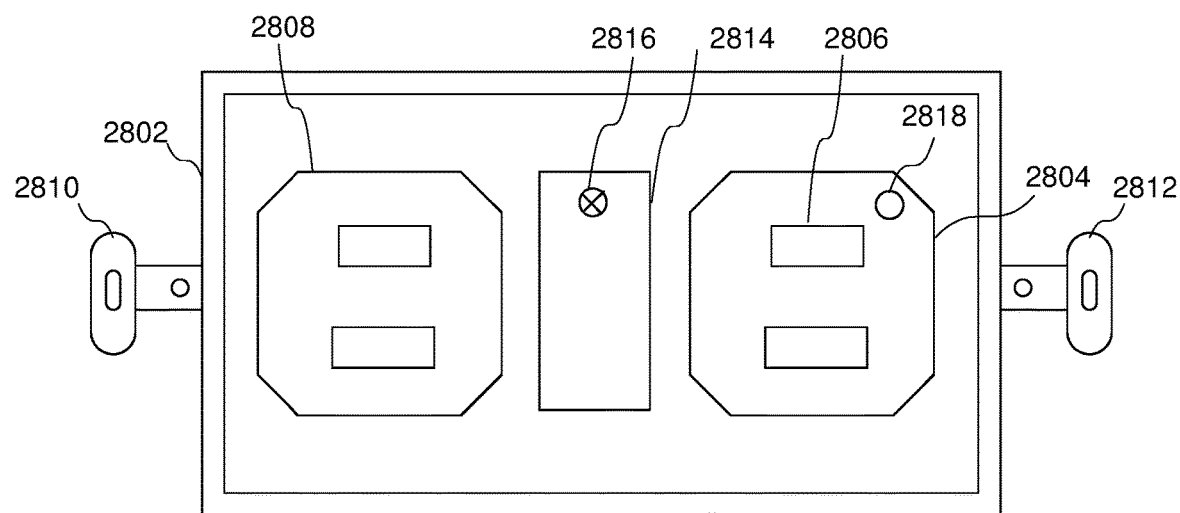
FIG. 28 is a plan view of a power adapter having a cover for a module between a pair of outlets.

Referring specifically to FIG. 28, a power adapter 2802 comprises a first outlet 2804 having receptacle elements 2806 for receiving corresponding prongs of a plug to provide power to an electrical device having the plug. The power adapter 2802 comprises a second outlet 2808 as shown. While 2 outlets are shown by way of example, it should be understood that any number of outlets could be implemented in a power adapter configured to receive a module as described below. The power adapter could also include flanges 2810 and 2812 for attaching the power adapter to a junction box for example. While the use of a module for a power adapter finds particular application with a power adapter configured to be attached to a junction box, a module as described below could be implemented in any type of power adapter having outlets. A cover 2814 is attached to the power adapter 2802 using an attachment element 2816, which could be a screw as shown for example. However, it should be understood that the attachment element could be any type of mechanical, magnetic, or adhesive element to secure the cover 2814. It should be understood that the cover 2814 could be separate from or a part of a module (such as a wireless module) inserted into a recess of the power adapter to provide additional functionality for the power adapter. In the case of a module having elements that are accessible or visible, such as USB connector of a USB module or an LED of a wireless module, the cover may be a part of the module so that the elements remain exposed, or alternatively, include openings to enable the elements to be accessible or visible. The cover could be used to provide pressure when properly secured to the power adapter to ensure that adequate electrical connections are made between contacts of the module and corresponding contacts of the power adapter. A status element 2818, such as an LED for example, could provide status information associated with the application of power to the outlet 2804. For example, the status element 2818 could be an LED that is on when power is applied to the outlet and off when power is not applied to the outlet (such as in the case when the module functions as control module to implement a timing pattern). It should be noted that modules implemented in recesses of a power adapter having an outlet could be a module having additional functionality (e.g. one or more USB connectors) and/or a control module to control the outlet (e.g. a wireless control module for controlling the operation of the outlet). A power adapter or module, alone or in combination, could also include protection circuits, such as a ground fault circuit interrupt (GFCI) circuit, to prevent a ground fault condition. The power adapter and module having a GFCI circuit could enable automatic testing of the power adapter or could include a test button and a reset button for example, or could include visual indicators of a state of the power adapter or include an audio device for providing an audible indication of the state of the power adapter.

Figure 29:
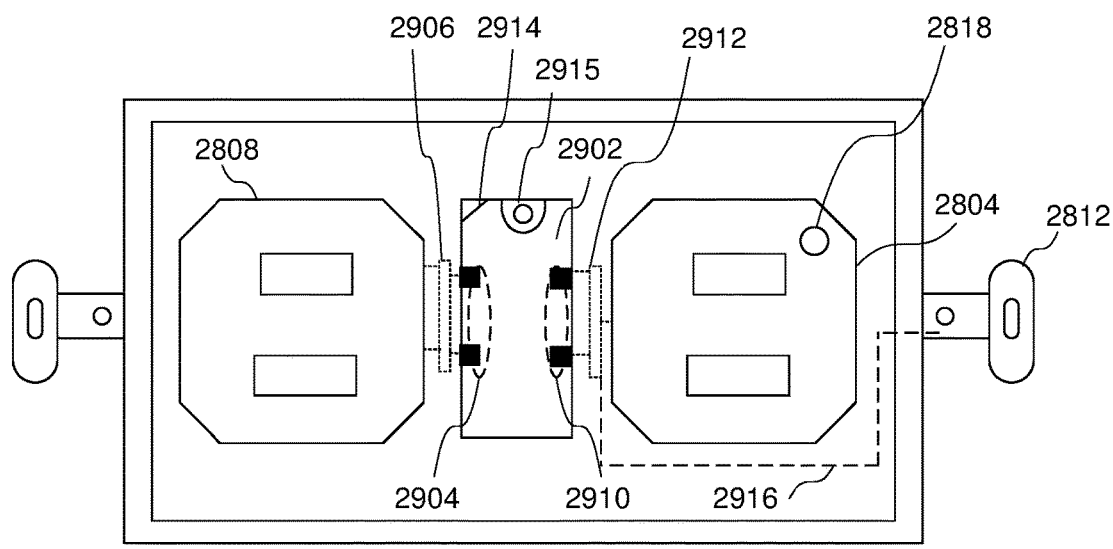
FIG. 29 is a plan view of a power adapter having a cover (for a module between a pair of outlets) that is removed.

As shown in the plan view of the power adapter of FIG. 29 having the cover for a module between a pair of outlets, a recess 2902 that is exposed when the cover or the module is removed comprises a plurality of contacts that are adapted to make an electrical connection with corresponding contacts of the module. A first set of contacts 2904 may be used to provide power by way of a transformer 2906 (which may correspond to transformer 204 for example) to the module to enable the module to operate. For example, the transformer 2906 could covert a high voltage provided to a power adapter, such as 120 volts for example, to a low voltage, such as 5 volts for example, to enable a module inserted in the recess 2902 to control the operation of the outlet 2804. That is, a module inserted in the recess 2902 may provide signals by way of contacts 2910 to a control circuit 2912 (which may include control circuit 202 and switch 220 for example) that controls the application of power to the outlet 2804. The transformer 2906 and the control circuit 2912 are shown in dashed lines to indicate that they are behind the front surface of the power adapter. The transformer provides a low power signal for enabling the operation of a module inserted in the recess. For example, the low power signal could be a 5 volt signal to charge a device plugged into a charging module (e.g. a USB charging module or to provide power to enable a control module, such as a wireless control module to operate. As will be described in more detail below in reference to FIG. 43 below, the control circuit 2912 controls the application of power to the outlet 2804, such as according to a timing pattern for a module that functions as a timer, and may vary the voltage applied to provide a dimming function. That is, contacts 2910 receive control signals from a control module, such as a wireless control module for example, and routes the control signals to a control circuit of the power adapter to control the application of power to one or both of the outlets. The corresponding contacts and additional information related to the contacts of a module inserted in the recess 2902 will be described in more detail in reference to FIGS. 32 and 33. A recess 2902 may also comprises a barrier 2914, shown here as a corner section, to prevent a module from being inserted improperly into the recess. The recess may also comprise an attachment element, shown here as a threaded hole 2915 adapted to receive a screw 2816 for example. However, any type of attachment elements could be used. The power adapter may also include an electrical connection 2916 from and earth ground (which may be flange 2812 for example) to the control circuit 2912. As will be described in more detail below, the ability to detect the voltage for earth ground will help determine whether the power adapter is properly wired and/or whether the power adapter is operating properly.

Figure 30:
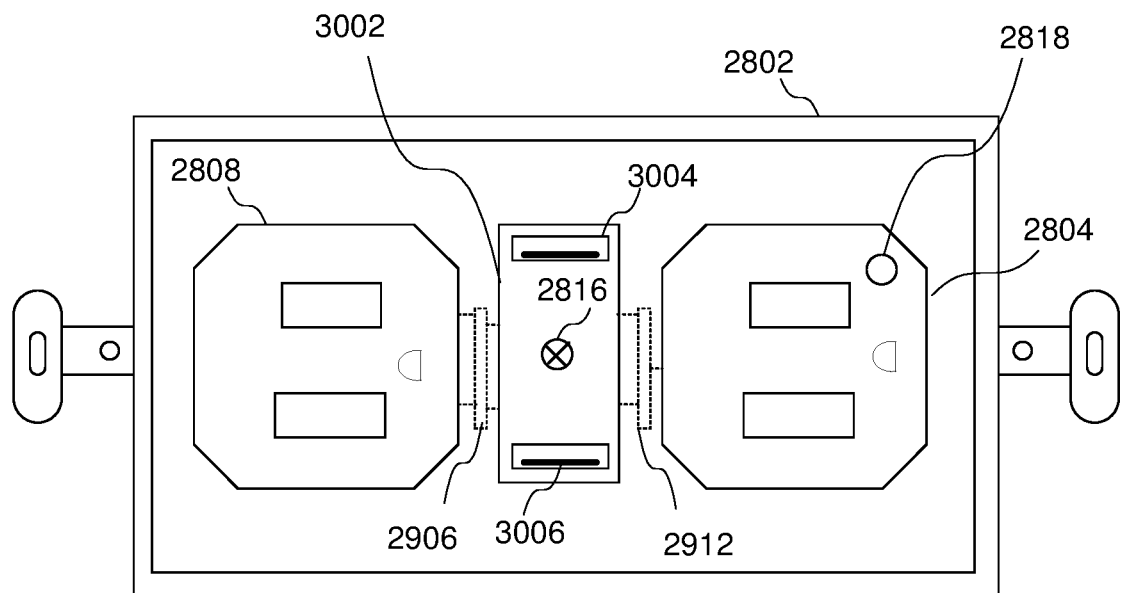
FIG. 30 is a plan view of a power adapter comprising a module having a plurality of connectors.

Turning now to FIG. 30, a plan view of a power adapter comprising a module having a plurality of connectors is shown. According to the example of FIG. 30, a module 3002 having USB connectors 3004 and 3006 enables the application of power to a device (such as a smart phone or other portable device). That is, power from the transformer 2906 is provided to the module 3002. Control functionality may also be provided to the control circuit 2912. That is, the module 3002 may be a passive module that only provides power to the USB connectors 3004 and 3006, or a control module (e.g. a module having a wireless communication circuit adapted to receive data from a control device) that also provides control signals to the control circuit 2912 to control the application of power to the outlet 2804. According to one implementation as shown in FIG. 30, the attachment element 2816 could be implemented in the center of the module to enable the USB connectors to be spread apart as far as possible to provide space for inserting a corresponding USB plugs into the USB connectors 3004 and 3006. That is, placing the USB connectors 3004 and 3006 on the ends of the modules reduces the likelihood that the USB plugs will interfere with plugs inserted into the outlets.

Figure 31:
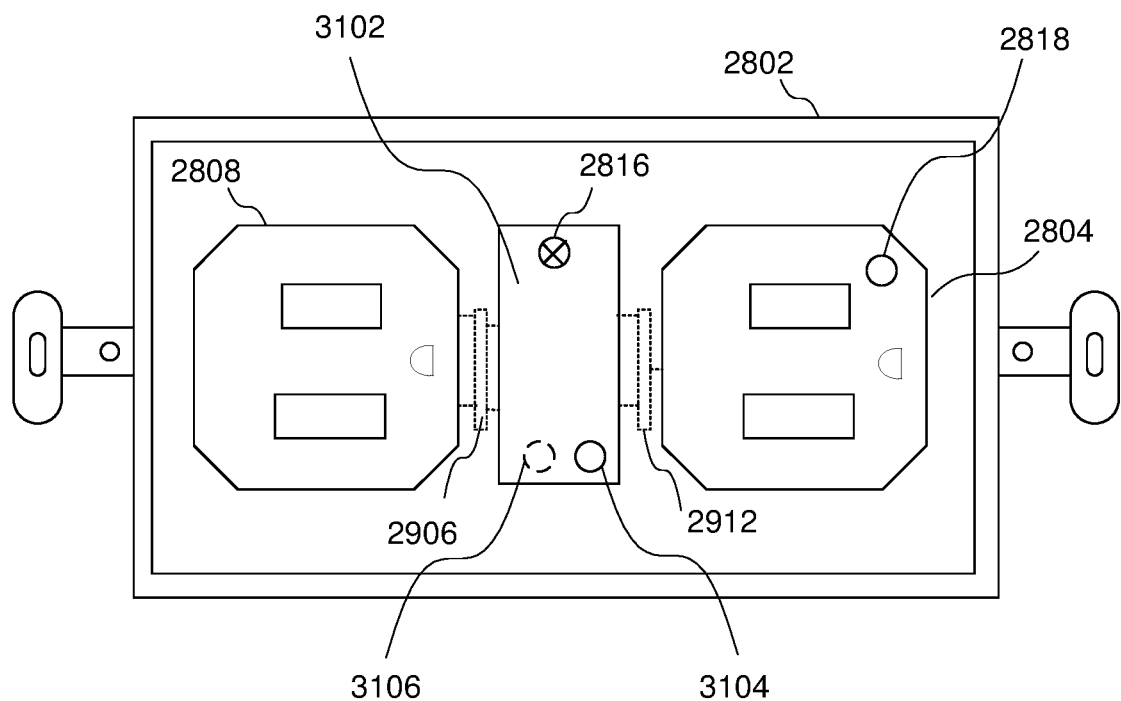
FIG. 31 is a plan view of a power adapter having a wireless communication module.

In contrast, as shown in FIG. 31, a power adapter having a wireless communication module enables wireless control of a device plugged into the outlet 2804. The module 3102 may comprise a status indicator 3104, which could provide a status of the operation of module 3102, such as an indication of when the module is receiving control signals from a control device, such as a dedicated control device, a smart phone, or other computer device for controlling the operation of the module 3002. The status indicator 3104 may also indicate whether the module is powered, functioning correctly, or disabled for example. The module may also include a pairing element 3106, which may be a button for example, to enable the pairing of the module to a control device and/or a network as will be described in more detail below.

Figure 32:
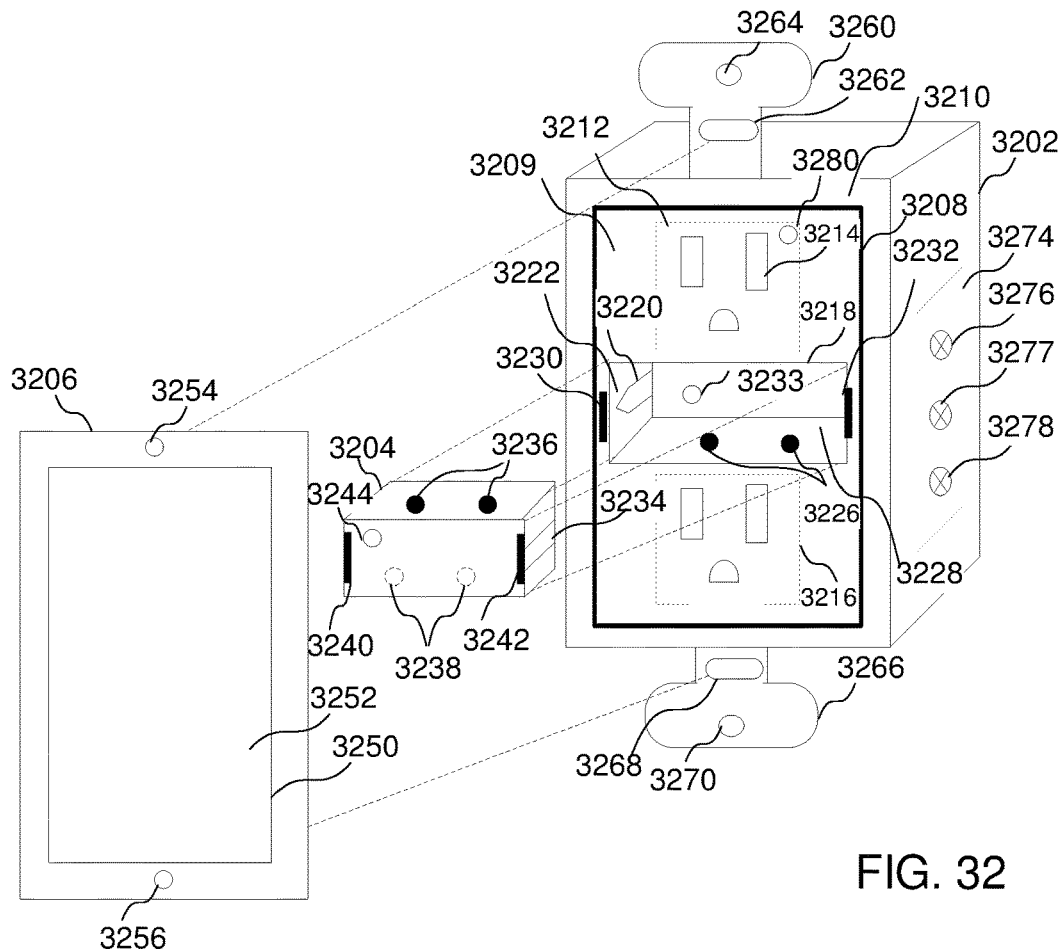
FIG. 32 is an expanded view of a power adapter, module and wall plate according to one embodiment.

Turning now to FIG. 32, an expanded view of a power adapter, module and wall plate according to one embodiment is shown. A power adapter 3202 is adapted to receive a module 3204 for providing additional functionality for the power adapter, such as wired connectivity (e.g. USB connections), sensor capability, or wireless control capability. A wall plate 3206 adapted to cover a portion of the power adapter 3202 and a junction box receiving the power adapter 3202.

Figure 33:
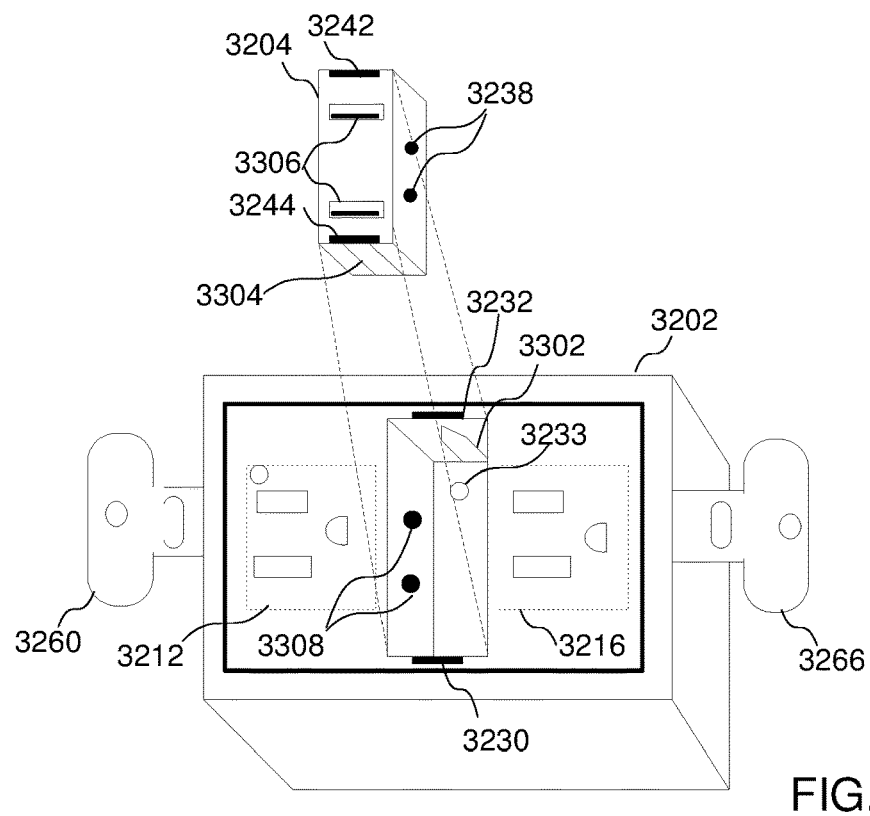
FIG. 33 is another expanded view of the power adapter and module of FIG. 32 rotated 90 degrees counter-clockwise.

An elevated edge 3208 defines a surface 3209 having the outlets and perimeter 3210 that is adapted to receive the wall plate 3206. The surface 3209 comprises an outlet 3212 having receptacles 3214 for receiving prongs of a plug. A second outlet 3216 is also shown. An opening of a recess 3218 is also on the surface 3209. The recess 3218 may comprise guides 3220 along one or more side walls 3222 to enable aligning the module 3204 in the recess 3218. As will be described in reference to FIG. 33, another guide may be on a side wall opposite the side wall 3220. Contact elements may also be positioned within the recess to align with and make an electrical contact with corresponding contacts on the module 3204. For example, contacts 3226 are located on side wall 3228. As shown in FIG. 33, contacts may also be located on a side wall opposite wall 3228, or another side wall or the bottom of the recess. Alternatively, all of the contacts could be on the same wall. As will be described in more detail below, one or more contacts may be used to enable powering the module and one or more other contacts may be used to provide control signals to control signals to control the application of power to the outlet. The recess 3218 may also comprise attachment elements, shown by way of example as attachment elements 3230 and 3232 on sides of the recess.

According to one implementation, a switch 3233 may be included in the recess to detect when a module is positioned in the recess, and therefore change the switch from a first state to a second state to enable bypassing the direct connection of electrical power to an outlet (as will be described in more detail in reference to FIG. 43). In contrast, when a cover for the recess is used (i.e. when a no module is used), the switch will remain in the first state, allowing the direct connection of electrical power to the outlet, where the electrical power is continuously applied. Alternatively, in the case of the use of a dummy module (i.e. a module that fits in the recess but does not provide any other functionality), the dummy module may be configured to prevent changing the state of the switch. For example, if the switch is a button at the bottom of the recess that is depressed when a module is inserted into the recess, the module may include a gap or opening that would receive the button and prevent the button from be depressed. As will be described in more detail below in reference to FIG. 43, the power may be continuously applied to an outlet unless a functional module is inserted into the recess, in which case the module would control the application of power to the outlet. Switch 3233 may be any type of mechanical switch, such as a spring-loaded button or lever, or an electrical switch, such as a simple electrical contact, a magnetic circuit, inductive circuit, or other wireless circuit.

The module 3204 comprises elements to enable both an electrical and physical connection to the power adapter 3202. More particularly, a recess 3234 is provided to receive a guide 3302 shown in FIG. 33. The module also comprises contacts 3236 that enable an electrical contact with corresponding contacts 3308 as shown. Contacts 3238, show in dashed lines to indicate that the contacts are on an opposite side of the module 3204 from the contacts 3236, enable an electrical connection with contacts 3226. Attachment elements 3240 and 3242 are configured to align with corresponding attachment elements 3230 and 3232 to retain the module within the recess. An interface element 3244 may also be included on a surface of the module, such as a front surface that is accessible by a user. The interface element may provide information to a user, or may enable a user to provide an input to the module. For example, the interface element 3244 may comprise a status indicator, such as an LED to indicate a state of the module or the status of an operation of the module or the power adapter. According to another embodiment, a module could be detected in the recess by way of contacts in the recess for example. While physical electrical contacts are shown by way of example, it should be understood that communication between the module and the power adapter could be wireless, such as by way of an NFC or Bluetooth connection for example as described above in reference to FIG. 2.

The wall plate 3206 comprises an edge 3250 defining a recess 3252 that aligns with elevated edge 3208 when the wall plate is attached to the power adapter 3202. The wall plate includes screw holes 3254 and 3256 for receiving screws that are inserted into threaded portions of flanges of the power adapter. More particularly, a first flange 3260 comprises a recess 3262 to receive a screw that may be used to attach the power adapter 3202 to a junction box and a threaded portion 3264 to receive a screw inserted through screw hole 3254. A second flange 3266 comprises a recess 3268 to receive a screw that may be used to attach the power adapter 3202 to a junction box and a threaded portion 3270 to receive a screw inserted through screw hole 3256. According to the implementation of FIG. 33, USB connectors 3306 are included by way of example.

Figure 34:
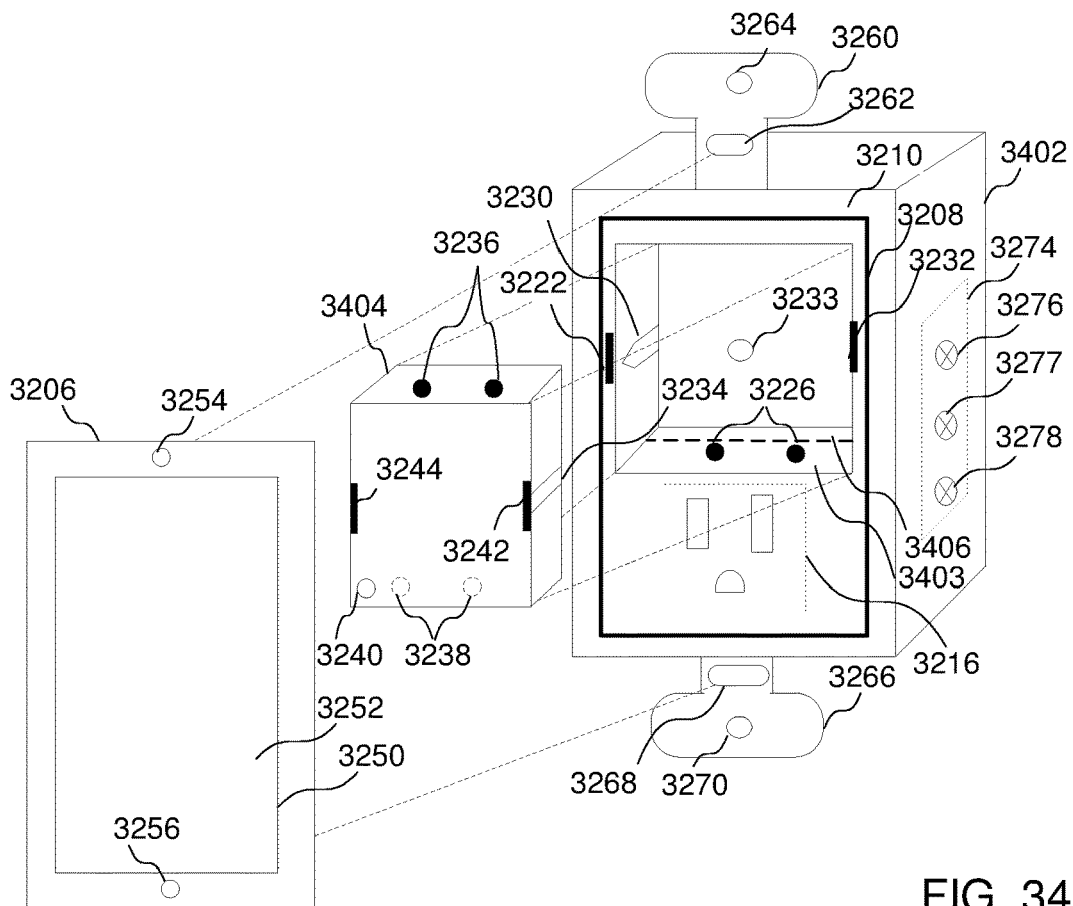
FIG. 34 is another expanded view of a power adapter, module and wall plate according to one embodiment.
Figure 35:
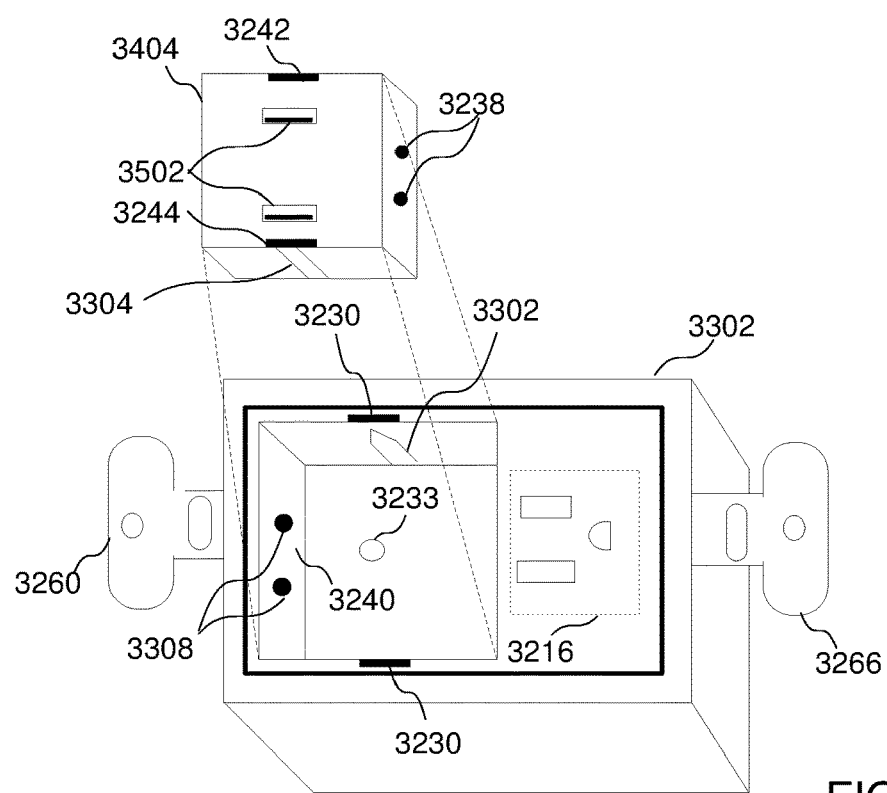
FIG. 35 is another expanded view of the power adapter and module of FIG. 34 rotated 90 degrees counter-clockwise.

Turning now to FIGS. 34 and 35, expanded views of another power adapter, module and wall plate are shown. The power adapter 3402 is configured to have at least one outlet 3216, and a module 3404 that is generally larger than the module 3204. The larger module 3404 may include an outlet, but may enable more functions or different functions that may be more difficult or costly to implement in the smaller module 3204 of FIG. 32. For a module including an outlet, the power adapter should be implemented to prevent electrical power from being exposed to a user of the power adapter when the module is removed from the power adapter. For example, a flange of the module may be inserted into a recess 3406 behind the contacts, indicated by the dashed line, as will be described in more detail in reference to FIG. 36.

The arrangement of the power adapter 3402 with the larger module 3404 may be implemented as described above in reference to FIGS. 32 and 33 (where the same numbers for elements of FIGS. 32 and 33 are included in FIGS. 34 and 35), or may include additional or different elements to accommodate for the larger size of the module. By way of example, additional or different guides and attachment elements could be implemented to retain the module 3404 in the recess 3403. As shown in FIG. 35, connectors 3502 comprise USB connectors.

Examples of modules that could be implemented with the power adapters of FIGS. 32-35 are now described. It should be understood that while examples of modules are provided, features or functions of the different modules could be combined into a single module, or other features or functions could be implemented in a module.

Figure 36:
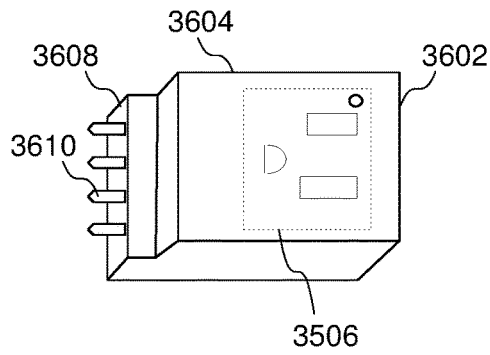
FIG. 36 is an exemplary module having an outlet.

Turning first to FIG. 36, an exemplary module 3602 having an outlet is shown. The module 3602 comprises a main body portion 3604 having an outlet 3606. Because the outlet requires power, contact elements carrying high voltages must be provided between the power adapter and the module. As indicated above, it is necessary that a user cannot come in contact with a high voltage contact. Therefore, a connector flange 3608 having contact elements 3610 is provided. The connector flange 3608 is intended to slide into a recess that would not be accessible by a user. That is, a recess is implemented such that a human finger could not fit into the recess, and therefore could not touch any high voltage contact. The contact elements 3610 are also designed to be inserted into a corresponding contact recesses that would further prevent a finger from coming into contact with a high voltage contact. While the connector flange of FIG. 36 is just one example of a contact arrangement that could be used to provide a high voltage to the module, other types of contact arrangements could be implemented.

Figure 37:
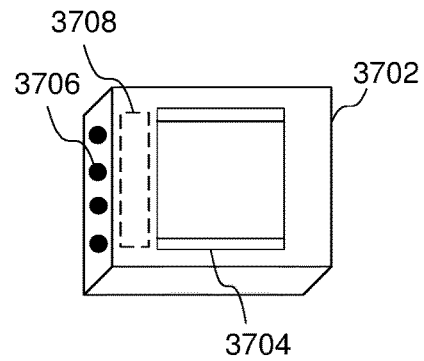
FIG. 37 is an exemplary module having a wireless communication circuit and a motion detector.

Turning now to FIG. 37, an exemplary module having a wireless communication circuit and a motion detector is shown. That is, the module 3702 comprises a motion detector 3704 on an outer surface that enables detecting motion near the power adapter, and having contacts 3706 for communicating with the power adapter. The module 3702 may optionally comprise a wireless communication circuit 3708. For example, a power adapter using the module 3702 may implement a timing pattern that may be downloaded to the module by way of a wireless communication connection using wireless communication circuit 3708 to control the operation of the outlet of the power adapter, where the motion detector may supplement the operation of the outlet by turning on a device powered by the outlet. While a motion detector is shown by way of example, it should be understood that any other type of sensor, such as an ambient light sensor, temperature sensor, a humidity sensor, or any other sensor for providing information that may be used by the power adapter.

Figure 38:
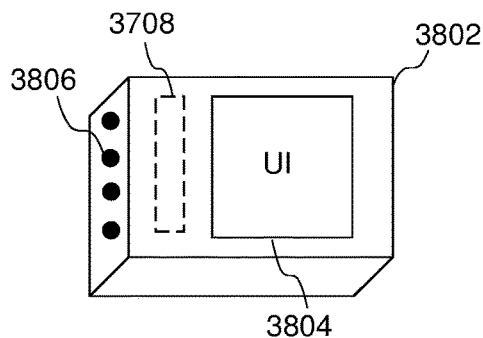
FIG. 38 is an exemplary module having a wireless communication circuit and a user interface.

Turning now to FIG. 38, an exemplary module having a wireless communication circuit and a user interface is shown. The module 3802 comprises a user interface 3804 and an optional wireless communication circuit 3806. The user interface could include any type of input element for receiving information from a user or output element for providing information to a user. The input elements could include physical actuators (e.g. buttons, knobs, dials, switches, etc.), a touch screen interface, or a microphone for example. The output elements could be a speaker, LED status indicators or a display for example. Examples of user interfaces that could be implemented are shown by way of example in FIGS. 39-41. While these user interfaces are shown by way of example, it should be understood various features or functions of the user interfaces as shown in FIGS. 39-41 could be interchanged or implemented with other features.

Figure 39:
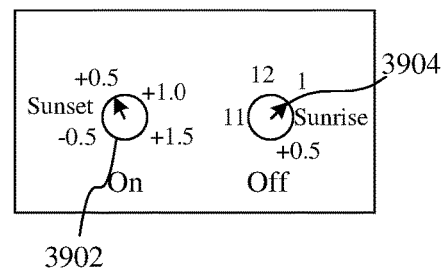
FIG. 39 is an exemplary user interface having control actuators that could be implemented in the embodiment of FIG. 38.

Turning now to FIG. 39, an exemplary user interface having control actuators that could be implemented in the embodiment of FIG. 38 is shown. According to the implementation of FIG. 39, dials could be used to easily set an on time or an off time. As shown by way of example, an on time dial 3902 enables the selection of an on time with respect to sunset, where a user could select sunset as the on time, or a predetermined half hour period before or after sunset. Similarly, the off time could be selected using a dial 3904, where the off time could be selected as sunrise or a predetermined period before or after sunrise. Alternatively, predetermined times could be selected for the on and off times. For example, an on time could be selected as a fixed time between 6 PM and 11 PM by moving the dial to the desired time. Similarly, an off time could be selected between 11 PM and 5 AM by selecting the desired off time. While 2 dials are shown by way of example, additional pairs of dials enabling multiple on and off times could be implemented and the specific settings could vary from those shown.

Figure 40:
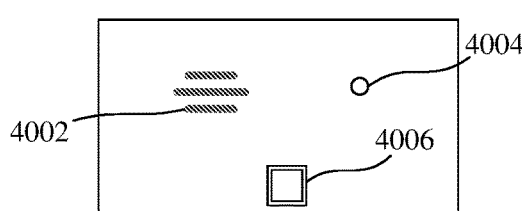
FIG. 40 is an exemplary user interface having voice recognition that could be implemented in the embodiment of FIG. 38.
Figure 41:
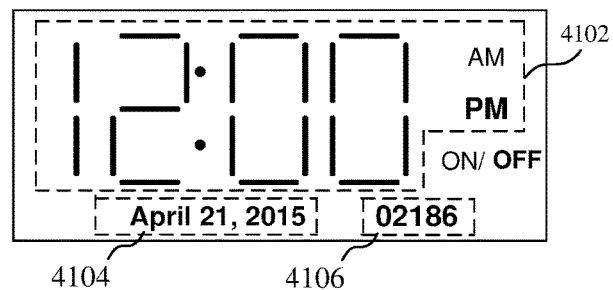
FIG. 41 is an exemplary user interface having a touch screen interface that could be implemented in the embodiment of FIG. 38.

Turning now to FIG. 40, an exemplary user interface having voice recognition that could be implemented in the embodiment of FIG. 38 is shown. As shown in the implementation of FIG. 40, a voice activated user interface enables the input of operational information, such as current time, date and location information as well as timing pattern information, to the power adapter. More particularly, a speaker 4002 and a microphone 4004, which is a control element, enable the entry of information necessary for the power adapter to apply power to the receptacle at the appropriate times. The speaker 4002 may be used to implement prompts for a user to enter particular data, which may be detected by the microphone 4004. The button 4006 may be used to enable a user to sequentially request a prompt from the power adapter, in response to which a user could enter the requested data.

While the speaker 4002 and button 4006 are shown, it should be understood that FIG. 40 could include only the microphone 4004, where a user could simply dictate the desired information which would be deciphered by the power adapter. That is, the user could simply indicate the time, date and location, and a control circuit of the power adapter would determine the correct time, date and location based upon the users entered information. It would not be necessary that the user enter any data in any particular order, or any particular type of data. The control circuit would be configured to detect and decode various types of information provided. For example, the user could enter time within an AM/PM designation, or as military time. The control circuit would determine the correct time based upon the entered information. Similarly, the date could be determined simply based upon a month entered by a user, or a series of numbers which would be determined to be a date, such as "nine eleven twenty sixteen" which would be interpreted in Sep. 11, 2016. Similarly, location could be based upon ZIP Code, longitude and latitude designations, a geographic region, a portion of a state, well-known cities, or any other geographic location. If the control circuit cannot decode an entry of a user, the control circuit could then add a prompt to provide the information in a certain format. Information associated with a timing pattern could also be dictated by the user. For example, a user could dictate a timing events associated with a timing pattern, such as an on or off times or dusk and dawn as on or off times, for particular day of the week, or predetermined groupings of an on and off times, such as weekdays or weekends.

Turning now to FIG. 41, an exemplary user interface having a touch screen interface that could be implemented in the embodiment of FIG. 38 is shown. A display having particular fields that could be selected and modified is shown in FIG. 41. More particularly, the display comprises a time field 4102, a date field 4104, and a location field 4106. Each of the fields could be selected by touching the field, such as any location within the dashed box associated with the field as shown in FIG. 41. When time field 4102 is selected, a designation region that indicates the type of data that follows in the field is shown. Initially, the hour designation would be displayed, with the current time that is stored being displayed in the data field. A user could then "swipe" the data to change the data. Accordingly, if a user slightly swipes upward, the time will change from 12 PM to 1 PM for example. The user could then select the hour field again to "store" the hour time, leading to the presentation of the "minutes" field. After the minutes field is selected, the display will then show the current time.

A user could also select the current date. In particular, when the date field is selected, the month may be initially designated. The user could then swipe up or down to reach a desired month, such as July. When the user stores the month of July, the date will then be displayed. The user could then change the date to a desired number. After the date field is selected to store the current date, the year will be displayed which can also be changed and stored.

Finally, the user could enter a current location, such as a ZIP Code. Starting from an initial ZIP Code, the user could swipe the individual digits of the ZIP Code. While particular methods of changing the data are shown by way of example in FIG. 41, it should be understood that other methods of changing the data on a touch screen or by way of some other means could be employed. Other implementations of a touch screen user interface could be implemented, such as handwriting recognition for example. It should be noted that, while a user interface may be on a module, it could also be separate from a module, such as a control device in communication with the module, or split between the module and another device separate from the module.

Figure 42:
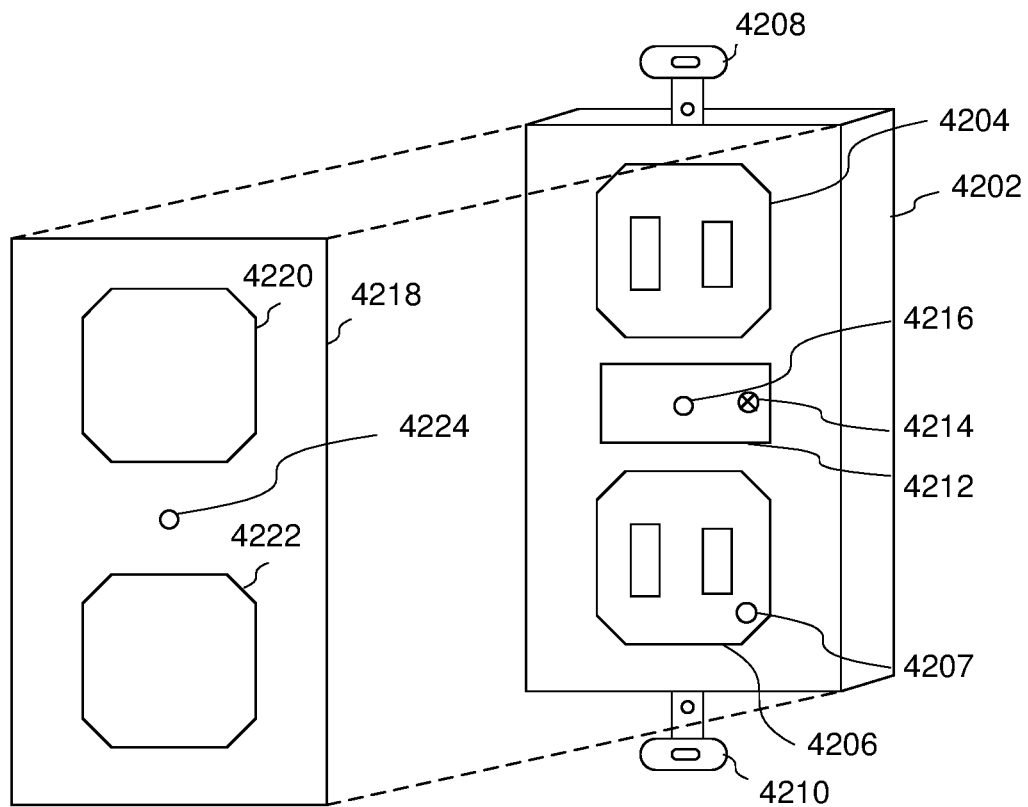
FIG. 42 is an expanded view of a power adapter having a module and a wall plate according to another embodiment.

Turning now to FIG. 42, an expanded view of a power adapter having a module and a wall plate according to another embodiment is shown. According to the embodiment of FIG. 42, a module can be hidden behind a wall plate, where the wall plate can be screwed into the module. More particularly, a power adapter 4202 comprising a first outlet 4204 and a second outlet 4206, which has a status indicator 4207. The power adapter 4202 also comprises flanges 4208 and 4210 to enable attaching the power adapter to a junction box. Between the outlet 4206 and the outlet 4208 is a module 4212 having an attachment element 4214, shown here as a screw. The power adapter 4202 and module 4212 can be implemented as described above in reference to FIGS. 32-36. However, the module 4212 could include an attachment element 4216 on the front surface of the module for receiving a corresponding attachment element on the wall plate 4218. According to the exemplary implementation of FIG. 42, the wall plate 4218 comprises a first opening 4220 for aligning with an outlet 4204 and a second opening 4222 for aligning with the outlet 4206. The wall plate also includes an opening 4224 for receiving a screw that is screwed into a threaded portion 4216 on the outer surface of the module 4212. That is, rather than screwing the wall plate into threaded portions of the flanges of the power adapter as in a conventional device, the wall plate is screwed into a threaded portion of a module that is inserted into a recess of the power adapter. Therefore, when the wall plate is attached to the power adapter 4202 having the module 4212, the power adapted appears to be a conventional power adapter with no obvious sign of the module 4212.

Figure 43:
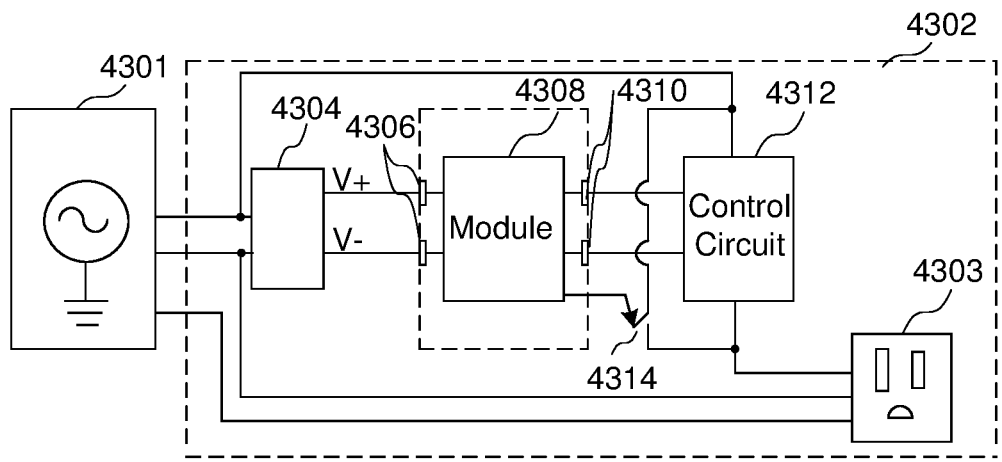
FIG. 43 is a block diagram of a power adapter enabling the use of a dummy module according to one embodiment.

Turning now to FIG. 43, a block diagram of a power adapter 4301 enabling the use of either a functional module or a dummy module according to one embodiment is shown. As shown in FIG. 43, a power source 4301 provides electrical power to a power adapter 4302, such as through wires in a building for example. The electrical power is provided to one or more outlets 4303. According to some implementations, the electrical signal from the power source 4301 may be conditioned to provide a stable voltage and prevent any surges or spikes in voltage for example. The electrical signal from the power source 4301 is also provided to a power transformer 4304 to generate reference voltages (shown here as V1 and V+ which may have a range of approximately 5 volts for example) coupled to contacts 4306 of a module 4308. Contacts 4310 enable the application of control signals to a control circuit 4312. By way of example, the module 4308 could be a module that is inserted into a recess of a power adapter as described in FIGS. 32-36, while contacts 4306 could correspond to the contacts for receiving power (such as to power the module (e.g. a wireless module) or provide power for USB connectors). The contacts 4310 could be contacts for providing control signals to control the power provided to the outlet 4303.

The control circuit 4312 enables the selective application of power to the outlet 4303, where the control circuit may be bypassed using a switch 4314 (which may be controlled by module 4308 and may correspond to switch 3233 of FIGS. 32-35 for example). That is, when switch 4314 is closed (such as when no module is used or a dummy module is used), power will be continuously applied to the outlet 4303. However, when switch 4314 is open as shown in FIG. 43 (where the bypass around the control circuit 4312 is eliminated), the module 4308 will control the operation of the contacts 4310 by way of the contacts 4310, where the control circuit 4312 will control the application of power to the outlet 4303. According to one implementation, the control circuit 4312 could be a simple relay that is switched to block current or pass current to the outlet 4316 and therefore selectively apply power to the outlet 4303. Control circuit 4312 may also provide dimming functionality, where the module 4308 could provide control signals to the control circuit to control the amount of power to the outlet 4316. By way of example, the control circuit could include a controllable resistive element to control the amount of power provided by the control circuit to the outlet, and therefore provide a dimming feature. As described above, the module 4308 may control the control circuit by providing signals to the control circuit to implement a timing pattern, which may be based on operational information provided to the module 4308 as described above.

Figure 44:
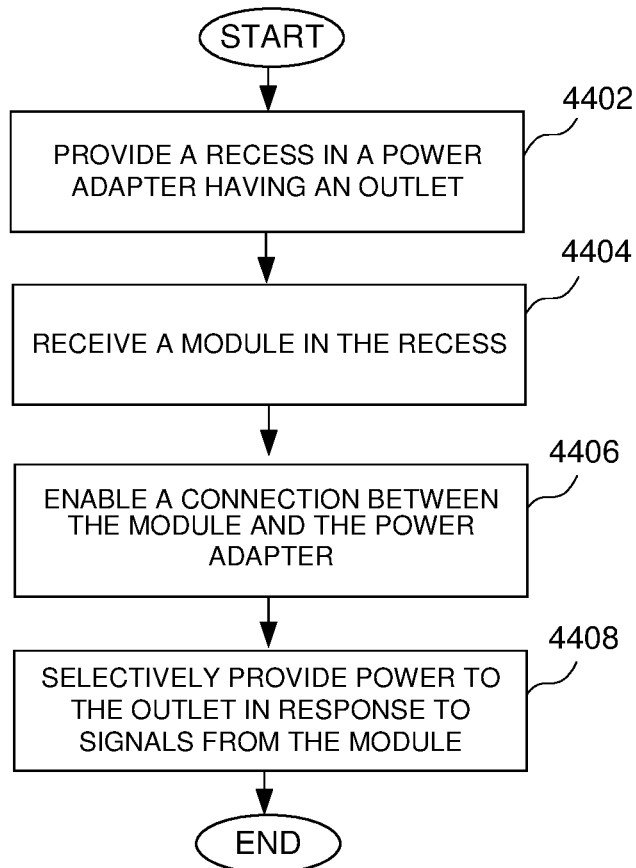
FIG. 44 is a flowchart showing a method of implementing a module in a power adapter.
Figure 45:
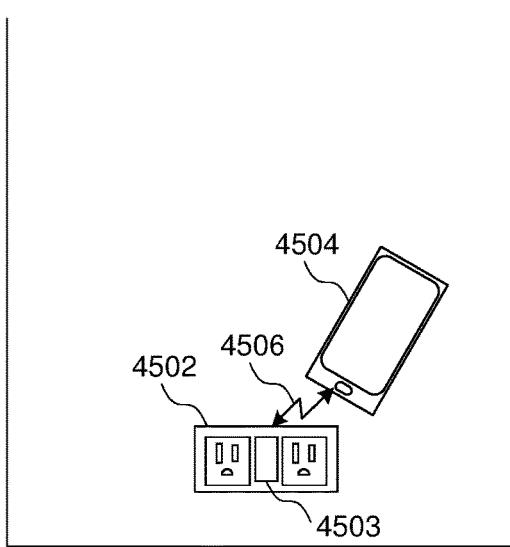
FIG. 45 is a diagram showing the pairing of a power adapter with a control device.

Turning now to FIG. 44, a flowchart shows a method of implementing a module in a power adapter. The flowchart of FIG. 44 could be implemented using any of the devices or circuits of FIGS. 28-43 for example, or other suitable devices or circuits. A recess is provided in a power adapter having an outlet at a block 4402. A module is received in the recess at a block 4404. The module could any type of module for providing additional functionality to the power adapter or controlling any type of operation of the power adapter. A connection is enabled between the module and the power adapter at a block 4406. The connection could be provided by any type of wired electrical contact or any type of wireless communication protocol. Power is selectively provided to the outlet in response to signals from the module at a block 4408. The power could be applied in response to real time signals from a control device (e.g. a smart phone or a dedicated control device to enable including implementing a timing pattern for example), or could be based upon a timing pattern that is provided to and stored in the module or the power adapter.

Also, the control signals may vary depending upon the type of module attached to the power adapter. For example, for a simple switch actuator (such as the module of FIG. 9) that functions to change the state of a device controlled by a power adapter, the power adapter may merely detect the signals to change the state of the device in response to inputs by the user. That is, the signals are static and may only change in response to user interactions on a switch actuator (e.g. on and off indications or optionally a dimmer indication) Certain control signals would indicate that the module is a simple mechanical actuator, and a limited number of signals would be transmitted. However, the power adapter may also detect that a control module is a smart control module that provides signals received by the control module, such as signals received by a wireless connection from a remote control device. A control circuit of the power adapter may detect the type of module that is attached, and decode the signals based upon the type of module. By way of example, the module could be a module as described in reference to FIG. 10 having a wireless communication circuit and a display, where the control circuit of the power adapter may not only decode signals received at different times by way of module from a remote control device, but also provide information that is shown in the display of the control module. That is, signals may be communicated in 2 directions based upon a type of module used. By way of another example of power adapters comprising dedicated buttons, as shown in FIG. 13, the power adapter may apply a timing pattern in response to a signal provided from the control module (such as a signal associated with the selection of a particular button), and then apply a timing pattern associated with the selected button. In the case of power adapters comprising an outlet as will be described in more detail below, the control circuit may control a switch to selectively apply power to the outlet based upon signals provided by the module (which may be based upon signals received by a wireless communication circuit of the module for example). Accordingly, the power adapter may decode signals that are common for all modules that could be attached to the power adapter, or may detect the type of module that is attached, and then decode signals from the module that may be expected based upon the type of module (and provide signals to the module, such as to be displayed on a display of the module, based upon the type of module).

Figure 46:
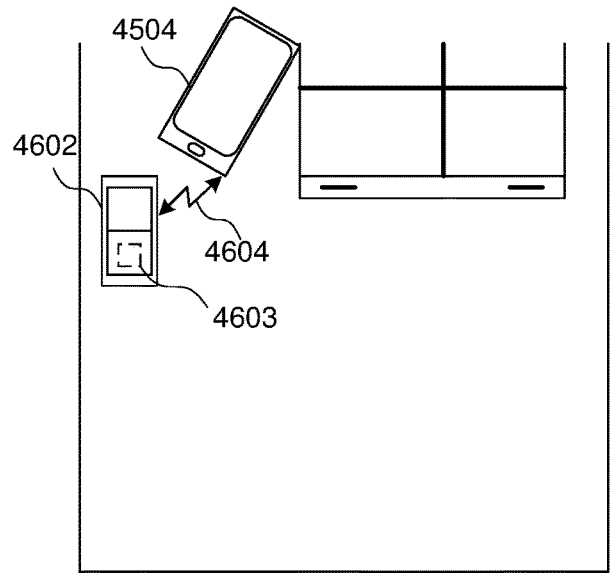
FIG. 46 is a diagram showing the pairing of another power adapter with a control device.

Turning now to FIGS. 45-48, diagrams show the pairing of power adapters with a control device, and the mapping of power adapters within a building, including different floors of a building for example. According to various implementations, power adapters can be added to a user's network by "claiming" a power adapter, and then the power adapters on the network can be mapped by a control device, such as a smart phone or dedicated control device for example, to enable a user to group different power adapters to operate in a similar manner (e.g. follow the same timing pattern). A power adapter 4502 having module 4503 (which includes a wireless communication circuit) is claimed by a control device 4504 using a wireless connection 4506. The wireless connection could be any type of short range connection, and could be a direct connection and an indirect connection. For example, a direct connection could be provided by a Bluetooth connection or a NFC connection. That is, a wireless communication circuit of the control device communicates directly with a corresponding wireless communication circuit of the power adapter or, without the need for any intervening device outside of the power adapter and the control device (e.g. without the need for a base station). An indirect connection could be provided by way of a base station, such as a WiFi router or a Z-wave or Zigbee base station or central controller. As shown in FIG. 46, the control device 4504 could claim a power adapter 4602 (also having a wireless control circuit 4603) by way of a wireless connection 4604. While a wireless module is shown for the power adapter, it should be understood that a wired connection could be used to claim a power adapter.

Figure 47:
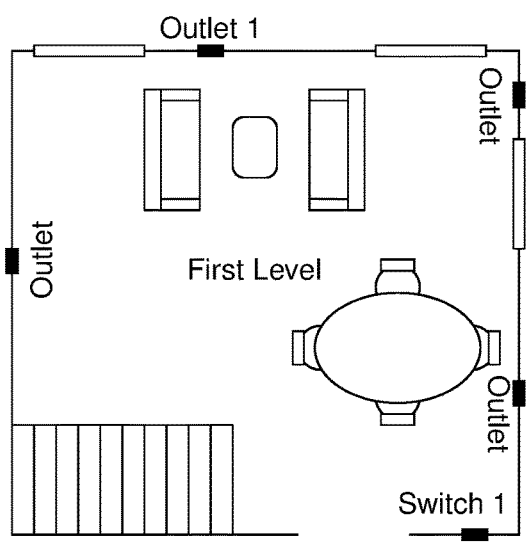
FIG. 47 is a diagram showing paired power adapters on a first level of a building.
Figure 48:
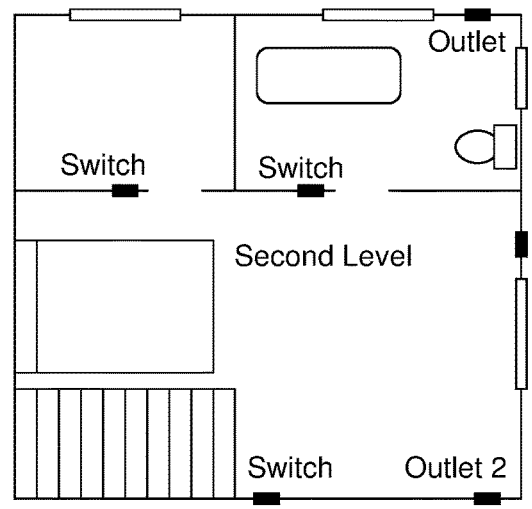
FIG. 48 is a diagram showing paired power adapters on a second level of a building.

As shown in FIGS. 47 and 48, different power adapters (shown here as outlets and switches) are distributed throughout a building, including a first level in FIG. 47 and a second level in FIG. 48. According to the example of FIGS. 47 and 48, an outlet or switch that is considered claimed is indicated with a number (where an outlet 1 and a switch 1 are claimed on the first level and an outlet 2 is claimed on the second level). The claimed outlets and switches can be "mapped" to a floorplan corresponding to a level of the building to enable a user to identify an outlet or switch based upon a location of the outlet or switch. The floorplan can be an architectural type floorplan, where wall, windows and doors can be identified based upon the locations of the claimed outlets and switches. Alternatively, the control device, such as a smart phone, can map the floorplan using computer vision techniques, such as through images or video taken by the camera during a claiming process. For example, the control device could implement Simultaneous Location and Mapping (SLAM) techniques to map the floorplan. The resulting floorplan can then be displayed based upon the captured images or video (i.e. where outlets and switches would be displayed with reference to actual items in the rooms) or could be an architectural type floorplan derived from the images or video. Such a mapping could enable the selection of outlets and switches for particular timing patterns, and enable the grouping of certain outlets or switches for particular timing patterns.

Figure 49:
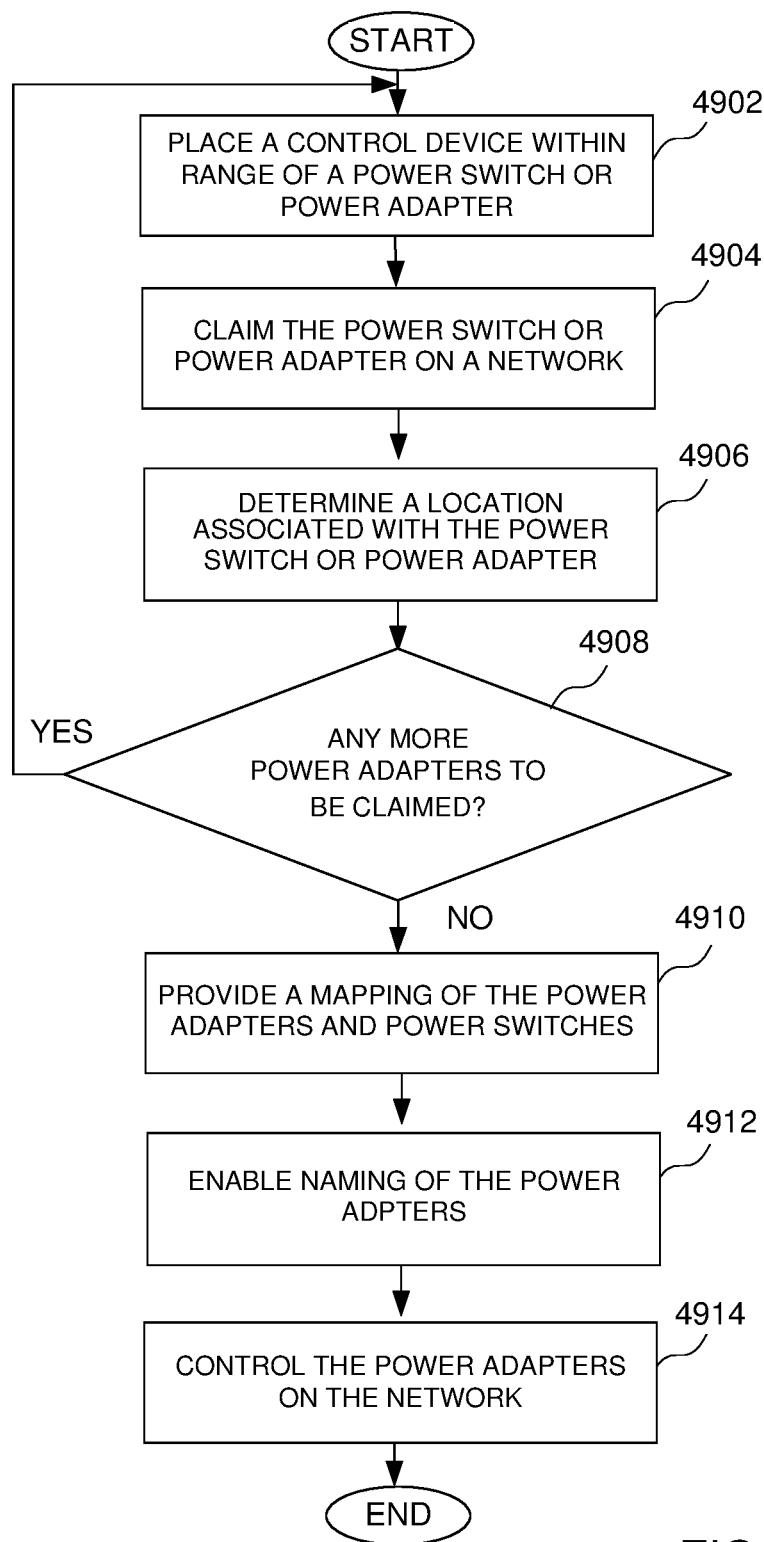
FIG. 49 is a flow chart showing a method of implementing a plurality of power adapters.

Turning now to FIG. 49, a flow chart shows a method of implementing a plurality of power adapters. The method of FIG. 49 could be implemented as described above in reference to FIGS. 45-48, or according using other devices for example. A control device is places within range of a or power adapter at a block 4902. The power adapter can be claimed on a network at a block 4904. A location associated with the power adapter is determined at a block 4906. It is then determined whether any more are to be claimed at a block 4908. A mapping of the power adapters are provided at a block 4910. The naming of the power adapters is enabled at a block 4912. The power adapters are then controlled on the network at a block 4914.

Figure 50:
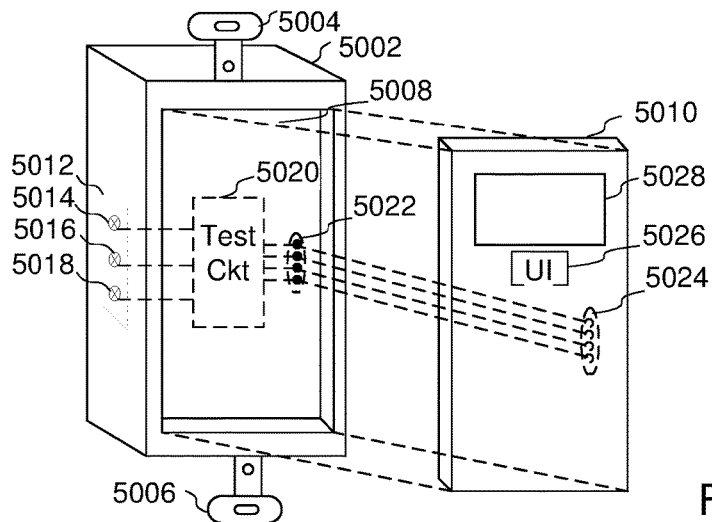
FIG. 50 is a block diagram of a power adapter having a test circuit for testing connections to the power adapter.

Turning now to FIG. 50, a block diagram of a power adapter having a test circuit for testing power connections to contact elements of the power adapter is shown. According to the arrangement of FIG. 50, a power adapter 5002, having flanges 5004 and 5006 for coupling the power adapter 5002 to a junction box, comprises a recess 5008 for receiving a module 5010, which may be any module for controlling the operation of the power adapter, such as a module as described above. The power adapter 5002 comprises a contact block having a plurality of contacts 5002 (shown here by way of example as screw contacts), including a load contact 5014, a neutral contact 5016, and a ground contact 5018. While the 3 contacts are shown by way of example, it should be understood that other contacts could be implemented, such as a contact for enabling the use of the power adapter in a 3-way connection.

A test circuit 5020 is coupled to the plurality of contact elements 5012, and to one or more contacts 5022 that are exposed on a surface of the recess and enable the communication of signals with the module 5010 by way of corresponding contact 5024 of the module 5010. As will be described in more detail below in reference to FIGS. 51 and 52, the test circuit can determine if the contacts of the contact block 5012 are properly wired to electrical wires of the junction box that provide power to the power adapter. The test may be performed automatically when a module is attached to the power adapter, and/or in response to a user initiating a testing of the electrical connections associated with a power adapter, for example by accessing a user interface 5026. Results of the test can be provided by way of any audio (e.g. a distinctive beeping or voice message), visual (e.g. an LED or display) or tactile indication (e.g. vibration) of a result. By way example, an indication can be provided using display 5028. While contacts of the contact block 5012 are shown by way of example, it should be understood that wires extending from the power adapter could be used to enable the application of power to the power adapter 5002.

Figure 51:
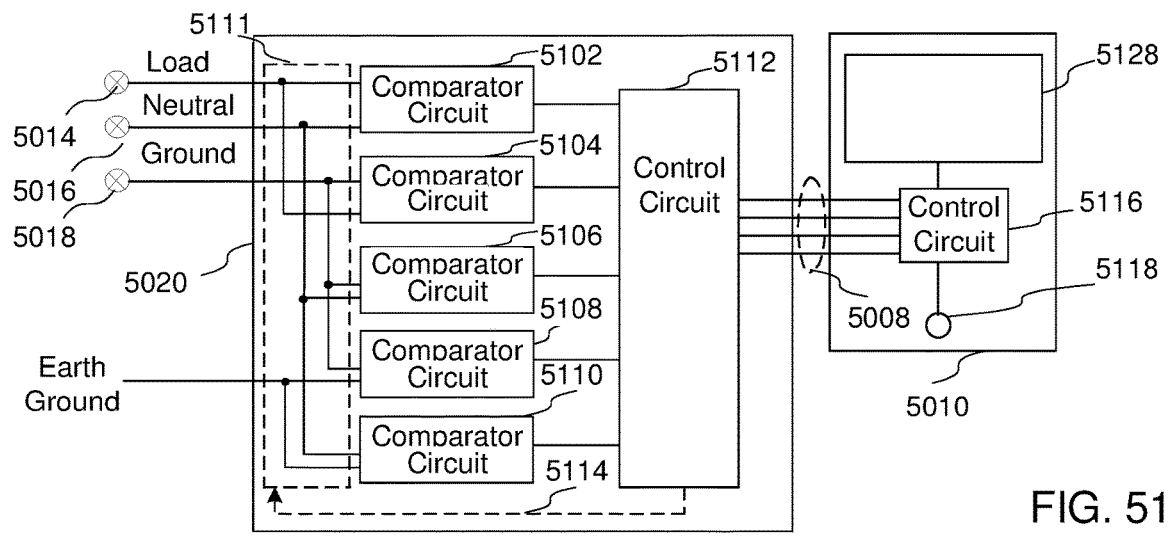
FIG. 51 is a block diagram of a circuit for testing the connections associated with a power adapter.

Turning now to FIG. 51, a block diagram of a circuit for testing the connections associated with a power adapter when the contacts are electrically connected to wires providing power to the power adapter is shown. The test circuit 5020 comprise circuits for comparing voltages at the contacts of the contact block 5012. According to the implementation of FIG. 51, one or more comparator circuits are used to compare voltages at the contact 5014-5018 to determine whether the power adapter is improperly wired or not functioning properly. According to one implementation, a first comparator circuit 5102 is coupled to the load contact 5014 (to receive the voltage on the load contact) and coupled to the neutral contact 5016 (to receive the voltage on the neutral contact). A second comparator circuit 5104 is coupled to the load contact 5014 (to receive the voltage on the load contact) and coupled to the ground contact 5018 (to receive the voltage on the ground contact). A third comparator circuit 5106 is coupled to the neutral contact 5014 (to receive the voltage on the neutral contact) and coupled to the ground contact 5018 (to receive the voltage on the ground contact). A fourth comparator circuit 5108 is coupled to the ground contact 4918 (to receive the voltage on the ground contact) and the earth ground (to receive a voltage associated with the earth ground). Earth ground is a reference point in an electrical circuit from which other voltages are measured, and may also a common return path for current in the circuit that is provided by a physical connection to the earth (such as by a conductive stake driven into the ground). A comparator circuit 5110 may also be implemented to compare the neutral contact 5116 to earth ground. The switch 5111 may be controlled by control signals from the control circuit 5112 by way of a control line 5114.

The comparator circuits 5102-5110 may comprise voltage comparators for example. According to other implementations, the comparator circuits may be adapted to detect currents within the power adapter when the power adapter is operating to detect abnormal operating conditions of the power adapter or a device powered by the power adapter, or detect power usage by a device powered by the power adapter. While comparators 5102-5110 are shown by way of example, it should be understood that additional comparators could be implemented to compare any voltage detected at various nodes in the power adapter and generate information that may be beneficial in determining whether a power adapter is installed correctly (e.g. is correctly wired) or is operating correctly (e.g. is not a defective product). While multiple comparator circuits are shown, it should be understood that a single comparator could be implemented, where the nodes (e.g. load, neutral, ground and earth ground) could be selectively coupled to a comparator. For example, a switching element 5111 coupled to receive voltages at various nodes could enable the selection of inputs to a single comparator circuit.

A control circuit 5112 may be coupled to the comparators 5102-5110 to receive output signals generated by the comparators indicating the results of the various comparisons. By way of example, the comparator circuits could generate a difference in the voltages on the lines coupled to the comparator, or could provide a result representative of the difference in voltages. While the control circuit 5112 may be configured to process information and communicate test results to reduce the number of signal lines to a control circuit 5116 of the module 5010, the outputs of the comparator circuit could be provided directly to the module 5010. For example, the control circuit 5112 could receive detected voltages values, where the control circuit 5116 could determine an improper wiring condition based upon the detected voltage values and provide a message on the display 5028. It should be noted that a testing function can include circuits that are distributed between the power adapter and the module. That is, while voltages associated with the power adapter could be detected by a circuit in the power adapter, such as by one or more voltage detectors, other processing to detect improper wiring or a defective power adapter or module may be performed in the power adapter (such as by using control circuit 5112 of the power adapter), by the module (using control circuit 5116 of the module), or distributed between the power adapter and the module.

The control circuit 5112 may not only receive signals from the test circuit 5020, but may also provide control signals that enable the testing of the power adapter 4902 to the test circuit 4902. According to one implementation, a test of the connections of the power adapter may be performed whenever a module is attached to a power adapter. For example, the control circuit of one the power adapter and the module may detect the connection of the module to the power adapter, and initiate a testing of the connections of the power adapter. For example, in the implementation of FIG. 51, the control circuit 5116 may detect one or more outputs of the control circuit 5112 to determine whether the power adapter is improperly wired or is defective. Alternatively or in addition to an automatic testing initiated by one of the control circuit 5112 or the control circuit 5116, a user interface element 5118, shown here as a button by way of example, may be used to initiate a testing of the connections by the test circuit 5020. That is, a user may desire that a check be performed to make sure that the power adapter is properly wired and operating correctly. The test results can then be provided to the user. By way of example, the test results can be displayed on a display 5028.

Figure 52:
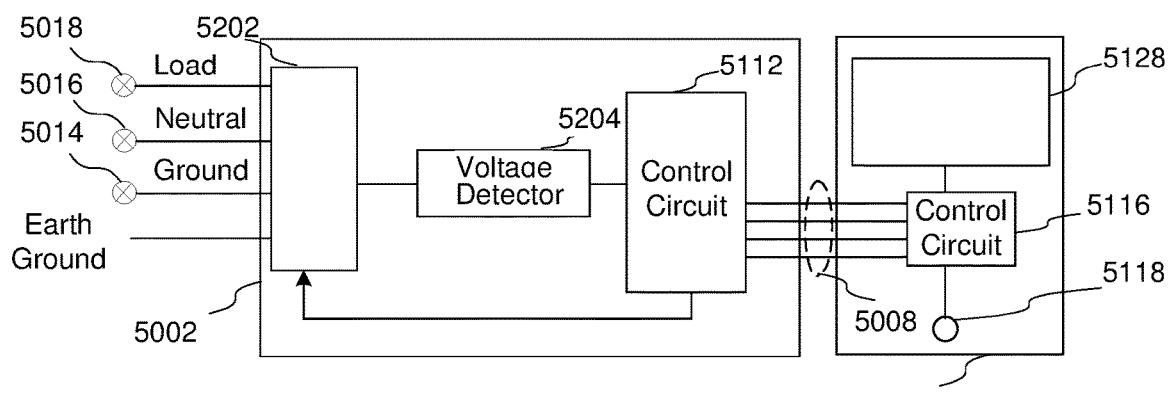
FIG. 52 is another block diagram of a circuit for testing the connections associated with a power adapter.

Turning now to FIG. 52, another block diagram of a circuit for testing the connections associated with a power adapter when the contacts are electrically connected to wires providing power to the power adapter is shown. According to the implementation of FIG. 52, a switching circuit 5202 coupled to the various power nodes and earth ground enables the connection of the nodes to single voltage detector 5204 that can provide a measured voltage value to the control circuit 5202 (or directly to the control circuit 5116 as described above). The voltage detector can sequentially detect voltages at different nodes to determine whether the power adapter is improperly wired or not operating properly. While a single voltage detector is shown, it should be understood that multiple voltage detectors could be implemented. Also, while voltages are shown as being detected, it should be understood that currents be detected instead of voltages or in addition to voltages.

Figure 53:
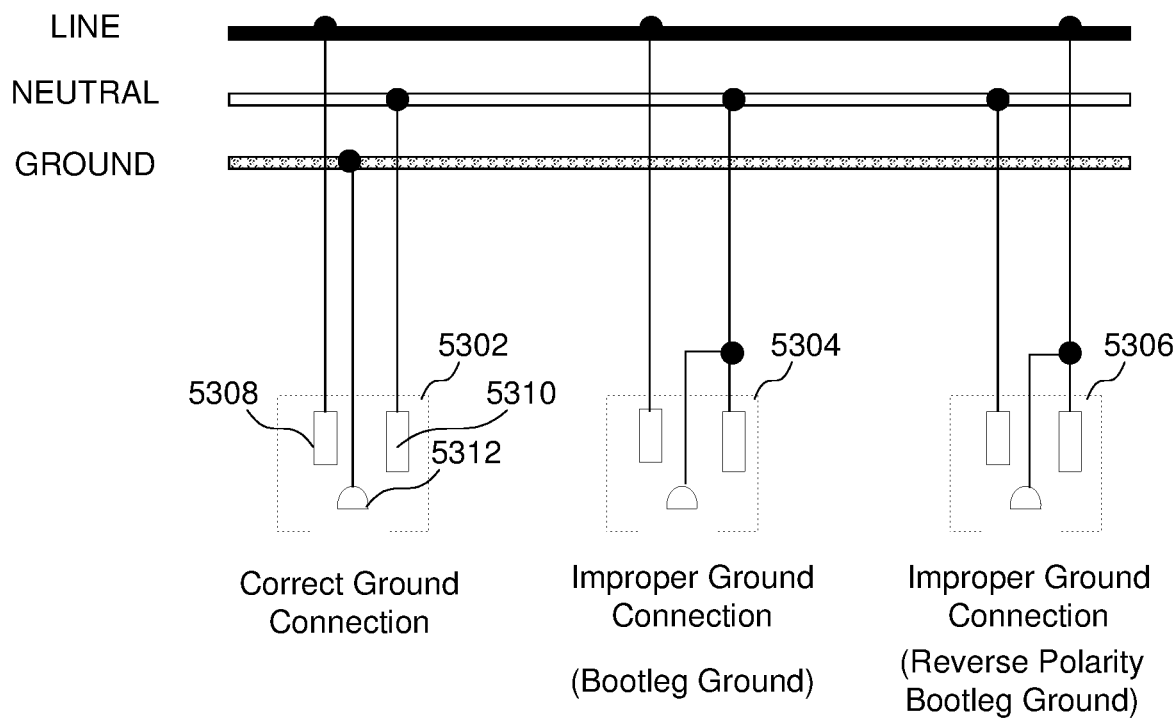
FIG. 53 is a block diagram a plurality of outlets having different connects to power lines.

Turning now to FIG. 53, a plurality of different known conditions of improper wiring are shown. There are different conditions that can be detected to determine whether a power adapter is wired properly and working properly. A first outlet 5302 is shown wired correctly, where the line or hot (H) wire is connected to a hot terminal 5308 of outlet 5302, the neutral line is connected to the neutral terminal 5310, and ground line is connected to the ground terminal 5312. However, as shown with plug 5304, the ground terminal is connected to the neutral terminal to form an improper ground connection, commonly called a bootleg ground. A particularly dangerous condition can exit when there is not only an improper bootleg ground connection as with the outlet 5304, but the line and neutral connections are reversed, commonly known as a reverse polarity bootleg ground. What makes this improper wiring condition particularly dangerous is that the ground connection, which is improperly connected to a power line, will make the device plugged into outlet, such as the metal housing of a toaster for example, have an electrical charge and may lead to an electrical shock or an electrocution of the user of the toaster.

While continuity testers can be used to test power adapters by inserting the test prongs into the outlets of a power adapter, such testing will not determine some certain improper wiring conditions, such as the improper wiring of plug 5306. A conventional 3-light cube tester commonly used to determine if an outlet has been wired will not detect the improper wiring of outlet 5304 or outlet 5306. In order to detect the improper wiring of outlet 5304, it is necessary to use a voltmeter, where the voltage between ground and neutral will be very close to zero. However, to detect a reverse polarity bootleg ground connection, it is necessary to connect a prong of a voltmeter to earth ground, and test each of the hot, neutral and ground terminals with respect to earth ground. Because a recess adapted to receive a module provides access to measurements associated not only with the hot, neutral and ground terminals of an outlet, but also an earth ground, it is possible to detect the improper wiring conditions of outlet 5304 and 5306. That is, a test circuit could not only be coupled to the hot, neutral and ground contacts to detect voltages at those contacts, but could also detect a voltage of earth ground to use as a reference voltage. Because a junction box receiving the power adapter is at earth ground, the voltage at earth ground can be detected by determining the voltage of the junction box, such as by determining the voltage of a flange of the power adapter connected to the junction box. A test circuit internal to the power adapter could detect the voltage at earth ground by providing a conductor coupled to a flange of the power adapter, as shown by way of example in FIG. 29 using electrical connection 2916. It should be understood that test circuits could be implemented in power adapters receiving any type of modules as described in reference to FIGS. 1-53.

Figure 54:
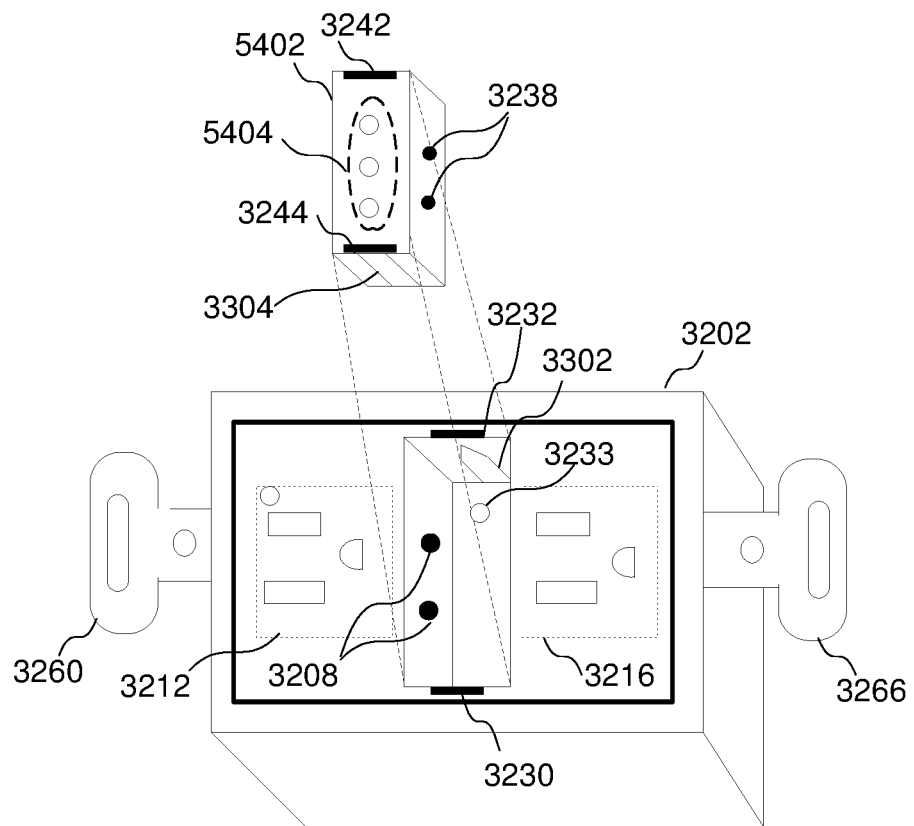
FIG. 54 is a block diagram showing a test module for testing the connections associated with a power adapter.

Turning now to FIG. 54, a block diagram of a circuit for testing the connections associated with a power adapter having an outlet is shown. More particularly, a test module 5402 has a test result indicator 5404, shown here by way of example as LED indicators. The different LED indicators may provide different indications of the type of error associated with the wiring of the power adapter in a junction box, such as described above in reference to FIG. 53 for example. The power adapter of FIG. 54 could be configured to retain the test module 5402 during normal operation, or could just receive the testing module for testing purposes and replace it with a dummy module, a functional module or a control module as described above. The test module 5402 could be implemented as described above in FIGS. 51-53. For example, a voltmeter could be implemented in the power adapter 3202, and provide voltage measurements to a test module 5402 by way of contacts 3308. A test module could be implemented as a dedicated test module according to the implementation of the power adapters of FIGS. 1-43, or as a part of a control module as described in FIGS. 1-43.

Figure 55:
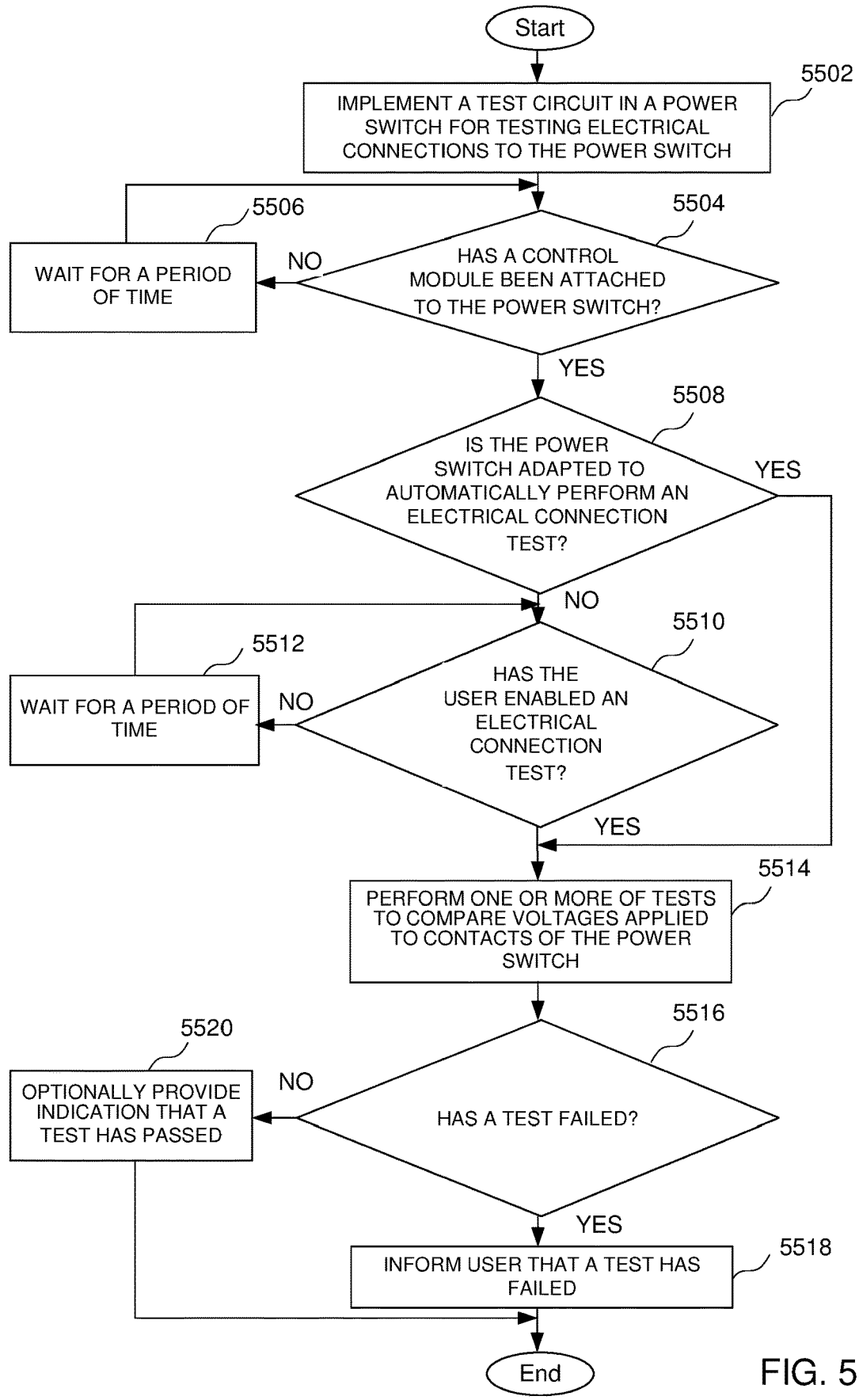
FIG. 55 is a flow diagram showing a testing the operation of a power adapter.

Turning now to FIG. 55, a flow diagram shows a method a testing operation of a power adapter, and may be implemented using the devices and circuits of FIGS. 50-54 for example, or other suitable circuits. A test circuit is implemented in a power adapter for testing electrical connections to the power adapter at a block 5502. It is then determined whether a control module has been attached to the power adapter at a block 5504. If not, the power adapter waits for a period of time at a block 5506 before rechecking for a power adapter at block 5504. If a control module has been attached it is also determined whether the power adapter is adapted to automatically perform an electrical connection test at a block 5508. If not, it is determined whether the user of the power adapter has enabled an electrical connection test at a block 5510. If a test of an electrical connection has not been enable, the power adapter waits for a period of time at a block 5512. If the power adapter is adapted to automatically perform an electrical connection test or a user has enabled an electrical connection test, the power adapter performs one or more of tests to compare voltages applied to contacts of the power adapter at a block 5514. After performing the test, it is determined whether a test has failed at a block 5516. If so, the user is informed that a test has failed at a block 5518. If the power adapter has not failed a test, an indication may be optionally provided to indicate that a test has passed at a block 5520.

It can therefore be appreciated that new circuits for, systems for and methods of implementing modular power adapters have been described. It will be appreciated by those skilled in the art that numerous alternatives and equivalents will be seen to exist that incorporate the disclosed invention. As a result, the invention is not to be limited by the foregoing embodiments, but only by the following claims.

I claim:

1. An in-wall power adapter configured to be installed in a junction box to apply power to a load, the in-wall power adapter comprising:
    a first plurality of contact elements comprising a first contact element adapted to receive a line wire and a second contact element adapted to receive a neutral wire;
    a test module adapted to determine an improper wiring condition associated with wires of the junction box connected to the first plurality of contact elements;
    a recess having an opening on a surface of the in-wall power adapter and adapted to receive the test module, wherein the first plurality of contact elements are outside of the recess; and
    a second plurality of contact elements positioned within the recess and adapted to be coupled to third and fourth contact elements of the test module, wherein the third and fourth contact elements are received through the opening;
    wherein the test module comprises a control circuit adapted to receive signals associated with the first plurality of contact elements; and
    wherein the control circuit of the test module is adapted to determine an improper wiring condition based upon the signals associated with the first plurality of contact elements.

2. The in-wall power adapter of claim 1 wherein the test module comprises a user interface.

3. The in-wall power adapter of claim 1 further comprising an attachment element for attaching the in-wall power adapter to the test module.

4. The in-wall power adapter of claim 1, wherein the test module comprises a display configured to provide an indication of an improper wiring condition.

5. The in-wall power adapter of claim 1 wherein the test module comprises a test result indicator configured to provide an indication of an improper wiring condition.

6. The in-wall power adapter of claim 1 wherein the test module comprises a test circuit configured to perform a comparison of voltages associated with the first plurality of contact elements.

7. The in-wall power adapter of claim 6 wherein the test circuit comprises a comparator circuit coupled to receive voltages associated with the first plurality of contact elements.

8. An in-wall power adapter configured to be installed in a junction box to apply power to a load, the in-wall power adapter comprising:
   a first plurality of contact elements comprising a first contact element adapted to receive a line wire and a second contact element adapted to receive a neutral wire;
   a recess having a second plurality of contact elements; and
   a test module received in the recess through an opening on a surface of the in-wall power adapter and adapted to determine an improper wiring condition associated with wires of the junction box connected to the first plurality of contact elements, wherein the first plurality of contact elements are outside of the recess, and the second plurality of contact elements are positioned within the recess and adapted to be coupled to third and fourth contact elements of the test module;
   wherein the third and fourth contact elements are received through the opening; and
   wherein the test module is adapted to determine an improper wiring condition based upon signals associated with the first plurality of contact elements.

9. The in-wall power adapter of claim 8 wherein the test module comprises a user interface.

10. The in-wall power adapter of claim 8 wherein the test module comprises a control circuit adapted to determine an improper wiring condition.

11. The in-wall power adapter of claim 8 wherein the test module comprises a test result indicator.

12. The in-wall power adapter of claim 11 wherein the test result indicator comprises one or more LED indicators.

13. The in-wall power adapter of claim 8 wherein the test module further comprises a test circuit coupled to the first plurality of contact elements, wherein the test circuit performs a comparison of voltage values associated with the first plurality of contact elements.

14. A method of implementing an in-wall power adapter configured to be installed in a junction box to apply power to a load, the method comprising:
   providing a first plurality of contact elements comprising a first contact element adapted to receive a line wire and a second contact element adapted to receive a neutral wire;
   providing a test module comprising a control circuit, wherein the test module is adapted to test whether one or more wires of the junction box are improperly connected to the first plurality of contact elements;
   receiving the test module in a recess of the in-wall power adapter through an opening on a surface of the in-wall power adapter, wherein the first plurality of contact elements are outside of the recess;
   positioning a second plurality of contact elements within the recess, wherein the second plurality of contact elements are adapted to be coupled to third and fourth contact elements of the test module, wherein the third and fourth contact elements are received through the opening;
   performing a comparison of signals detected on the first plurality of contact elements; and
   determining if one or more contact elements of the first plurality of contact elements are improperly coupled to wires of the junction box.

15. The method of claim 14 further comprising providing a test result indicator configured to provide an indication of an improper wiring condition.

16. The method of claim 14 further comprising providing an attachment element for attaching the in-wall power adapter to the test module.

17. The method of claim 16 wherein the test module is coupled to the attachment element.

18. The method of claim 14 further comprising providing an indication that one or more contact elements of the first plurality of contact elements are improperly coupled to wires of the junction box.

19. The method of claim 14 further comprising generating a signal based upon a comparison of voltages on the first plurality of contact elements.

20. The method of claim 19 wherein generating a signal based upon a comparison of voltages on the first plurality of contact elements comprises generating a plurality of signals based upon a plurality of comparisons of voltages on the first plurality of contact elements.

* * * * *